US011322210B2

(12) United States Patent
Takada et al.

(10) Patent No.: US 11,322,210 B2
(45) Date of Patent: May 3, 2022

(54) MEMORY SYSTEM

(71) Applicant: KIOXIA CORPORATION, Tokyo (JP)

(72) Inventors: Marie Takada, Yokohama Kanagawa (JP); Masanobu Shirakawa, Chigasaki Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/005,273

(22) Filed: Aug. 27, 2020

(65) Prior Publication Data

US 2021/0295931 A1 Sep. 23, 2021

(30) Foreign Application Priority Data

Mar. 23, 2020 (JP) ............................ JP2020-051579

(51) Int. Cl.
*G11C 16/26* (2006.01)
*G11C 16/34* (2006.01)
*G11C 16/30* (2006.01)
*G11C 16/14* (2006.01)

(52) U.S. Cl.
CPC .......... *G11C 16/3404* (2013.01); *G11C 16/14* (2013.01); *G11C 16/26* (2013.01); *G11C 16/30* (2013.01)

(58) Field of Classification Search
CPC .......... G11C 16/14; G11C 16/26; G11C 16/30
USPC .................................................... 365/185.22
See application file for complete search history.

(56) References Cited

U.S. PATENT DOCUMENTS

| | | | | |
|---|---|---|---|---|
| 7,184,338 | B2 | 2/2007 | Nakagawa et al. | |
| 7,852,683 | B2 | 12/2010 | Lutze et al. | |
| 8,902,651 | B2 * | 12/2014 | Kwak | G11C 16/26 365/185.03 |
| 10,109,355 | B2 * | 10/2018 | Nagao | G11C 11/5628 |
| 10,249,382 | B2 | 4/2019 | Lee et al. | |
| 2013/0094294 | A1 * | 4/2013 | Kwak | G11C 16/08 365/185.03 |
| 2018/0090212 | A1 | 3/2018 | Konno et al. | |
| 2018/0261291 | A1 * | 9/2018 | Nagao | G11C 11/5628 |

FOREIGN PATENT DOCUMENTS

| | | | |
|---|---|---|---|
| JP | 2015133161 | A | 7/2015 |

* cited by examiner

*Primary Examiner* — Xiaochun L Chen
(74) *Attorney, Agent, or Firm* — Kim & Stewart LLP

(57) ABSTRACT

According to one embodiment, a memory system includes a semiconductor memory having a plurality of memory cells and a memory controller that controls the semiconductor memory to perform write and read operations and a read operation. The memory controller causes the semiconductor memory to execute a first write operation using a first voltage, detects, in a read operation, first memory cells among the plurality of memory cells that have a threshold voltage higher than a voltage value corresponding to data to be stored and sets a second voltage used for a second write operation after the first write operation based on a detection result of the first memory cells.

20 Claims, 42 Drawing Sheets

FIG. 7

| CHIP | BLOCK | WORD LINE | STRING UNIT | IVPGM-offset | dVPGM | IVERA | VAR | VBR | ··· | VGR | NUMBER OF W/E |
|---|---|---|---|---|---|---|---|---|---|---|---|
| Chip0 | BLK0 | WL0 | SU0 | "00" (no data) | "00" | ⋮ | −4Va | +Vb | ··· | ⋮ | ⋮ |
| | | | SU1 | "00" (no data) | dVPGM0 | ⋮ | +2Va | +Vb | ··· | ⋮ | ⋮ |
| | | | SU2 | IVPGM0 +k × dVPGM | dVPGM1 | ⋮ | −3Va | −2Vb | ··· | ⋮ | ⋮ |
| | | | SU3 | IVPGM0 +(k−1) × dVPGM | dVPGM0 | ⋮ | +2Va | −Vb | ··· | ⋮ | ⋮ |
| | | WL1 | SU0 | ⋮ | ⋮ | ⋮ | ⋮ | ⋮ | ··· | ⋮ | ⋮ |
| | | | ⋮ | ⋮ | ⋮ | ⋮ | ⋮ | ⋮ | ··· | ⋮ | ⋮ |
| | | | SU3 | ⋮ | ⋮ | ⋮ | ⋮ | ⋮ | ··· | ⋮ | ⋮ |
| | | ⋮ | ⋮ | ⋮ | ⋮ | ⋮ | ⋮ | ⋮ | ··· | ⋮ | ⋮ |
| | | WL7 | SU3 | ⋮ | ⋮ | ⋮ | ⋮ | ⋮ | ··· | ⋮ | ⋮ |
| | BLK1 | WL0 | SU0 | ⋮ | ⋮ | ⋮ | ⋮ | ⋮ | ··· | ⋮ | ⋮ |
| | | ⋮ | ⋮ | ⋮ | ⋮ | ⋮ | ⋮ | ⋮ | ··· | ⋮ | ⋮ |
| | | WL7 | SU3 | ⋮ | ⋮ | ⋮ | ⋮ | ⋮ | ··· | ⋮ | ⋮ |
| | ⋮ | ⋮ | ⋮ | ⋮ | ⋮ | ⋮ | ⋮ | ⋮ | ··· | ⋮ | ⋮ |
| Chip1 ⋮ | ⋮ | ⋮ | ⋮ | ⋮ | ⋮ | ⋮ | ⋮ | ⋮ | ··· | ⋮ | ⋮ |

FIG. 14A

| CHIP | BLOCK | WORD LINE | STRING UNIT | IVPGM-offset | Up-counter | Down-counter |
|---|---|---|---|---|---|---|
| Chip0 | BLK0 | WL0 | SU0 | "00"(no data) | 0 | 0 |

TBL

FIG. 14B

| CHIP | BLOCK | WORD LINE | STRING UNIT | IVPGM-offset | Up-counter | Down-counter |
|---|---|---|---|---|---|---|
| Chip0 | BLK0 | WL0 | SU0 | "00"→ 4 | 0 | 0 |

TBL

FIG. 14C

| CHIP | BLOCK | WORD LINE | STRING UNIT | IVPGM-offset | Up-counter | Down-counter |
|---|---|---|---|---|---|---|
| Chip0 | BLK0 | WL0 | SU0 | 4→8 | 0 | 0 |

TBL

FIG. 14D

| CHIP | BLOCK | WORD LINE | STRING UNIT | IVPGM-offset | Up-counter | Down-counter |
|---|---|---|---|---|---|---|
| Chip0 | BLK0 | WL0 | SU0 | 8→12 | 0 | 0 |

TBL

FIG. 14E

| CHIP | BLOCK | WORD LINE | STRING UNIT | IVPGM-offset | Up-counter | Down-counter |
|---|---|---|---|---|---|---|
| Chip0 | BLK0 | WL0 | SU0 | 12→14 | 0→1 | 0 |

TBL

FIG. 14F

| CHIP | BLOCK | WORD LINE | STRING UNIT | IVPGM-offset | Up-counter | Down-counter |
|---|---|---|---|---|---|---|
| Chip0 | BLK0 | WL0 | SU0 | 14→8 | 1→2 | 0 |

TBL

FIG. 15A

| CHIP | BLOCK | WORD LINE | STRING UNIT | IVPGM-offset | Up-counter | Down-counter |
|---|---|---|---|---|---|---|
| Chip0 | BLK0 | WL0 | SU0 | 8 | 2 | 0 |

TBL

FIG. 15B

| CHIP | BLOCK | WORD LINE | STRING UNIT | IVPGM-offset | Up-counter | Down-counter |
|---|---|---|---|---|---|---|
| Chip0 | BLK0 | WL0 | SU0 | 8 | 2 | 0→1 |

TBL

FIG. 15C

| CHIP | BLOCK | WORD LINE | STRING UNIT | IVPGM-offset | Up-counter | Down-counter |
|---|---|---|---|---|---|---|
| Chip0 | BLK0 | WL0 | SU0 | 8 | 2 | 1 |

TBL

FIG. 15D

| CHIP | BLOCK | WORD LINE | STRING UNIT | IVPGM-offset | Up-counter | Down-counter |
|---|---|---|---|---|---|---|
| Chip0 | BLK0 | WL0 | SU0 | 8 | 2 | 1→2 |

TBL

FIG. 15E

| CHIP | BLOCK | WORD LINE | STRING UNIT | IVPGM-offset | Up-counter | Down-counter |
|---|---|---|---|---|---|---|
| Chip0 | BLK0 | WL0 | SU0 | 8→7 | 2 | 2→3(→0) |

TBL

| CHIP | BLOCK | WORD LINE | STRING UNIT | dVPGM | Down-counter2 |
|---|---|---|---|---|---|
| Chip0 | BLK0 | WL0 | SU0 | dVPGM0 | 0 |

TBL

FIG. 19B

| CHIP | BLOCK | WORD LINE | STRING UNIT | dVPGM | Down-counter2 |
|---|---|---|---|---|---|
| Chip0 | BLK0 | WL0 | SU0 | dVPGM0 | 0 |

TBL

FIG. 19C

| CHIP | BLOCK | WORD LINE | STRING UNIT | dVPGM | Down-counter2 |
|---|---|---|---|---|---|
| Chip0 | BLK0 | WL0 | SU0 | dVPGM0 | 0→1 |

TBL

FIG. 19D

| CHIP | BLOCK | WORD LINE | STRING UNIT | dVPGM | Down-counter2 |
|---|---|---|---|---|---|
| Chip0 | BLK0 | WL0 | SU0 | dVPGM0 | 1→2 |

TBL

FIG. 19E

| CHIP | BLOCK | WORD LINE | STRING UNIT | dVPGM | Down-counter2 |
|---|---|---|---|---|---|
| Chip0 | BLK0 | WL0 | SU0 | dVPGM0 →dVPGM1 | 2→3(→0) |

TBL

FIG. 24A

| CHIP | BLOCK | WORD LINE | STRING UNIT | IVERA-offset | Up-counter | Down-counter |
|---|---|---|---|---|---|---|
| Chip0 | BLK0 | WL0 | SU0 | "00"(no data) | 0 | 0 |

FIG. 24B

| CHIP | BLOCK | WORD LINE | STRING UNIT | IVERA-offset | Up-counter | Down-counter |
|---|---|---|---|---|---|---|
| Chip0 | BLK0 | WL0 | SU0 | "00"→ -4 | 0 | 0 |

TBL

FIG. 24C

| CHIP | BLOCK | WORD LINE | STRING UNIT | IVERA-offset | Up-counter | Down-counter |
|---|---|---|---|---|---|---|
| Chip0 | BLK0 | WL0 | SU0 | -4→ -8 | 0 | 0 |

TBL

FIG. 24D

| CHIP | BLOCK | WORD LINE | STRING UNIT | IVERA-offset | Up-counter | Down-counter |
|---|---|---|---|---|---|---|
| Chip0 | BLK0 | WL0 | SU0 | -8→ -12 | 0 | 0 |

TBL

FIG. 24E

| CHIP | BLOCK | WORD LINE | STRING UNIT | IVERA-offset | Up-counter | Down-counter |
|---|---|---|---|---|---|---|
| Chip0 | BLK0 | WL0 | SU0 | -12→ -14 | 0 | 0→ 1 |

TBL

FIG. 24F

| CHIP | BLOCK | WORD LINE | STRING UNIT | IVERA-offset | Up-counter | Down-counter |
|---|---|---|---|---|---|---|
| Chip0 | BLK0 | WL0 | SU0 | -14→-8 | 0 | 1→2 |

TBL

FIG. 25A

| CHIP | BLOCK | WORD LINE | STRING UNIT | IVERA-offset | Up-counter | Down-counter |
|---|---|---|---|---|---|---|
| Chip0 | BLK0 | WL0 | SU0 | -8 | 0 | 2 |

TBL

FIG. 25B

| CHIP | BLOCK | WORD LINE | STRING UNIT | IVERA-offset | Up-counter | Down-counter |
|---|---|---|---|---|---|---|
| Chip0 | BLK0 | WL0 | SU0 | -8 | 0→1 | 2 |

TBL

FIG. 25C

| CHIP | BLOCK | WORD LINE | STRING UNIT | IVERA-offset | Up-counter | Down-counter |
|---|---|---|---|---|---|---|
| Chip0 | BLK0 | WL0 | SU0 | -8 | 1 | 2 |

TBL

FIG. 25D

| CHIP | BLOCK | WORD LINE | STRING UNIT | IVERA-offset | Up-counter | Down-counter |
|---|---|---|---|---|---|---|
| Chip0 | BLK0 | WL0 | SU0 | -8 | 1→2 | 2 |

TBL

FIG. 25E

| CHIP | BLOCK | WORD LINE | STRING UNIT | IVERA-offset | Up-counter | Down-counter |
|---|---|---|---|---|---|---|
| Chip0 | BLK0 | WL0 | SU0 | -8 → -7 | 2 → 3(→ 0) | 2 |

TBL

MEMORY SYSTEM

CROSS-REFERENCE TO RELATED APPLICATION

This application is based upon and claims the benefit of priority from Japanese Patent Application No. 2020-051579, filed Mar. 23, 2020, the entire contents of which are incorporated herein by reference.

FIELD

Embodiments described herein relate generally to a memory system.

BACKGROUND

A memory system including a NAND flash memory as a semiconductor memory device and a memory controller of controlling the semiconductor memory device is known.

DESCRIPTION OF THE DRAWINGS

FIG. 7 is a diagram illustrating an example of a voltage information table of a memory system according to the first embodiment.

FIGS. 14A to 14F are schematic diagrams illustrating transitions of values in a table in a setting process of an initial program voltage in a memory system of the first embodiment.

FIGS. 15A to 15E are schematic diagrams illustrating transitions of values in a table in a setting process of an initial program voltage in a memory system of the first embodiment.

FIG. 18 is a schematic diagram illustrating a transition of various parameters during a setting process on a step-up voltage in a memory system of the first embodiment.

FIGS. 19A to 19E are schematic diagrams illustrating a transition of each value in a table in a setting process of a step-up voltage in a memory system of the first embodiment.

FIGS. 24A to 24F are schematic diagrams illustrating a transition of values in a voltage information table in a setting process on an erasing voltage in a memory system according to a second embodiment.

FIGS. 25A to 25E are schematic diagrams illustrating a transition of values in a voltage information table in a setting process on an erasing voltage in a memory system according to a second embodiment.

DETAILED DESCRIPTION

Figure 1:
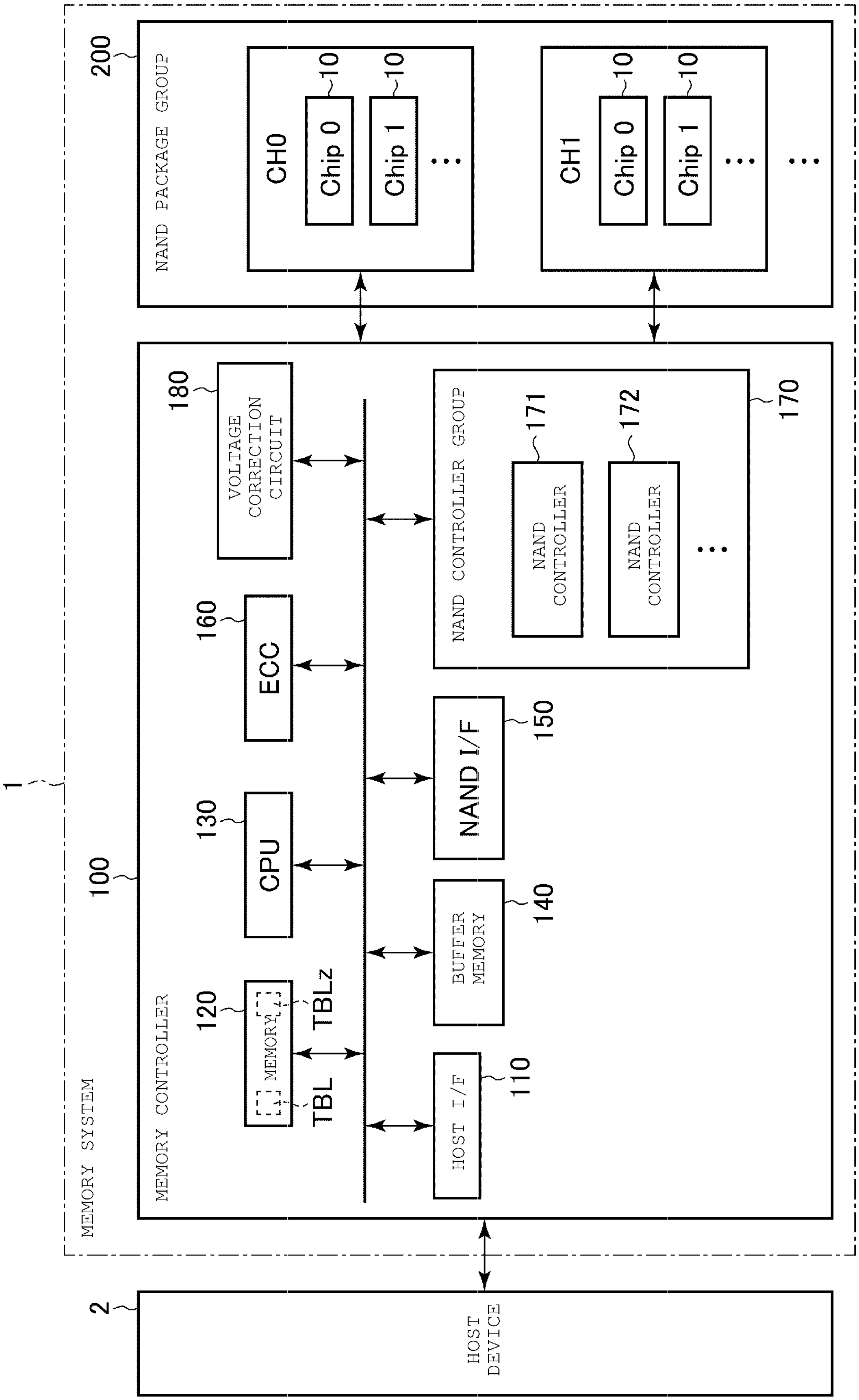
FIG. 1 is a block diagram of a memory system according to a first embodiment.

Example embodiments provide a memory system having high performance.

In general, according to one embodiment, a memory system includes a semiconductor memory device that has a plurality of memory cells and a memory controller. The memory controller controls the semiconductor memory device to perform a write and read operations. The memory controller is configured to cause the semiconductor memory device to execute a first write operation using a first voltage. The memory controller is further configured to detect, in a read operation, first memory cells having a threshold voltage higher than a voltage value corresponding to data to be stored from among the plurality of memory cells. The memory controller is configured to set a second voltage used for a second write operation occurring after the first write operation based on a detection result of the first memory cells.

Hereinafter, various example embodiments will be described with reference to the drawings. In the following description, elements having the same functions and configurations are denoted by common reference numerals. Furthermore, for distinguishing a plurality of elements sharing a common reference numeral, a suffix or subscript can be added to the common reference numeral to make the necessary distinction(s) between individual instances. When it is not particularly necessary to distinguish between the elements sharing a common reference numeral, then only the common reference numerals are utilized and the suffixes and/or subscripts are not attached.

EMBODIMENTS

(1) First Embodiment

A memory system and a control method of the memory system according to a first embodiment will be described with reference to FIGS. 1 to 20.

(a) Configuration (a-1) Memory System

A configuration of a memory system according to the first embodiment will be described with reference to FIG. 1.

As illustrated in FIG. 1, a memory system 1 includes a memory controller 100 and a NAND package group 200. One storage device may be configured with a combination of the memory controller 100 and the NAND package group 200, for example. For example, a memory card such as an SD™ card, a solid state drive (SSD), or the like can be provided as the storage device.

The memory controller 100 is connected to a host device 2 by a host bus.

The host device 2 is, for example, a digital camera, a personal computer, a smart phone, a feature phone, a game device, an unmanned aerial vehicle, a server, or the like. The host bus is a bus according to an SDTM interface, a serial attached small computer system interface (SCSI) (SAS), a serial advanced technology attachment (ATA) (SATA), a peripheral component interconnect express (PCIe), or a non-volatile memory express (NVMe), for example. The memory controller 100 may be connected to the host device 2 by wireless communication.

The memory controller 100 controls the NAND package group 200. The memory controller 100 accesses the NAND package group 200 in response to a command received from the host device 2.

The memory controller 100 is connected to the NAND package group 200 by a data transfer type bus based on a certain standard (or specification).

The NAND package group 200 is a semiconductor memory device (for example, a non-volatile semiconductor memory device). The NAND package group 200 includes a plurality of channels CH (CH0, CH1, . . . ). The plurality of channels CH are individually connected to the memory controller 100 by a corresponding bus. The number of channels in the NAND package group 200 may be freely selected.

Each of the plurality of channels CH includes a plurality of chips CP (CP0, CP1, . . . ). Each of the plurality of chips CP has, for example, a function as a NAND flash memory 10 (which may be referred to as a non-volatile semiconductor memory device). The number of chips in the channel CH may be selected freely. In the same manner, other channels CH have this same configuration. A configuration of the NAND flash memory 10 (chip CP) will be described below.

In the following, the NAND flash memory 10 may be referred to as the flash memory 10 for simplification.

(a-2) Configuration of Memory Controller

A configuration of the memory controller 100 will be described in detail with reference to FIG. 1.

The memory controller (also referred to as a NAND controller, for example) 100 includes a host interface circuit 110, a memory 120, a processor (CPU) 130, a buffer memory 140, a NAND interface circuit 150, an ECC circuit 160, a NAND controller group 170, a voltage correction circuit 180, and the like.

The memory controller 100 is, for example, a system on a chip (SoC). A function of each of the units 110 to 170 of the memory controller 100 to be described below may be implemented by hardware or a combination of hardware and firmware (software). The voltage correction circuit 180 may be implemented by a hardware configuration capable of functioning independently of the firmware, unless otherwise specified.

The host interface circuit 110 is connected to the host device 2 via the host bus. The host interface circuit 110 respectively transfers a command and data received from the host device 2 to the processor 130 and the buffer memory 140. Further, in response to the command from the processor 130, data in the buffer memory 140 is transferred to the host device 2.

The memory (for example, RAM) 120 is used as a work area (work memory) of the processor 130. The memory 120 stores firmware for managing the NAND package group 200, various tables TBL and TBLz such as a voltage information table TBL to be described below, and the like. The memory 120 is a memory device (for example, a volatile semiconductor memory device) such as a DRAM or an SRAM.

The processor 130 controls an overall operation of the memory controller 100.

For example, when the processor 130 receives a write command from the host device 2, in response to the write command, the processor 130 controls the NAND controller group 170 to issue the write command to the NAND controller group 170. When receiving a read command from the host device 2, the processor 130 controls the NAND controller group 170 in response to the read command and issues the read command to the NAND controller group 170. In the following, a read operation based on an instruction from the host device 2 is also called as a host read operation. When receiving an erase command from the host device 2, the processor 130 controls the NAND controller group 170 in response to the erase command and issues the erase command to the NAND controller group 170.

The processor 130 can control the NAND controller group 170 and execute various internal processes for managing the NAND package group 200 regardless of the instruction from the host device 2. For example, the processor 130 can cause the NAND controller group 170 and the NAND package group 200 to execute an internal process in the memory system 1.

The buffer memory 140 temporarily stores write data, read data, and read data for which errors have been corrected by the ECC circuit 160 (hereinafter, also referred to as expected data).

The NAND interface circuit 150 is connected to the NAND package group 200 via a NAND bus. The NAND interface circuit 150 controls communication between the NAND controller group 170 and the NAND package group 200. The NAND interface circuit 150 transmits various signals based on a NAND interface to be described below, to the NAND package group 200 and receives various signals from the NAND package group 200, based on a command from the processor 130.

The ECC circuit 160 performs an error detection process and an error correction process related to data stored in the NAND package group 200.

When writing data, the ECC circuit 160 generates an error correction code and adds the generated error correction code to the write data. The ECC circuit 160 decodes the error correction code and detects the presence or absence of an error bit during a data reading process. When the error bit is detected from the read data, the ECC circuit 160 specifies a position of the error bit and corrects the specified error.

In the following, detection and correction of an error in data executed by the ECC circuit 160 will be referred to as an ECC process.

A method of the error correction includes, for example, hard-decision decoding (Hard bit decoding) and soft-decision decoding (Soft bit decoding). As a hard-decision decoding code used for the hard-decision decoding, for example, a Bose-Chaudhuri-Hocquenghem (BCH) code or a Reed-Solomon (RS) code may be used. A low density parity check (LDPC) code or the like may be used as a soft-decision decoding code used for the soft-decision decoding.

The NAND controller group 170 generates a command, an address, and the like transmitted and received to and from the NAND package group 200 based on a command from the processor 130. The NAND controller group 170 issues a read command to the NAND package group 200 based on the NAND interface, according to a data read command from the host device 2, for example.

The NAND controller group 170 can issue the read command to the NAND package group 200 based on the NAND interface, for example, without depending on the command from the host device 2.

The NAND controller group 170 includes a plurality of NAND controllers 171, 172, . . . . The NAND controllers 171, 172, are respectively provided corresponding to the channels CH0, CH1, . . . in the NAND package group 200. Each of the NAND controllers 171, 172, . . . is configured to control communication with the corresponding channel CH0, CH1, . . . .

The voltage correction circuit 180 is configured to calculate correction amounts (shift amounts) of a plurality of voltages used in the NAND flash memory in the NAND package group 200. In the present embodiment, the voltage correction circuit 180 can calculate correction amounts of various voltages used in a write operation.

The voltage correction circuit 180 receives, for example, read data (hereinafter, referred to as read data before error correction) from the NAND package group 200. The voltage correction circuit 180 receives error-corrected read data from the ECC circuit 160. The error-corrected read data is data obtained after the ECC circuit 160 executes an error correction process on the read data. The voltage correction circuit 180 calculates a correction amount of a voltage based on the read data before error correction and the read data after error correction, and transfers the calculated correction amount to the memory 120 and stores the calculated correction amount. For example, the voltage correction circuit 180 can calculate a correction amount of an initial program voltage IVPGM and a correction amount of a step-up voltage dVPGM. Details of the configuration of the voltage correction circuit 180 will be described below.

With the above configuration, the memory controller 100 commands the NAND package group 200 (NAND flash memory 10) to perform a write operation, a read operation, an erase operation, a patrol operation, and the like. The patrol operation is an operation executed in the flash memory 10 in a certain cycle without a command from the host device 2. The patrol operation includes at least a read operation and the ECC process.

(a-3) Configuration of NAND Flash Memory

Figure 2:
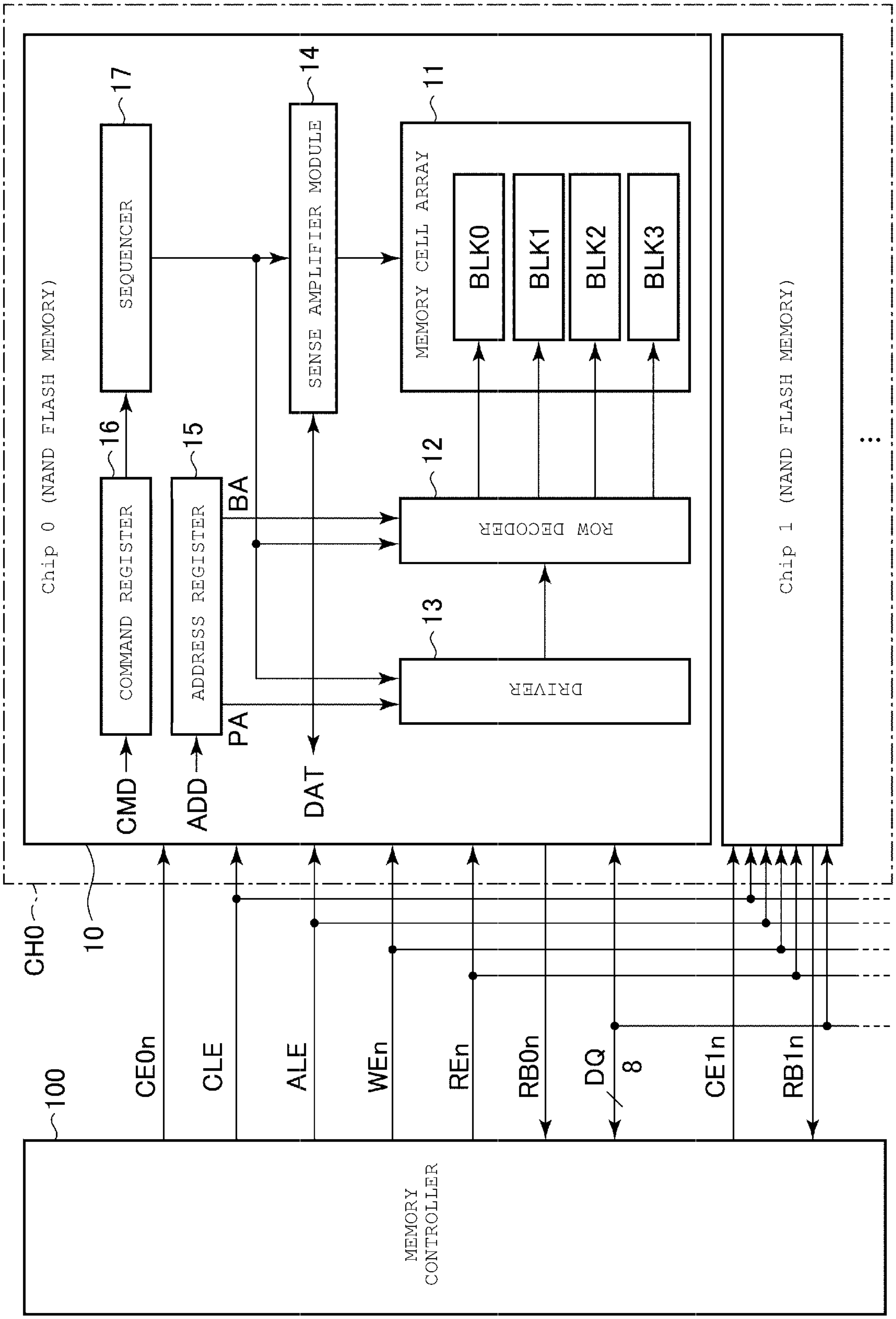
FIG. 2 is a block diagram illustrating aspects of a memory system according to a first embodiment.

A configuration of a chip of the NAND flash memory will be described with reference to FIG. 2. In FIG. 2, a connection relationship between the memory controller 100 and the channel CH0 and a configuration of one chip CP0 in the channel CH0 are illustrated as an example.

The connection relationship between the memory controller 100 and the channel CH0 will be described. The connection relationship between the memory controller 100 and the other channels CH1 or the like is substantially the same as the connection relationship between the memory controller 100 and the channel CH0, so description thereof will be omitted.

As illustrated in FIG. 2, each chip 10 in the channel CH0 is connected to the memory controller 100 via a NAND bus. Each chip CP transmits and receives signals based on the NAND interface.

A specific example of the signal of the NAND interface includes a chip enable signal CEn (CE0*n*, CE1*n*, . . . ), an address latch enable signal ALE, a command latch enable signal CLE, a write enable signal WEn, a read enable signal REn, a ready and busy signal RBn (RB0*n*, RB1*n*, . . . ), and an input and output signal DQ.

The signals CE1*n*, CE1*n*, . . . are respectively input to corresponding chips 10-0, 10-1, . . . . Each of the signals RBn0, RBn1, . . . is output from the corresponding chip 10. The signals ALE, CLE, WEn, REn, DQ are commonly input to each chip CP in the same channel CH0.

Each of the signals CE0*n*, CE1*n*, . . . is a signal for enabling each of the corresponding chips 10-0, 10-1, . . . . The signal CLE is a signal which notifies each chip CP that the input signal DQ to each chip CP is a command. The signal ALE is a signal which notifies each chip 10 that the input signal DQ to each chip 10 is an address. The signal WEn is a signal for causing each chip 10 to take the input signal DQ. The signal REn is a signal for reading the output signal DQ from each chip CP. Each of the ready and busy signals RB0*n*, RB1*n*, is a signal indicating whether the corresponding chips 10-0, 10-1, . . . are in a ready state (a state in which a command from the memory controller 100 can be received) or in a busy state (a state in which the command from the memory controller 100 cannot be received). When the chip 10 is in the busy state, a signal level of the ready and busy signal RB is set to an "L" level.

The input and output signal DQ is, for example, an 8-bit signal set. The input and output signal DQ is data transmitted and received between each chip 10 and the memory controller 100. The input and output signal DQ is a command CMD, an address ADD, write data, and read data.

Thus, the memory controller 100 can communicate with any one chip (NAND flash memory) 10 in the channel CH independently and in parallel between the channels CH.

<Internal Configuration of NAND Flash Memory>

Here, a configuration of the NAND flash memory 10 will be described. Since the configuration of the NAND flash memory 10 of the other chip CP1 is substantially the same as the configuration of the NAND flash memory of the chip CP0, description thereof will be omitted.

As illustrated in FIG. 2, the NAND flash memory (hereinafter, also simply referred to as a flash memory) 10 includes a memory cell array 11, a row decoder 12, a driver 13, a sense amplifier module 14, an address register 15, a command register 16, a sequencer 17, and the like.

The memory cell array 11 stores data from the memory controller 100. The memory cell array 11 includes a plurality of blocks BLK. Each block BLK includes a plurality of memory cells associated with rows and columns. In the example in FIG. 2, four blocks BLK0 to BLK3 are illustrated.

The row decoder 12 selects any one of the blocks BLK0 to BLK3 based on a block address BA in the address register 15. The row decoder 12 selects one of a plurality of word lines in the selected block BLK.

The driver 13 supplies a voltage to the selected block BLK via the row decoder 12, based on a page address PA in the address register 15.

The sense amplifier module 14 senses a signal in accordance with a threshold voltage of a memory cell in the memory cell array 11 when reading data. Thus, the sense amplifier module 14 reads out the data. Read data DAT is output to the memory controller 100. When writing data, the write data DAT from the memory controller 100 is transferred to the memory cell array 11.

The address register 15 stores the address ADD from the memory controller 100. The address ADD includes the block address BA and the page address PA described above.

The command register 16 stores the command CMD received from the memory controller 100.

The sequencer 17 controls an overall operation of the chip CP0 based on the command CMD stored in the command register 16.

<Configuration of Block>

Figure 3:
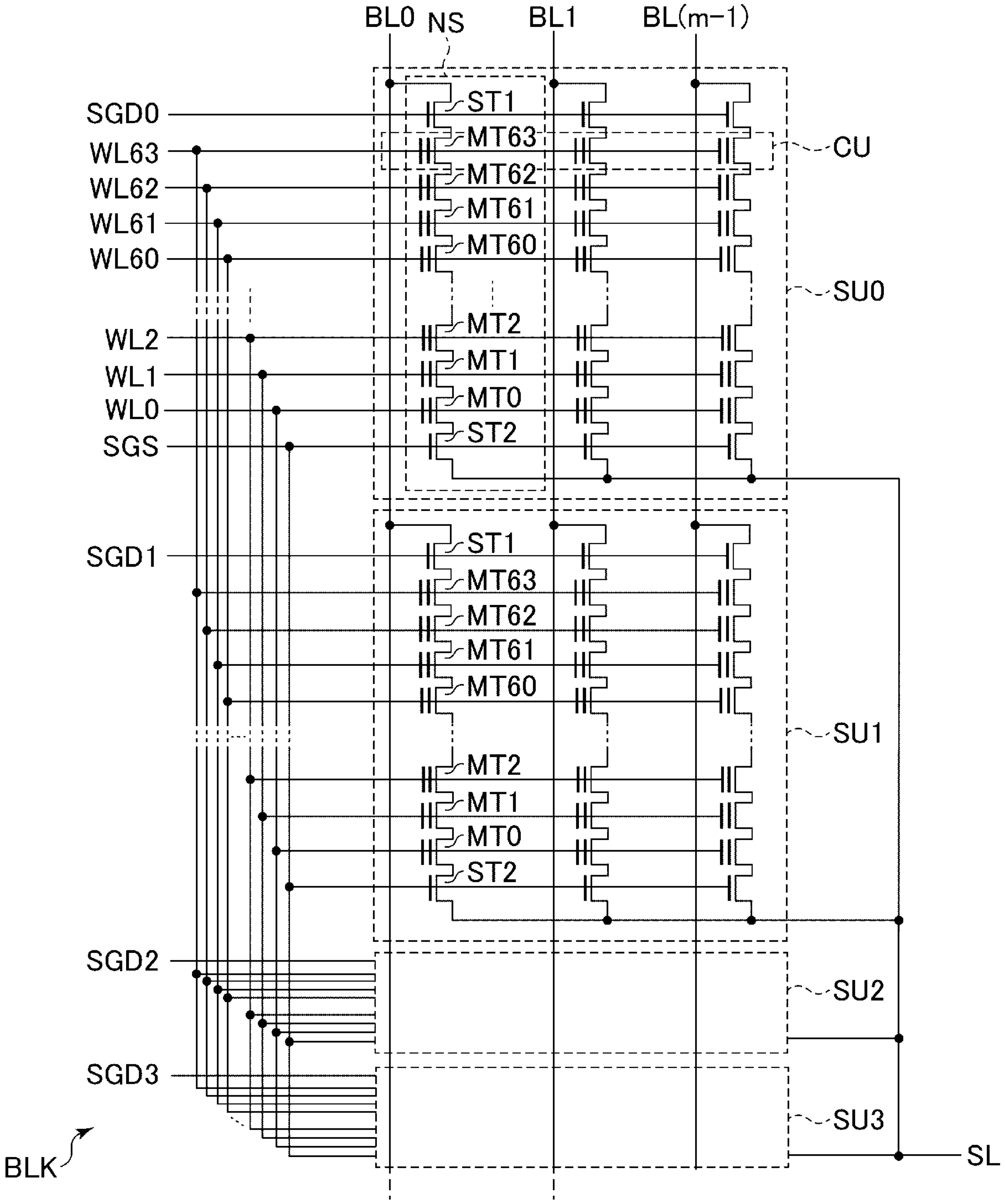
FIG. 3 is an equivalent circuit diagram of a memory system according to a first embodiment.

A configuration of the block BLK will be described with reference to FIG. 3. FIG. 3 is a circuit diagram of one of the blocks BLK.

As illustrated in FIG. 3, the block BLK includes a plurality (for example, four) of string units SU (SU0 to SU3). Each string unit SU includes a plurality of NAND strings NS. The number of blocks in the memory cell array 11, the number of string units in the block BLK, and the number of NAND strings in the string unit SU are set in advance.

Each of the NAND strings NS includes a plurality (for example, 64) of memory cells MT (MT0 to MT63) and select transistors ST1 and ST2. The memory cell MT is connected in series between a source of the select transistor ST1 and a drain of the select transistor ST2.

The memory cell MT stores data in a nonvolatile manner. The memory cell (also called as a memory cell transistor) MT is a field effect transistor having a control gate and a charge storage layer.

A gate of the select transistor ST1 of each of the string units SU0 to SU3 is connected with each of corresponding select gate lines SGD0 to SGD3. On the other hand, gates of the select transistors ST2 in the respective string units SU0 to SU3 are commonly connected to, for example, a select gate line SGS. The gate of the select transistor ST2 may be connected to a different select gate line for each of the string units SU0 to SU3.

Control gates of the memory cells MT0 to MT63 in the same block BLK are respectively connected to the corresponding word lines WL0 to WL63.

Drains of the select transistors ST1 of the NAND strings NS in the same column in the memory cell array 11 are connected to a bit line BL (BL0 to BL(m−1), and m is a natural number equal to or more than 2). The bit lines BL commonly connect the NAND strings NS in the same column between the plurality of blocks BLK. Sources of the plurality of select transistors ST2 are commonly connected to a source line SL.

The string unit SU is a group of the NAND strings NS connected to different bit lines BL and the same select gate line SGD. In the following, among the string units SU, a set (memory cell group) of the memory cells MT commonly connected to the same word line WL is also referred to as a cell unit CU (or a memory group). The block BLK is a group of a plurality of string units SU which share the word line WL. The memory cell array 11 is a group of the plurality of blocks BLK which share the bit line BL.

Figure 4:
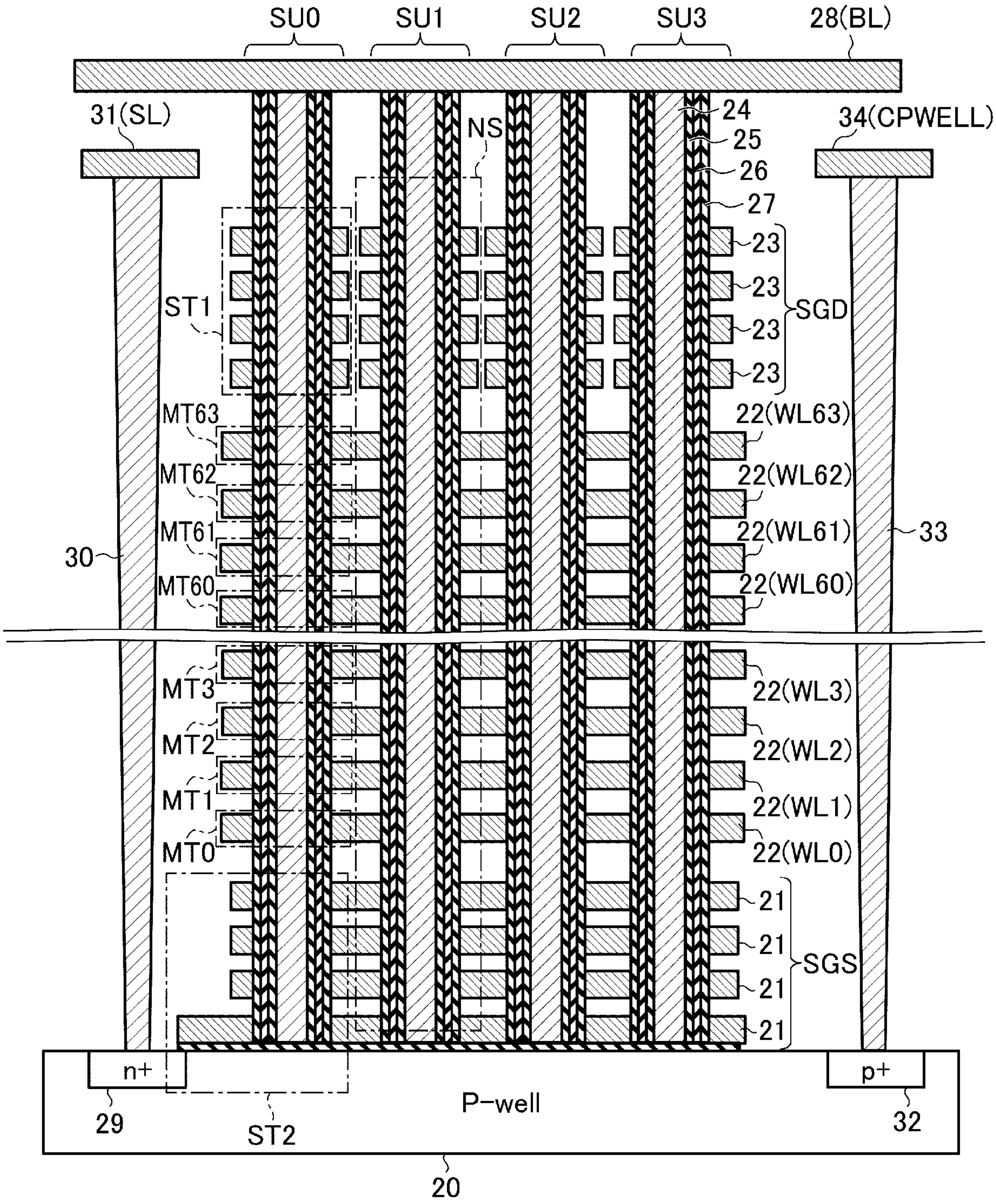
FIG. 4 is a schematic cross-sectional view of a memory system according to a first embodiment.

FIG. 4 is a cross-sectional view of a partial area of the block BLK. As illustrated in FIG. 4, the plurality of NAND strings NS are formed on a p-type well area 20. On the p-type well area 20, a plurality (for example, four layers) of conductive layers 21 functioning as the select gate lines SGS, a plurality of (for example, 64 layers) conductive layers 22 functioning as the word lines WL0 to WL63, and a plurality (for example, four layers) of conductive layers 23 functioning as the select gate lines SGD are subsequently stacked. An insulating layer is provided between the stacked conductive layers.

A pillar 24 is provided in a stack including the conductive layers 23, 22, and 21. The pillar 24 passes through the conductive layers 23, 22, and 21 and reaches the p-type well area 20. The pillar 24 includes a semiconductor (a semiconductor layer). A gate insulating film 25, a charge storage layer (an insulating film or a conductive film) 26, and a block insulating film 27 are subsequently formed on a side surface of the pillar 24.

Thus, the memory cell MT and the select transistors ST1 and ST2 are respectively provided at positions at which the pillar 24 faces the layers 21 to 23.

The pillar 24 functions as a current path of the NAND string NS. The pillar 24 is an area in which a channel of each transistor is formed. An upper end of the pillar 24 is connected to a metal wiring layer 28 which functions as the bit line BL.

An n+ type impurity diffusion layer 29 is provided in a surface area of the p-type well area 20. A contact plug 30 is provided on the n+ type impurity diffusion layer 29. The contact plug 30 is connected to the metal wiring 31 which functions as the source line SL. A p+ type impurity diffusion layer 32 is provided in the surface area of the p-type well area 20. A contact plug 33 is provided on the p+ type impurity diffusion layer 32. The contact plug 33 is connected to the metal wiring 34 which functions as a well wiring CPWELL. The well wiring CPWELL is a wiring for applying a voltage to the pillar 24 via the p-type well area 20.

A plurality of the configurations described above are arranged in a depth direction (or a front direction) of the plane on which FIG. 4 is illustrated. The string unit SU is configured with a set of the plurality of NAND strings NS arranged in the depth direction.

The memory cell array 11 may have another configuration. For example, the other configuration of the memory cell array 11 is described in U.S. patent application Ser. No. 12/407,403 filed on Mar. 19, 2009 entitled "THREE DIMENSIONAL STACKED NONVOLATILE SEMICONDUCTOR MEMORY". Still another configuration of the memory cell array 11 is described in U.S. patent application Ser. No. 12/406,524 filed on Mar. 18, 2009 entitled "THREE DIMENSIONAL STACKED NONVOLATILE SEMICONDUCTOR MEMORY", U.S. patent application Ser. No. 12/679,991 filed on Mar. 25, 2010 entitled "NON-VOLATILE SEMICONDUCTOR STORAGE DEVICE AND METHOD OF MANUFACTURING THE SAME", and U.S. patent application Ser. No. 12/532,030 filed on Mar. 23, 2009 entitled "SEMICONDUCTOR MEMORY AND METHOD FOR MANUFACTURING SAME". These patent applications are cited herein by reference in their entirety.

A relationship between data stored in the memory cell MT and a threshold voltage distribution of the memory cell MT will be described with reference to FIGS. 5A and 5B.

In this example, one memory cell MT can store, for example, 3-bit data. In the following, this 3-bit data is referred to as a lower bit, a lower bit, a middle bit, and an upper bit. A set of lower bits stored by memory cells belonging to the same cell unit CU is called as a lower page (or lower data), a set of middle bits is called as a middle page (or middle data), and a set of higher bits is called as an upper page (or upper data).

For example, 3 pages are assigned to one word line WL (one cell unit CU) in one string unit SU. In other words, the "page" can be defined as a part of a memory space formed in the cell unit CU. Writing and reading of data may be performed for each page or each cell unit CU.

Figure 5A:
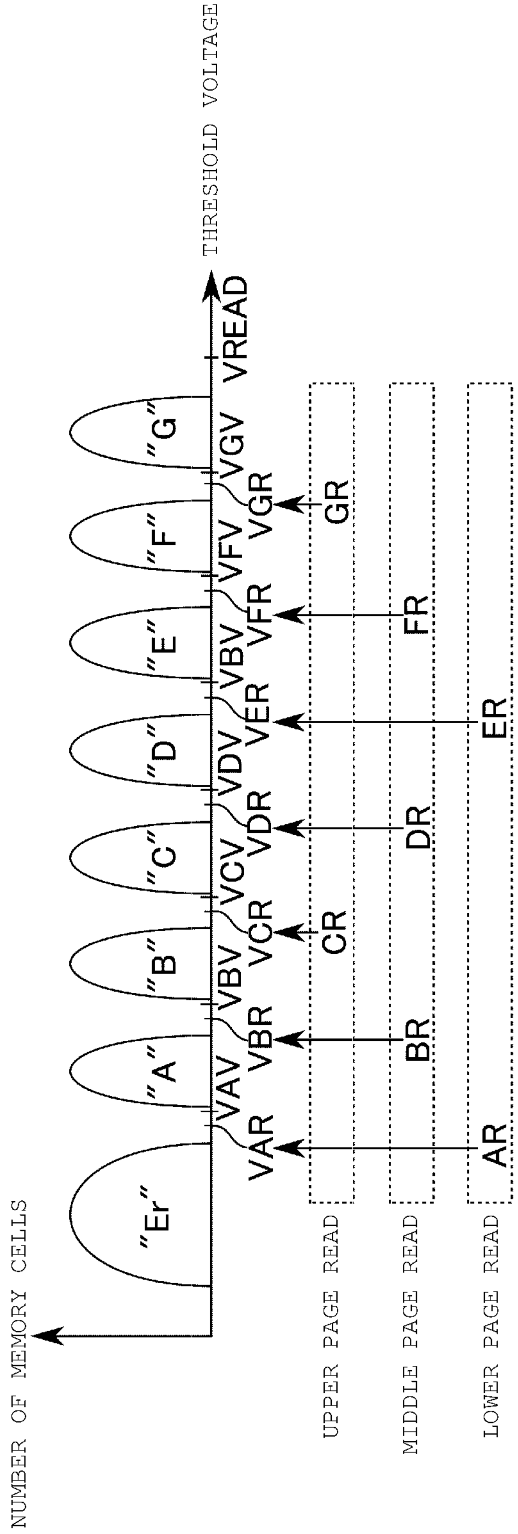
FIGS. 5A and 5B depict aspects related to threshold voltage distributions in a memory system according to a first embodiment.

FIG. 5A is a diagram illustrating data which can be obtained by each memory cell MT, a threshold voltage distribution, and a voltage used when reading the data.

As illustrated in FIG. 5A, when the memory cell MT can store 3-bit data, the memory cell MT can obtain eight states according to a threshold voltage. These eight states are an "Er" state, an "A" state, a "B" state, a "C" state, a "D" state, an "E" state, an "F" state, and a "G" state, in order of decreasing the threshold voltage.

The threshold voltage of the memory cell MT in the "Er" state is less than a voltage VAR and corresponds to a state in which data is erased. The threshold voltage of the memory cell MT in the "A" state is equal to or higher than the voltage VAR and lower than a voltage VBR (VBR>VAR). The threshold voltage of the memory cell MT in the "B" state is equal to or higher than the voltage VBR and lower than a voltage VCR (VCR>VBR). The threshold voltage of the memory cell MT in the "C" state is equal to or higher than the voltage VCR and lower than a voltage VDR (VDR>VCR). The threshold voltage of the memory cell MT in the "D" state is equal to or higher than the voltage VDR and lower than a voltage VER (VER>VDR). The threshold voltage of the memory cell MT in the "E" state is equal to or higher than the voltage VER and lower than a voltage VFR (VFR>VER). The threshold voltage of the memory cell MT in the "F" state is equal to or higher than the voltage VFR and lower than a voltage VGR (VGR>VFR). The threshold voltage of the memory cell MT in the "G" state is equal to or higher than the voltage VGR and lower than a voltage VREAD (VREAD>VGR).

Among the eight states distributed in this manner, the "G" state is a state having the highest threshold voltage. Each state has a range of voltage values associated with corresponding data. The states from "A" to "G" are called as program states.

Hereinafter, each of the voltages VAR to VGR is also called as a determination level or a read level. The voltages VAR to VGR are also collectively referred to as a voltage VCGR.

The voltage VREAD is, for example, a voltage applied to the word line (a non-selected word line) WL which is not a read target during a read operation. When the voltage VREAD is applied to the memory cell MT, the memory cell MT is turned on regardless of data stored in the memory cell MT.

Voltages VAV to VGV are provided for each state for verification of data writing. The voltage VAV is higher than the read level VAR and is equal to or lower than a lower limit value of a desired threshold voltage distribution in the "A" state. The voltage VBV is higher than the read level VBR and is equal to or lower than a lower limit value of a desired threshold voltage distribution in the "B" state. The voltage VCV is higher than the read level VCR and is equal to or lower than a lower limit value of a desired threshold voltage distribution in the "C" state. The voltage VDV is higher than the read level VDR and is equal to or lower than a lower limit value of a desired threshold voltage distribution in the "D" state. The voltage VEV is higher than the read level VER and is equal to or lower than a lower limit value of a desired threshold voltage distribution in the "E" state. The voltage VFV is higher than the read level VFR and is equal to or lower than a lower limit value of a desired threshold voltage distribution in the "F" state. The voltage VGV is higher than the read level VGR and is equal to or lower than a lower limit value of a desired threshold voltage distribution in the "G" state.

In the following, each of the voltages VAV to VGV is also called as a verification level.

The threshold voltage distribution is provided by writing 3-bit data (3 pages) including the lower bit, the middle bit, and the upper bit described above into the memory cell MT in the memory cell array. An example of a relationship between the threshold voltage state and the lower, middle, and upper bits is as follows.

"Er" state: "111" (expressed in order of "upper, middle, and lower")

"A" state: "110"

"B" state: "100"

"C" state: "000"

"D" state: "010"

"E" state: "011"

"F" state: "001"

"G" state: "101"

In this manner, only one bit of the three bits changes between pieces of data corresponding to two adjacent states in the threshold voltage distribution.

In a case of reading the lower bit, a voltage corresponding to a boundary at which a value ("0" or "1") of the lower bit changes may be used. In a case of reading the upper bit, a voltage corresponding to a boundary at which a value of the upper bit changes may be used. In a case of reading the middle-order bit, a voltage corresponding to a boundary at which a value of the middle bit changes may be used.

As illustrated in FIG. 5A, reading of the lower page is executed by using the voltage VAR which distinguishes between the "Er" state and the "A" state and the voltage VER which distinguishes between the "D" state and the "E" state as read voltages.

Reading of the middle page is executed by using the voltage VBR which distinguishes the "A" state and the "B" state, the voltage VDR which distinguishes the "C" state and the "D" state, and the voltage VFR which distinguishes the "E" state and the "F" state as the read voltages.

Reading of the upper page is executed by using the voltage VCR which distinguishes the "B" state and the "C" state and the voltage VGR which distinguishes the "F" state and the "G" state as the read voltages.

By reading using the voltage VAR, the memory cell MT in the erased state is specified.

In the following, reading (determination) using the voltage VAR is also called as AR reading.

In the same manner, reading using the voltages VBR, VCR, VDR, VER, VFR, and VGR is respectively called as BR reading, CR reading, DR reading, ER reading, FR reading, and GR reading.

Figure 5B:
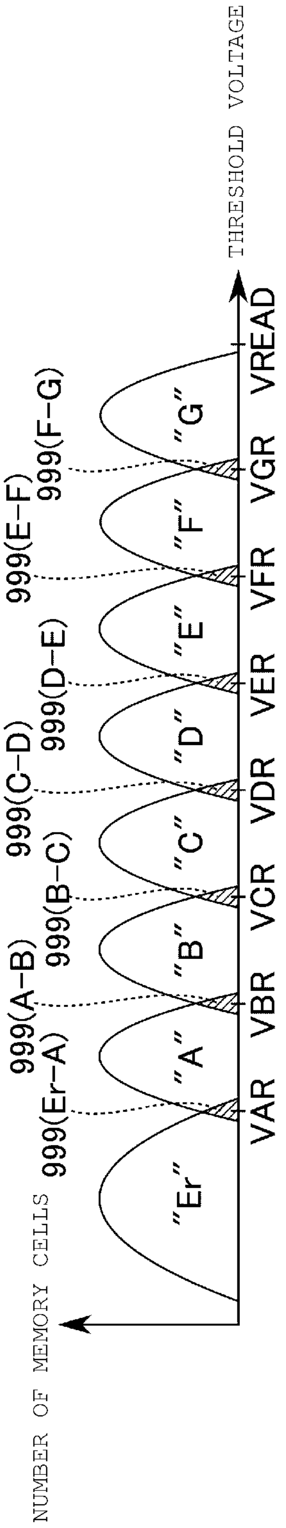

FIG. 5B is a diagram illustrating a state of a threshold voltage distribution of a memory cell.

When after some time after writing data, an error (hereinafter, referred to as a data retention error) in which a threshold voltage distribution (state) is shifted due to interference between memory cells can occur. During a write operation and a read operation to and from the flash memory, an unintended shift of the threshold voltage distribution and an unintended fluctuation in the threshold voltage (hereinafter, respectively referred to as a program disturbance and a read disturbance) may occur.

Characteristics of the plurality of memory cells in the memory cell array tend to vary.

For example, a variation amount (a write speed) of the threshold voltage of the memory cell MT regarding a program voltage having a certain value varies. Due to this variation, when the program voltage having the certain value is applied, among the plurality of memory cells to be written, some memory cells which reach a certain threshold voltage and some memory cells which do not reach the certain threshold voltage are mixed.

Therefore, in the program operation, there is a possibility that an error (hereinafter, referred to as over-programming) in which the threshold voltage of the memory cell is shifted to a state higher than a state corresponding to the data to be written occurs.

When the threshold voltage distributions change due to such various fluctuation factors, adjacent threshold voltage distributions may overlap with each other.

As the adjacent threshold voltage distributions overlap with each other, in the read operation using the voltages VAR, VBR, VCR, . . . VFR, and VGR described above, data may not be correctly read from a memory cell having a threshold voltage in an area 999 in which the distributions overlap with each other.

For example, when the threshold voltage distribution in the "A" state and the threshold voltage distribution in the "B" state overlap with each other, a memory cell having a threshold voltage higher than the voltage VBR among the memory cells of the threshold voltage distribution in the "A" state may be erroneously read as the "B" state, and a memory cell having a threshold voltage less than the voltage VBR among the memory cells having the threshold voltage distribution in the "B" state may be erroneously read as the "A" state. In this manner, when the number of erroneously read bits (the number of fail bits) exceeds the number of correctable error bits of the ECC circuit 160, the memory controller 100 fails to read correct data from the flash memory 10.

Figure 6A:
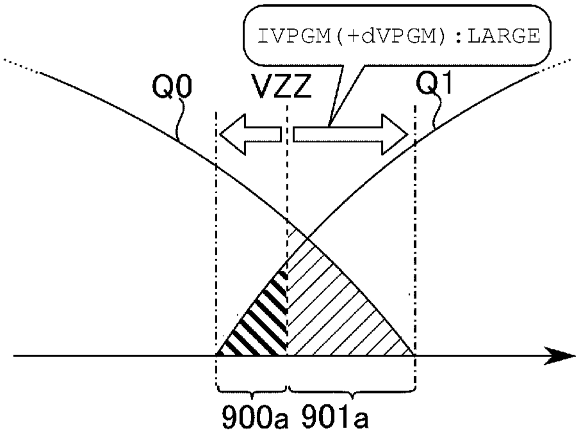
FIGS. 6A, 6B, and 6C are diagrams for schematically explaining an area near a boundary between adjacent cell states.
Figure 6B:
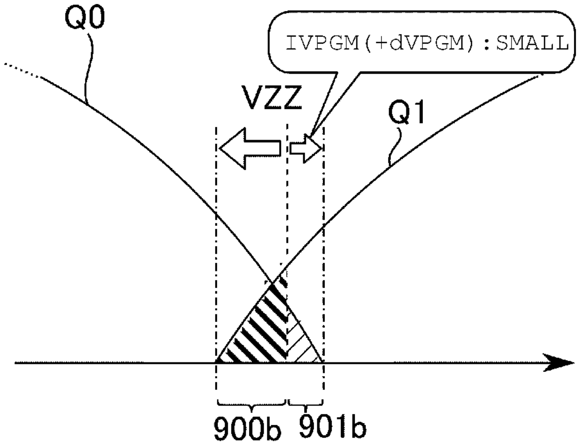
Figure 6C:
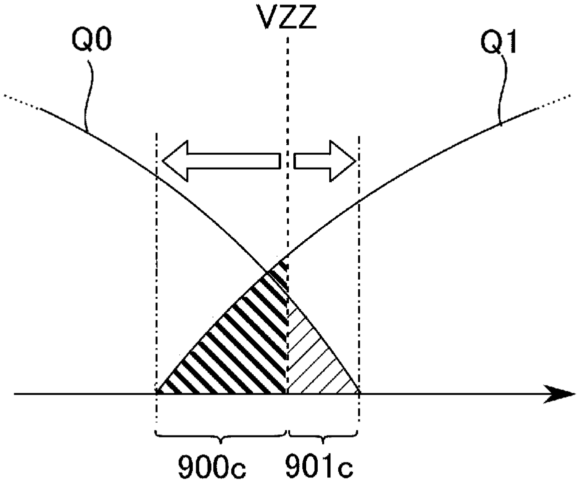

FIGS. 6A to 6C are diagrams for schematically explaining an area near a boundary between adjacent states.

As illustrated in FIGS. 6A to 6C, regarding a certain state Q0 and state Q1 which are adjacent to each other with a certain determination level VZZ as a boundary, a memory cell of which a state corresponding to data to be stored is shifted to another state due to the fluctuation factor exists in an area near the determination level VZZ.

A memory cell of which threshold voltage is changed from a value corresponding to the certain state Q0 to a value corresponding to the higher state Q1 will be referred to as a "Q0toQ1" cell below.

A memory cell of which threshold voltage is changed from a value corresponding to the certain state Q1 to a value corresponding to the lower state Q0 will be referred to as a "Q1toQ0" cell.

As illustrated in FIG. 6A, the "Q0toQ1" cell exists in an area 901*a* having a threshold voltage higher than the determination level VZZ, and the "Q1toQ0" cell exists in an area 900*a* having a threshold voltage lower than the determination level VZZ. For example, the "Q0toQ1" cell is a memory cell which is over-programmed by an excessive program voltage. For example, the "Q1toQ0" cell is a memory cell in which the threshold voltage is lowered in a data storage state.

The memory controller 100 can respectively detect the "Q0toQ1" cell and the "Q1toQ0" cell by a calculation process using read data before the ECC process and read data after the ECC process. The memory controller 100 can count the number of "Q0toQ1" cells and the number of "Q1toQ0" cells based on a detection result.

Regarding a write method used for the write operation, the memory system of the present embodiment focuses on the number of "Q0toQ1" cells and the number of "Q1toQ0" cells which occur between specific states, so that appropriateness of a magnitude of the initial program voltage IVPGM and appropriateness of a magnitude of a step-up voltage can be determined.

For example, immediately after completion of writing of data which is substantially unaffected by the read disturbance and (or) the retention error, as illustrated in FIG. 6A, when the number of "Q0toQ1" cells in a specific state is more than the number of "Q1toQ0" cells in relation to the write method to be executed, the magnitude of the program voltage is expected to be excessive in relation to the characteristics of the memory cell during the write operation.

In a certain write method, regarding a memory cell to which data associated with the "A" state is written, the number of occurrences of a memory cell having a threshold voltage shifted from a value in accordance with the "A" state to a value in accordance with the "B" state, and the number of occurrences of a memory cell having a threshold voltage shifted from a value in accordance with the "B" state to a value in accordance with the "A" state are related to a magnitude of the initial program voltage IVPGM within the program voltage. The memory system of the present embodiment speeds up the write operation by optimizing a voltage value of the initial program voltage IVPGM based on the number of occurrences of the memory cell having the threshold voltage shifted from the "A" state to the "B" state.

In the certain write method, regarding a memory cell to which data associated with each state equal to or more than the "B" state is written, the number of occurrences of a memory cell having a threshold voltage shifted from a value in accordance with the state of data to be stored to a value in accordance with an upper state, and the number of occurrences of a memory cell having a threshold voltage shifted from a value in accordance with the state of data to be stored to a value in accordance with a lower state are related to a magnitude of the step-up voltage within the program voltage.

Therefore, the memory system of the present embodiment optimizes the voltage value of the step-up voltage dVPGM based on the number of occurrences of a memory cell shifted to a state higher than the state corresponding to the data to be stored to speed up the write operation.

On the other hand, as illustrated in FIG. 6B, in relation to the write method to be executed, when the number of "Q0toQ1" cells between specific states is less than a certain reference value (for example, when the number is sufficiently smaller than a number correctable by the ECC process), a magnitude of the program voltage is not expected to be high in relation to the characteristics of the memory cell during the write operation.

For example, regarding a memory cell to which data associated with the "A" state is written, when the number of occurrences of a memory cell having a threshold voltage shifted from a value in accordance with the "A" state to a value in accordance with the "B" state is less than the number of occurrences of a memory cell having a threshold voltage shifted from a value in accordance with the "B" state to a value in accordance with the "A" state, the memory controller 100 sets a voltage value of the voltage IVPGM so as to increase a voltage value of the initial program voltage IVPGM.

As described above, the memory system of the present embodiment controls (corrects and adjusts) the magnitudes of the voltages IVPGM and dVPGM used for the write operation according to the magnitude of the shift of the threshold voltage of the memory cell to shorten a period for the write operation.

In the memory system of the present embodiment, a voltage value of the read level may be a default value or may be shifted.

The memory system according to the present embodiment can detect and count the number of occurrences of a memory cell shifted from a state (a range of a threshold voltage) corresponding to data to be stored to another state, by using a result of the ECC process (for example, read data before error correction and read data after the error correction).

According to the number of occurrences of a memory cell shifted from a state (a range of a threshold voltage) corresponding to data to be stored in a certain write operation to another state, the memory system of the present embodiment controls a magnitude of a voltage used for the next write operation.

When the number of occurrences of the memory cell (the "Q0toQ1" cells) shifted to another state is less than a certain reference value, the memory controller 100 increases (or maintains) a voltage value of at least one of a program voltage and a step-up voltage used for the write operation.

When the number of occurrences of the memory cell ("Q0toQ1") shifted to another state is equal to or more than the certain reference value, the memory controller 100 reduces the voltage value of at least one of the initial program voltage and the step-up voltage used for the write operation.

The memory controller 100 stores information related to the increase or decrease of the voltage used in the write operation in a voltage information table.

The memory controller 100 can notify the flash memory 10 of the information in the voltage information table. In the write operation after the determination process, the initial program voltage and the step-up voltage are set based on the information in the voltage information table.

Thus, the memory system of the present embodiment executes various operations by using the table including information related to various voltages set in consideration of the unintended fluctuation of the threshold voltage of the memory cell MT.

As a result, the memory system of the present embodiment can improve performance.

(a-5) Configuration of Voltage Information Table

A voltage information table in the memory system according to the present embodiment will be described with reference to FIG. 7. As described above, the memory controller 100 stores the voltage information table TBL in the memory 120, for example.

FIG. 7 is a conceptual diagram illustrating an example of a voltage information table of the memory system according to the present embodiment.

In the present embodiment, the voltage information table includes information related to various voltages used in a write operation.

As illustrated in FIG. 7, the voltage information table TBL includes information such as an initial value of the program voltage (hereinafter, referred to as an initial program voltage) IVPGM used in the write operation, the step-up voltage dVPGM used in the write operation, and the like, for example.

Figure 8:
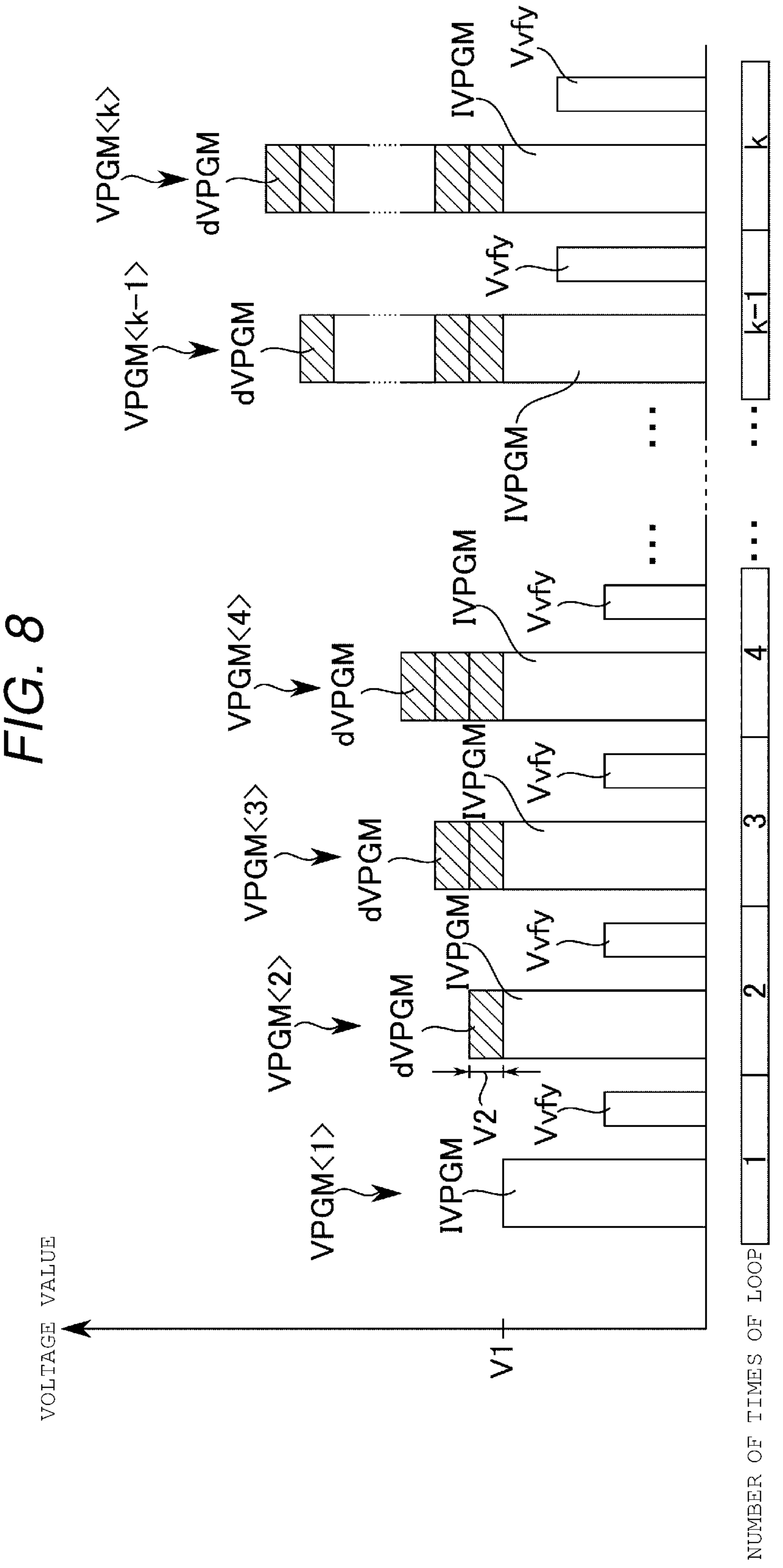
FIG. 8 is a schematic diagram illustrating aspects related to various voltages used during a write operation of a memory system according to a first embodiment.

FIG. 8 is a schematic diagram illustrating various voltages used during a write operation of the memory system according to the present embodiment.

During the write operation, the sequencer 17 in the selected flash memory 10 responds to a write command from the memory controller 100 to apply various voltages to a block, a word line, and a string unit indicated by the selected address.

During the write operation of the NAND flash memory, a plurality of write loops are executed. Each write loop includes a programming process and a verification process.

During the programming process, the plurality of memory cells connected to the selected word line are set to a write-enable state or a write-protection state, according to completion and non-completion of data writing.

During the programming process at a first write loop, the initial program voltage IVPGM is applied to the selected word line as the program voltage VPGM.

For example, the initial program voltage IVPGM has a voltage value V1.

In the first write loop, the verification process is executed after the programming process. In the verification process, a verification voltage Vvfy is applied to the selected word line. By a verification operation, whether or not the selected cell reaches a threshold voltage corresponding to data to be written is verified. By applying the verification voltage, it is detected whether or not the selected cell is turned on. Therefore, it is determined whether or not the selected cell reaches a state corresponding to the data to be written.

In the verification operation, a threshold voltage of the selected cell in an on-state does not reach the value corresponding to the data to be written. When the threshold voltage of the selected cell does not reach the state corresponding to the data to be written, the selected cell is set to the write-enable state.

In the verification operation, the threshold voltage of the selected cell in an off-state reaches the value corresponding to the data to be written. When the threshold voltage of the selected cell reaches the state corresponding to the data to be written, the selected cell is set to the write-protection state in the subsequent write loop.

As the write loop progresses, a voltage value of the program voltage VPGM is stepped up for each write loop. The program voltage after a second write loop has a value obtained by adding the step-up voltage dVPGM having a magnitude in accordance with the number of write loops to the initial program voltage. The step-up voltage dVPGM has a voltage value V2.

For example, in the programming process at the second write loop, the voltage value of the program voltage VPGM has a total value of a voltage value of the initial program voltage IVPGM and a voltage value of the step-up voltage dVPGM.

In the second and subsequent write loops, each time the number of write loops increases by one, the voltage value corresponding to the step-up voltage dVPGM is subsequently added to the initial program voltage. The program voltage VPGM in the j-th (j is an integer equal to or more than 1) write loop is expressed as "IVPGM+(j−1)×dVPGM".

For example, a voltage value of the verification voltage Vvfy is changed as the write loop progresses.

The magnitudes of the initial program voltage IVPGM and the step-up voltage dVPGM may affect occurrence of over-programming during the write operation.

For example, a digital to analogue converter (DAC) value is set as information on the magnitudes (the voltage values V1 and V2) of the initial program voltage IVPGM and the step-up voltage dVPGM.

The information related to the initial program voltage IVPGM and the step-up voltage dVPGM (for example, the DAC value) can be individually set, for example, for each channel CH, each chip CP (NAND flash memory 10), each block BLK, each word line WL, and each string unit SU.

Shift amounts of the voltages VAR to VGR used for the read operation may be stored in the table TBL. Alternatively, a table storing the shift amounts of the voltages VAR to VGR may be separately provided. A voltage value of the read voltage is set based on information in the table. Thus, the memory system according to the present embodiment can provide a more reliable read operation.

In the present embodiment, the voltage information table TBL includes a DAC value related to the initial value of the program voltage (initial program voltage) IVPGM and a DAC value related to the voltage value of the step-up voltage dVPGM.

In the present embodiment, the memory controller 100 determines the DAC values related to the voltage IVPGM and the voltage dVPGM based on a result of the read operation and a result of the ECC process.

For each voltage value of the initial program voltage and the step-up voltage, information indicating a shift amount from a default value is stored in the voltage information table TBL for each channel CH, each chip CP (NAND flash memory 10), each block BLK, each word line WL, and each string unit SU.

In this example, regarding the table TBL, a DAC value in a state of "00" indicates that the memory controller 100 does not store information related to a write voltage. When the DAC value in the table TBL is "00", the memory controller 100 does not perform an instruction related to a setting of the voltage value on the flash memory 10. In this case, the flash memory 10 sets the voltage values of the initial program voltage and the step-up voltage to default values based on information in the flash memory 10.

The shift amounts of the voltage values of the initial program voltage IVPGM and the step-up voltage dVPGM from the default values are calculated by the memory controller 100, for example. The calculated value is stored in the voltage information table in the memory 120. In this manner, the values in the table TBL are updated at any time, according to the operation.

The memory controller 100 can notify the flash memory 10 of the information in the voltage information table. The flash memory 10 sets the voltage value of the initial program voltage and the voltage value of the step-up voltage based on the notified information.

(1a-6) Configuration of Voltage Information Table

Figure 9:
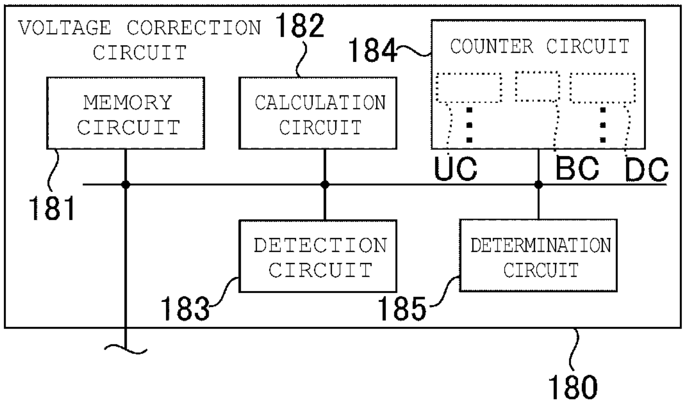
FIG. 9 is a block diagram of a voltage correction circuit of a memory system according to a first embodiment.

FIG. 9 is a schematic diagram illustrating an example of an internal configuration of the voltage correction circuit 180.

As illustrated in FIG. 9, the voltage correction circuit 180 includes a memory circuit 181, a calculation circuit 182, a detection circuit 183, a counter circuit 184, a determination circuit 185, and the like.

The memory circuit 181 temporarily stores read data before error correction and read data after error correction.

The calculation circuit 182 performs various calculation processes on the read data before error correction and the read data after error correction.

The detection circuit 183 detects (samples) a memory cell to be counted and determined based on a calculation result.

The counter circuit 184 includes a plurality of counters such as a bit counter, an up-counter UC, and a down-counter DC. For example, a bit counter BC can count the number of memory cells in an over-programmed state (hereinafter, also referred to as over-programmed cells), the number of memory cells in an over-erased state, or the number of memory cells in an under-erased state, based on a result of the read operation and a result of the ECC process. The up-counter UC and the down-counter DC can store results of various determination processes by the memory controller 100 or the determination circuit 192 or execution results of various processes as count values.

The determination circuit 185 executes various determination processes by using a reference value and a counter value.

The reference value is set in advance by experimental results with respect to the NAND flash memory, various simulations, and the like. The reference value may be changed during use of the memory system, according to a use state of the memory system or a change of the memory system with time.

The memory controller 100 uses the voltage correction circuit 180 to execute various processes. Information in the voltage information table is set by various processes by the voltage correction circuit 180.

The memory controller 100 determines the initial program voltage and the step-up value used for the write operation of the memory cell MT which is a writing target by referring to the voltage information table.

(1b) Operation Example

An operation example of the memory system according to the present embodiment will be described with reference to FIGS. 10A to 20.

(1b-1) Data Write Method

With reference to FIGS. 10A to 10F, a data write method used in a write operation of the memory system according to the present embodiment will be described.

FIGS. 10A to 10F are schematic diagrams illustrating an example of a write method of the NAND flash memory 10 in the present embodiment.

In FIGS. 10A to 10F, a write operation by a full sequence method is schematically illustrated.

In the write operation by the full sequence method, a threshold voltage of a memory cell is shifted from a lower state to an upper state, according to data to be written.

Figure 10A:
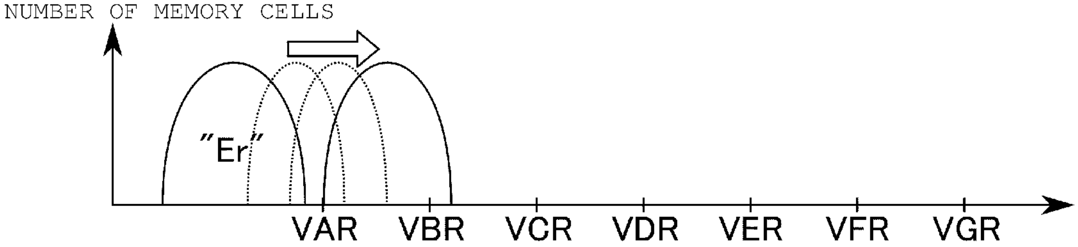
FIGS. 10A to 10F are schematic diagrams illustrating aspects of an operation of a memory system according to a first embodiment.

As illustrated in FIG. 10A, states of all memory cells in a selected area are set to the “Er” state (the erased state) before a program voltage being applied.

Among the memory cells in the “Er” state, a threshold voltage of a memory cell to which data corresponding to the “A”, “B”, . . . and “G” states is written is shifted to a higher level by the application of the program voltage (injection of charges into a charge storage layer).

Figure 10B:
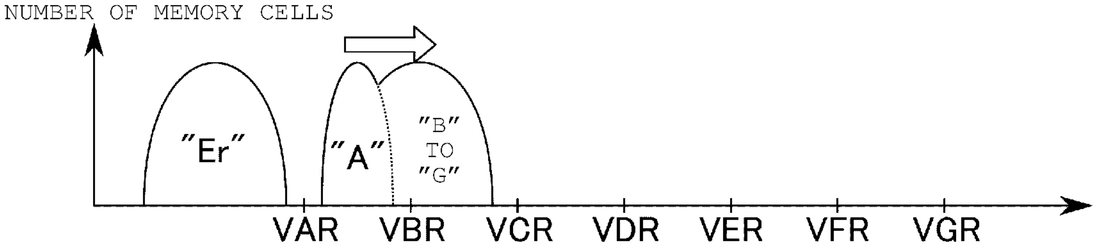

As illustrated in FIG. 10B, threshold voltages of a plurality of selected cells reach a voltage value corresponding to the “A” state by executing a write loop a certain number of times. For example, the threshold voltages of the plurality of selected cells are equal to or higher than the voltage VAR.

Figure 10C:
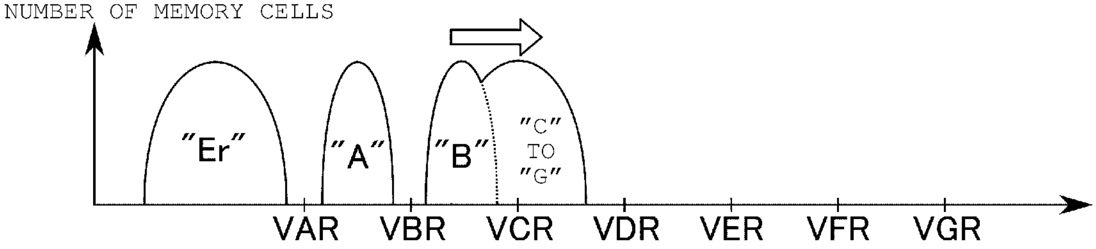

As illustrated in FIG. 10C, among the plurality of memory cells having the threshold voltages equal to or higher than the voltage value corresponding to the “A” state, the threshold voltage of the memory cell to which data corresponding to the “B”, “C”, . . . and “G” states is written is shifted to a higher level by applying the program voltage. Here, the memory cell to which the data corresponding to the “A” state is written is set to a program-protection state. This completes the writing of the data corresponding to the “A” state.

Programming of the data of the “B” to “G” states is continuously executed for the corresponding memory cells.

Figure 10D:
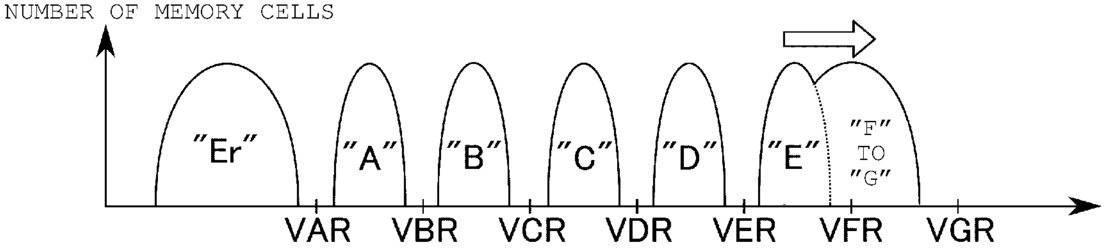

As illustrated in FIG. 10D, the data programming is subsequently completed from the data corresponding to the lower states such as the “B” state, the “C” state, and the “D” state.

Figure 10E:
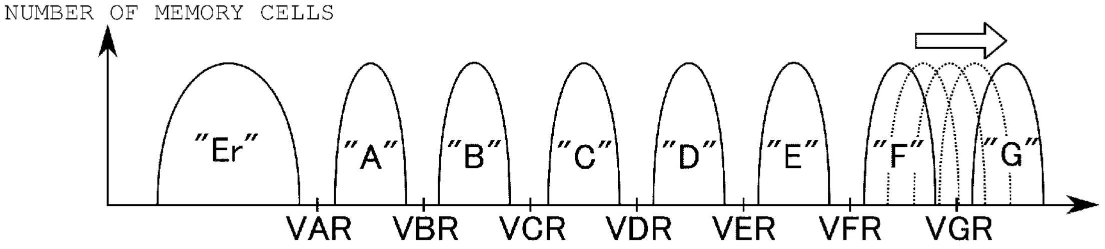

As illustrated in FIG. 10E, the data in the “G” state is written by the program operation for the memory cell having a voltage equal to or higher than the voltage VFR.

In this manner, the data from the “A” state to the “G” state is written in the cell unit in the memory cell array.

Thus, this completes the write operation by the full sequence method.

In the write operation by the full sequence method, the voltage value of the program voltage VPGM increases from the voltage value of the initial program voltage IVPGM by the voltage value of the step-up voltage dVPGM, according to the number of write loops, as illustrated in FIG. 8.

Figure 10F:
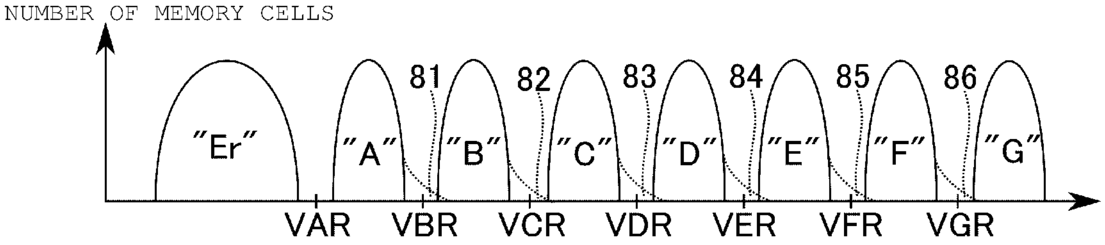

FIG. 10F is a schematic diagram illustrating fluctuation of a threshold voltage to be taken into consideration when setting a voltage used for a write operation.

In the write operation by the full sequence method, when a first write voltage is applied in the write operation, a threshold voltage of the memory cell increases from the “Er” state to the “A” and “B” states by applying the program voltage.

As illustrated in FIG. 10F, in the present write method, a magnitude of the initial program voltage IVPGM is preferably set, according to an occurrence number 81 which is the number of memory cells (hereinafter, also referred to as “AtoB” cells) having a threshold voltage which changes from a value (a voltage value) corresponding to the “A” state to a value corresponding to the “B” state.

The “AtoB” cell is a memory cell in the over-programmed state.

As described above, regarding the memory cell MT in the over-programmed state such as the “AtoB” cell, a threshold voltage of the memory cell MT becomes a higher voltage value than a voltage value (a state) associated with the data to be written.

From the distribution of the “Er” state at the time of first applying the program voltage, it is required to reach a state (a program level) in which a threshold voltage of the memory cell is the lowest among the plurality of states with the number of applications of a pulse (a program voltage) as few as possible, and it is required that the number of memory cells reaching the second lowest state is zero or very small, as a voltage value of the initial program voltage.

In the following, a state in which a memory cell which reaches the second lowest state by one pulse application occurs is one pulse over-program.

For example, when a write operation is executed in the full sequence method, the lowest write level is the “A” state and the second lowest write level is the “B” state.

In the write operation by the full sequence method, a threshold voltage of a memory cell is raised from the lower state to the upper state while subsequently applying the step-up voltage.

Spread (a distribution width) of a threshold voltage distribution in each state has a correlation with a magnitude of the step-up voltage dVPGM. As a general tendency, when the voltage value of the step-up voltage dVPGM is small, the distribution width of the threshold voltage is narrow, and when the voltage value of the step-up voltage dVPGM is large, the distribution width of the threshold voltage is wide.

In the write operation, a lower limit value of the threshold voltage distribution of each state is determined by a verification level of the verification operation.

The appropriateness of the voltage value of the step-up voltage can be determined, according to the number of memory cells shifted to a state higher than a state to be set.

As described above, the over-programmed cell in the lowest-state is used to determine the appropriateness of the voltage value of the initial program voltage. Therefore, it is desirable that the appropriateness of the voltage value of the step-up voltage dVPGM is determined based on the number of over-programmed cells occurring in the second or higher state from the lower state.

For example, in the present write method, the magnitude of the step-up voltage dVPGM is preferably set, according to an occurrence number 82 which is the number of memory cells (hereinafter, also referred to as “BtoC” cells) having a threshold voltage changed from a value (a voltage value) corresponding to the “B” state to a value corresponding to the “C” state, an occurrence number 83 which is the number of memory cells (hereinafter, also referred to as “CtoD” cells) having a threshold voltage changed from a value corresponding to the “C” state to a value corresponding to the “D” state, an occurrence number 84 which is the number of memory cells (hereinafter, also referred to as “DtoE” cells) having a threshold voltage changed from a value corresponding to the “D” state to a value corresponding to the “E” state, an occurrence number 85 which is the number of memory cells (hereinafter, also referred to as “EtoF” cells) having a threshold voltage changed from a value corresponding to the “E” state to a value corresponding to the “F” state, and an occurrence number 86 which is the number of memory cells (hereinafter, also referred to as “FtoG” cells) having a threshold voltage changed from a value corresponding to the “F” state to a value corresponding to the “G” state, in FIG. 10F.

In the following, the memory cells (error cells) in which the threshold voltage is unintentionally shifted from a state corresponding to data to be stored to another state are collectively called as a state shift cell.

The memory system of the present embodiment can respectively execute a setting process of the initial program voltage IVPGM and a setting process of the step-up voltage dVPGM used for the write operation by the full sequence method, based on a result of the read operation and the ECC process of the patrol operation.

As described above, the patrol operation includes the read operation executed at the determination of the memory controller 100 without a request from the host device 2.

For example, by the patrol operation, the read operation and the ECC process are periodically performed on an address (for example, a block) which is rarely accessed. The data in the flash memory 10 is refreshed (data is moved) according to a result of the patrol operation.

In the patrol operation of the memory system according to the present embodiment, for example, based on the result of the read operation from the lower, middle, and upper pages in the flash memory using TLC, a 1-bit shift error occurring in a memory cell which stores 3-bit data, such as the "AtoB" cell, can be specified.

Appropriate voltage values of the initial program voltage IVPGM and the step-up voltage dVPGM in a certain memory system are changed according to the number of times of rewriting to the memory cell.

The memory system according to the present embodiment can set an appropriate value by following changes in the characteristics of the memory cell based on results of various processes in the patrol operation.

(1b-2) Setting of Initial Program Voltage in Patrol Operation

An operation example of the memory system according to the present embodiment will be described with reference to FIG. 11.

Figure 11:
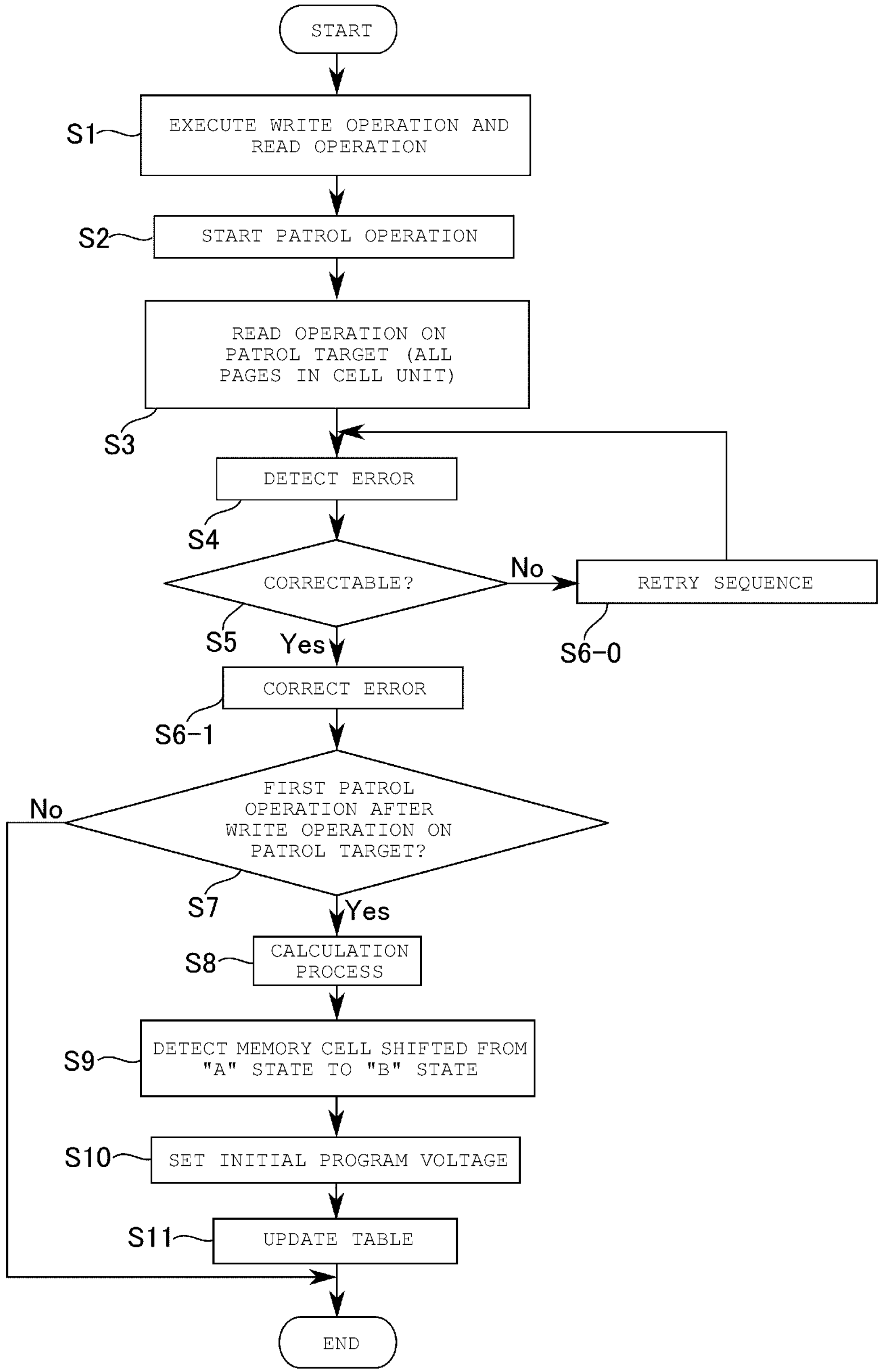
FIG. 11 is a flowchart of an operation of a memory system according to a first embodiment.

FIG. 11 is a flowchart illustrating an optimization process on the initial program voltage IVPGM in a patrol operation of the memory system according to the present embodiment.

<Step S1>

After use of the memory system (the NAND flash memory 10) is started (for example, after power of the memory system is turned on), in step S1, the memory system responds to a command from the host device 2 to execute a write operation and a read operation.

For example, in the write operation from the start of use of the memory system to before a first patrol process, the initial program voltage IVPGM and the step-up voltage dVPGM are set to default voltage values IVPGMd and dVPGMd.

Further, a read voltage having the default voltage value is used in the first read operation from the start of use of the memory system.

For example, a correction amount of the read voltage may be determined based on the results of the read operation and the ECC operation. Thus, an optimization process is executed on the read voltage.

<Step S2>

After a certain period elapses after the start of use of the memory system, the memory controller 100 executes a patrol operation on the NAND package group 200.

<Step S3>

During the patrol operation, the memory controller 100 transmits a read command to one or more flash memories 10 in the NAND package group 200 without an instruction (a host command) from the host device 2.

The flash memory 10 executes a read operation according to the read command from the memory controller 100. The flash memory 10 executes the read operation for all pages of the cell unit CU including a page which is a target of the patrol operation. For example, in this read operation, data of a lower page, a middle page, and an upper page assigned to one word line in one string unit is read.

The flash memory 10 transmits the read data to the memory controller 100.

<Step S4>

An ECC process is executed on the read data.

In step S4, the memory controller 100 causes the ECC circuit to detect an error in the read data (read data before error correction) from the flash memory 10.

<Step S5>

In step S5, the memory controller 100 determines whether or not a detected error can be corrected.

<Step S6-0>

The memory controller 100 executes a retry sequence when the error cannot be corrected (No in step S5).

In step S6-0, the memory controller 100 tries to read data again in the retry sequence. For example, the memory controller 100 performs a shift read operation of changing a read voltage according to a predetermined algorithm. The memory controller 100 tries to detect (and correct) an error in data read by the shift read operation.

When the error cannot be corrected even after the retry sequence is executed a predetermined number of times, the process in FIG. 11 may be ended.

<Step S6-1>

When the error can be corrected (Yes in step S5), error-corrected read data (expected value data) is generated by the error correction by the ECC circuit 160 in step S6-1.

<Step S7>

The memory controller 100 determines whether or not the patrol operation being executed is a first patrol operation after the write operation to a target (for example, a page) of the patrol operation.

When the patrol operation being executed is a second or subsequent patrol operation after the write operation to the target of the patrol operation (No in step S7), the optimization process for an initial program voltage used for the write operation in the memory system according to the present embodiment is ended.

When the patrol operation being executed is the first patrol operation after the write operation in the target of the patrol operation (Yes in step S7), the process in step S8 is executed.

The results of error detection and error correction in the first patrol operation after the write operation are used for the optimization process for the initial program voltage (and a step-up voltage) for the following reason.

After the write operation, the memory cell receives various stresses as a time elapses. For example, when a large number of read commands are issued to a certain block, there is a possibility that the number of "AtoB" cells increases due to a read disturbance even if a voltage value of the initial program voltage is appropriate. Further, even if a voltage value of the step-up voltage dVPGM is appropriate, the number of "BtoC" cells and "CtoD" cells and the like increases due to the read disturbance.

For example, even if a large number of "AtoB" cells occurs during the write operation due to application of the initial program voltage IVPGM having an excessive voltage value, due to data retention (reduction in a threshold voltage) of the memory cell as a time elapses, there is a possibility that the "AtoB" cell is changed to a cell having a threshold voltage corresponding to the "A" state.

Therefore, inspection of the threshold voltage (a charge accumulation state) of the memory cell is preferably executed without substantially time elapsing after the write operation.

Therefore, it is desirable that a process of setting the voltage value of the initial program voltage (and the voltage value of the step-up voltage) to a more appropriate value is executed at a first patrol after the write operation in a plurality of patrol operations executed at a certain frequency (cycle).

The optimization process of the voltage value of the initial program voltage (and the step-up voltage) is executed by using a result of an autonomous process of the memory controller 100 such as the patrol operation, without using a dedicated read sequence for the voltage optimization process.

Thus, a large load on the memory system can be prevented from occurring in the memory system due to the optimization process of the voltage value of the initial program voltage.

<Step S8>

When the patrol operation being executed is the first patrol operation after the write operation in the target of the patrol operation, in step S8, the memory controller 100 executes a calculation process for adjusting and setting various voltages used for the write operation based on a result of the ECC process.

For example, the memory controller 100 creates the bit shift table TBLz by the calculation process using the result of the read operation and the result of the ECC process. The bit shift table TBLz is a table including information such as a detection result and the number of memory cells having a threshold voltage shifted from a state associated with data to be written to another state.

The created bit shift table TBLz is stored in the memory 120, for example.

<Step S9>

Based on a result of the calculation process, the memory controller 100 detects a memory cell (the "AtoB" cell) of which a threshold voltage is shifted from a voltage value corresponding to the "A" state to a voltage value corresponding to the "B" state by using the bit shift table TBLz. For example, the memory controller 100 counts the number of "AtoB" cells.

<Step S10>

In step S10, the memory controller 100 executes a setting process of the voltage value of the initial program voltage IVPGM based on the detection result of a memory cell of which a threshold voltage is shifted to a state higher than a state corresponding to data to be stored. Thus, the voltage value of the initial program voltage IVPGM is set to a more appropriate value.

For example, when the number of occurrences of the "AtoB" cell is less than a certain reference value, the memory controller 100 sets information (for example, a DAC value) so as to increase the initial program voltage IVPGM. For example, when the number of occurrences of the "AtoB" cell is equal to or more than the certain reference value, the memory controller 100 sets the information (the DAC value) so as to decrease the initial program voltage IVPGM.

<Step S11>

In step S11, based on the result of the setting process of the initial program voltage, the memory controller 100 updates a value indicating the voltage value of the initial program voltage stored in the table TBL into a value indicating a voltage value of the initial program voltage IVPGM newly set by the process in step S10.

The memory controller 100 notifies the flash memory 10 of the updated information in the voltage information table TBL at the time of the write operation (for example, the next write operation) executed after the optimization process of the initial program voltage IVPGM.

As described above, in the present embodiment, a magnitude of the initial program voltage IVPGM is set (adjusted or corrected) to a more appropriate value by the processes in FIG. 11. In some cases, the magnitude of the initial program voltage is maintained at a default value, according to the processes described above.

As described above, in the memory system according to the present embodiment, the patrol operation includes the calculation process based on the result of the ECC process (step S8), detection of the memory cells in the over-programmed state (step S9), setting of the initial program voltage (step S10), and updating of the voltage information table (step S11), in addition to the read operation and the ECC process on a certain memory space. The processes in steps S8 to S10 may be handled as an operation (a sequence) different from the patrol operation.

Specific Example

A more specific example of a method of setting an initial program voltage (for example, an optimization process on a voltage value) in a patrol operation of the memory system of the present embodiment will be described with reference to FIGS. 12 to 15E.

Figure 12:
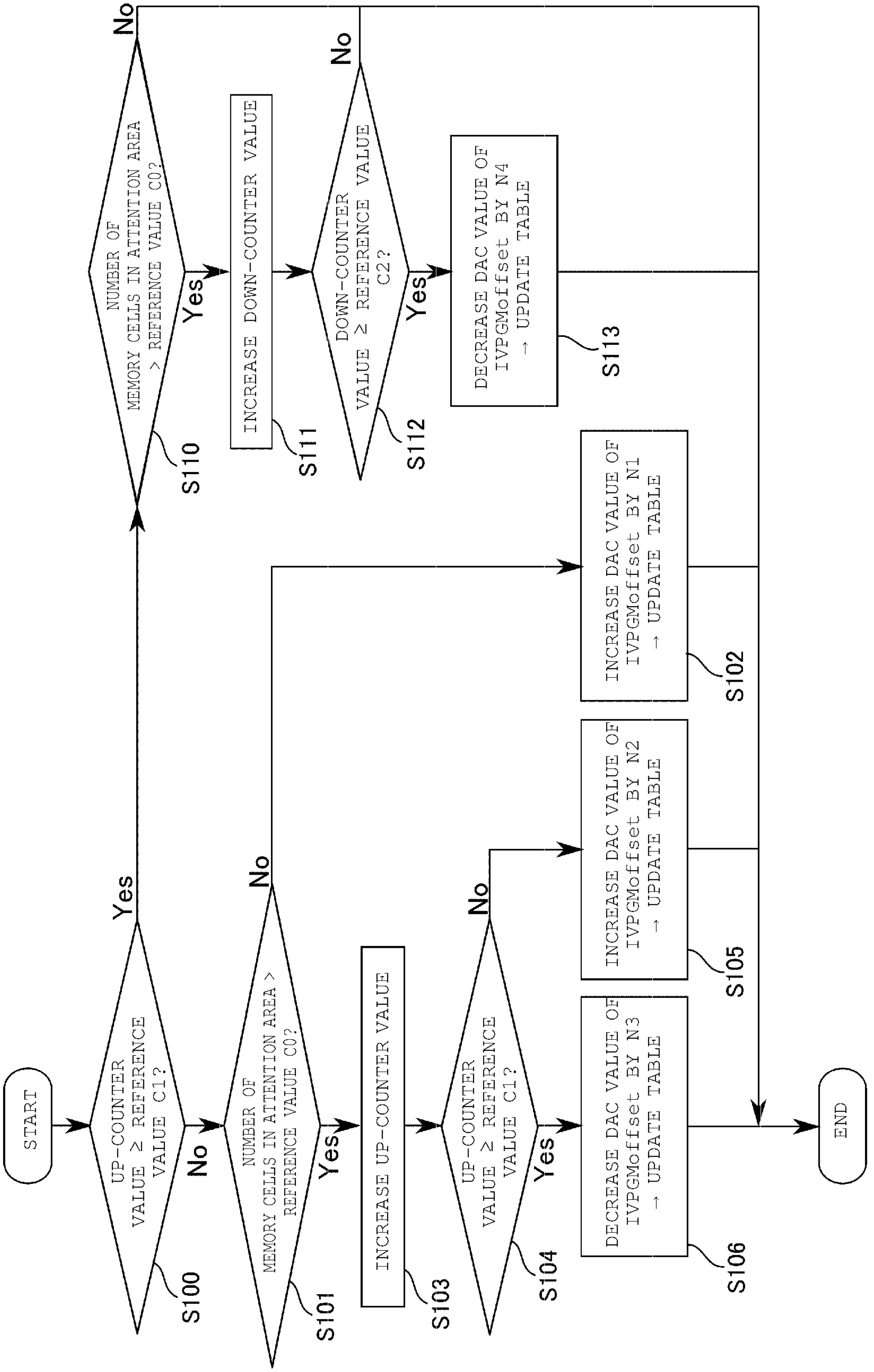
FIG. 12 is a flowchart of an operation of a memory system according to a first embodiment.

FIG. 12 is a flowchart illustrating a specific example of a processing sequence using a detection result of an over-programmed cell in the patrol operation in the memory system of the present embodiment. FIG. 12 illustrates an example of the processes in steps S8 to S11 of the flowchart in FIG. 11.

Figure 13:
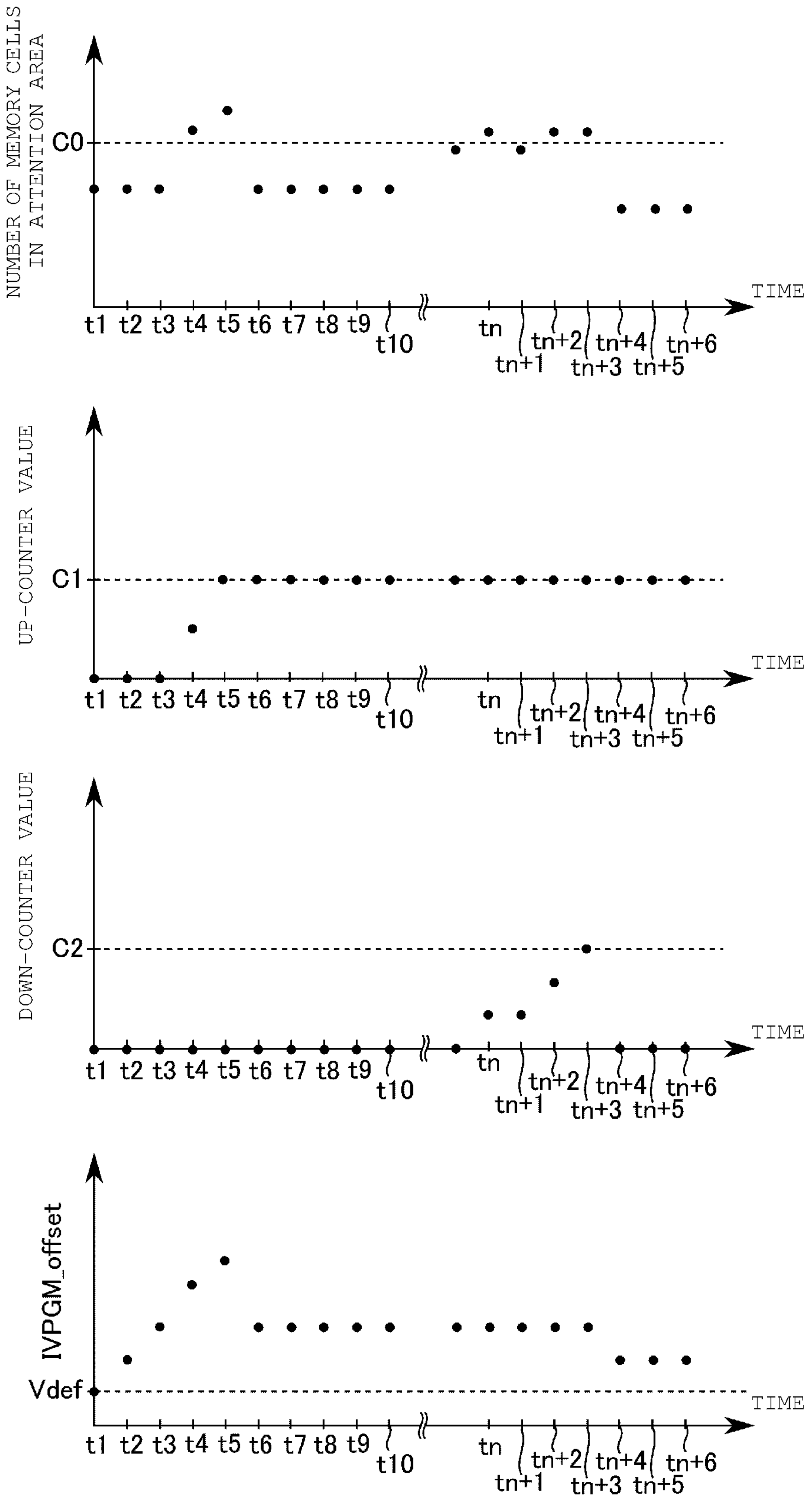
FIG. 13 is a schematic diagram illustrating a transition of various parameters during a setting process of an initial program voltage in a memory system of a first embodiment.

FIG. 13 is a schematic diagram illustrating a transition of various parameters during a setting process of the initial program voltage in the memory system of the present embodiment. FIG. 13 is a graph illustrating a relationship between the number of memory cells, an up-counter value, a down-counter value, a voltage value of an initial program voltage, and a time (the number of write operations) in an attention area to be described below.

FIGS. 14A to 14F and FIGS. 15A to 15E are schematic diagrams illustrating a transition of each value in a table in the setting process of the initial program voltage in the memory system of the present embodiment.

In the example in FIGS. 12 to 15E, the setting process on the initial program voltage IVPGM in a control unit having a chip ID of "0", a block number of "0", a word line number of "0", and a string unit number of "0" (an access unit in which data is read and written) will be described.

In a full-sequence write method, an over-programmed area (an area in which the "AtoB" cells exist) may occur between the "A" state distribution and the "B" state distribution during the setting process of the initial program voltage. The over-program area generated by a program operation is treated as an attention area. The number of memory cells in the attention area is a count target as an index for changing a setting of various voltages (here, the initial program voltage).

In the present embodiment, after use of the memory system is started, the voltage value of the initial program voltage IVPGM is set as follows according to an occurrence state of over-programming (the number of memory cells in the over-programmed state).

<Initial State of Memory System>

FIG. 14A illustrates an initial state of a table related to a setting of an initial program voltage. As illustrated in FIG. 14A, when the NAND flash memory is in an initial state (when use of the memory system is started) (for example, when the memory system is shipped), a voltage value IVPGMoffset of the initial program voltage IVPGM is set to a default value Vdef. The voltage value IVPGMoffset is information of "00" and is illustrated in the table TBL.

Each of a counter value of an up-counter (hereinafter, referred to as an up-counter value) and a counter value of a down-counter (hereinafter, referred to as a down-counter value) is set to "0".

<Time t1>

For example, at a time t1 (a certain time within a period before a first patrol operation after a write operation in a certain setting condition, after use of a memory system is started), based on parameters in FIG. 14A, the write operation is executed by using the initial program voltage IVPGM having a default value (step S1 in FIG. 11).

After the write operation (a first write operation) at the time t1, the first patrol operation after this write operation is executed (step S2 in FIG. 11). The memory controller 100 executes a process of updating the voltage information table based on a result of the ECC process (error detection in step S4 and error correction in step S6-1) of the patrol operation.

Based on the result of the ECC process of the first patrol operation after the first write operation (after the write operation at the time t1), a calculation process (for example, creation of the bit shift table TBLz) and detection of the "AtoB" cell are executed. For example, the number of "AtoB" cells detected by the patrol operation is equal to or less than a reference value C0.

The processing flow in FIG. 12 is executed by using the result obtained by the patrol operation.

<Step S100>

In step S100, the memory controller 100 determines whether or not an up-counter value is equal to or more than a reference value C1 (for example, "2"). In the write operation at the time t1, the up-counter value is less than the reference value C1 (No in step S100).

Therefore, after step S100, the process proceeds to step S101.

<Step S101>

In step S101, the memory controller 100 determines whether or not the number of memory cells in an attention area (here, an overlapping area of "AtoB") is more than the reference value C0. In the write operation at the time t1, the number of "AtoB" cells is equal to or less than the reference value C0 (No in step S101).

Therefore, the process proceeds to step S102 when the determination in step S101 is "No".

<Step S102>

In step S102, the memory controller 100 increases a DAC value of the voltage value IVPGMoffset of the initial program voltage IVPGM by a predetermined value "N1 (for example, 4)" based on the determination result in step S101.

The memory controller 100 updates the table TBL to reflect the determination result in step S101.

As illustrated in FIG. 14B, the memory controller 100 writes "4" in an item of the voltage value IVPGMoffset of the initial program voltage IVPGM in the table TBL. Thus, the DAC value of the voltage value IVPGMoffset in the table TBL is changed from "00" to "4".

Thus, the process based on the result of the patrol operation after the write operation executed at the time t1 is ended.

After updating the table TBL corresponding to the result of the write operation at the time t1, the write operation is executed by using the initial program voltage IVPGM of the voltage value IVPGMoffset corresponding to the DAC value of "4".

<Time t2>

At a time t2, the write operation (for example, a second write operation) based on the table TBL illustrated in FIG. 14B is executed. The write operation at the time t2 is executed by using the initial program voltage IVPGM based on information in FIG. 14B.

Thereafter, the patrol operation (for example, the first patrol operation after the write operation at the time t2) is executed at a certain timing.

After the write operation at the time t2, the patrol operation is executed. This patrol operation is the first patrol operation after the write operation at the time t2.

The processes in FIG. 12 are executed based on the ECC process, the calculation process, and the detection result of the "AtoB" cell in the patrol operation.

As illustrated in FIG. 13, a result of the patrol operation after the write operation at the time t2 is substantially the same as the result of the patrol operation after the write operation at the time t1.

Therefore, the memory controller 100 executes the process in step S102, after steps S100 and S101. The memory controller 100 increases the DAC value of the voltage value IVPGMoffset in the table TBL by the value N1. As illustrated in FIG. 14C, the DAC value of the voltage value IVPGMoffset is changed from "4" to "8" by adding the value N1.

In this manner, the memory controller 100 updates the table TBL based on the result of the first patrol operation after the write operation at the time t2.

After updating the table TBL corresponding to the result of the write operation at the time t2, the write operation is executed by using the initial program voltage IVPGM of the voltage value IVPGMoffset corresponding to the DAC value of "8".

<Time t3>

At a time t3, by using the initial program voltage IVPGM having a voltage value based on the table TBL in FIG. 14C, the first write operation after the write operation at the time t3 (for example, a third write operation) is executed. Thereafter, the patrol operation (for example, the first patrol operation after updating the table TBL corresponding to the write operation at the time t2) is executed.

The processes in FIG. 12 are executed based on the ECC process, the calculation process, and a detection result of the "AtoB" cell in the patrol operation after the write operation at the time t3.

In the same manner as the process for the patrol operation at the time t1 (and the time t2), the memory controller 100 increases the DAC value of the voltage value IVPGMoffset in the table TBL by the value N1. Thus, as illustrated in FIG. 14D, the DAC value of the voltage value IVPGMoffset is changed from "8" to "12".

In this manner, the table TBL is updated based on the results of various processes in the patrol operation for the write operation at the time t3.

After updating the table TBL corresponding to the result of the write operation at the time t3, the write operation is executed by using the initial program voltage IVPGM of the voltage value IVPGMoffset corresponding to the DAC value of "12".

<Time t4>

At a time t4, the write operation is executed by using the initial program voltage IVPGM having a voltage value based on the table TBL in FIG. 14D.

After the write operation at the time t4 (for example, a fourth write operation), the first patrol operation after the write operation at the time t4 (for example, the first patrol operation after updating the table TBL corresponding to the write operation at the time t3) is executed.

The processes in FIG. 12 are executed based on the results of the ECC process, calculation process, and detection process in this patrol operation.

As the detection result of the "AtoB" cells in the patrol operation with respect to the write operation at the time t4, the number of "AtoB" cells becomes more than the reference value C0 as illustrated in FIG. 13.

In this case, in step S101, the process proceeds to step S103.

<Step S103>

When the number of "AtoB" cells is more than the reference value C0 (Yes in step S101), the memory controller 100 updates a value of an up-counter. Thus, the up-counter value increases.

For example, the up-counter value is incremented by the memory controller 100. As illustrated in FIG. 14E, the up-counter value increases from "0" to "1". For example, as the up-counter value increases, the number of memory cells (here, the "AtoB" cells) in an attention area by the program operation using the current initial program voltage IVPGM is increased. This indicates that the voltage value of the current initial program voltage IVPGM is close to an upper limit value although there is a sufficient margin for a correction capability of the ECC process.

<Step S104>

In step S104, after incrementing the up-counter value, the memory controller 100 determines whether or not the incremented up-counter value is equal to or more than the reference value C1.

At the time t4 in FIG. 13, the up-counter value is less than the reference value C1. In this case, the process in FIG. 12 proceeds from step S104 to step S105.

<Step S105>

When the up-counter value is less than the reference value C1 (No in step S104), the memory controller 100 increases the DAC value of the voltage value IVPGMoffset of the initial program voltage IVPGM by a predetermined value "N2". For example, the value N2 is set to approximately half the value N1. In this example, the value N2 is set to "2".

As illustrated in FIG. 14E, the DAC value of the voltage value IVPGMoffset is changed from "12" to "14" by adding the value N2.

In this manner, the memory controller 100 updates the table TBL based on the results of various processes in the patrol operation at the time t3.

After updating the table TBL corresponding to the result of the write operation at the time t4, the write operation is executed by using the initial program voltage IVPGM of the voltage value IVPGMoffset corresponding to the DAC value of "14".

<Time t5>

At a time t5, the write operation is executed by using the initial program voltage IVPGM having a voltage value based on the table TBL in FIG. 14E.

After the write operation at the time t5 (for example, a fifth write operation), the first patrol operation after the write operation at the time t5 (for example, the first patrol operation after updating the table TBL at the time t4) is executed.

The processes in FIG. 12 are executed based on the results of the ECC process, calculation process, and detection process in this patrol operation.

In the detection result of the "AtoB" cells in the first patrol operation after the write operation at the time t5, as illustrated in FIG. 13, since the number of "AtoB" cells is more than the reference value C0, the up-counter value is incremented. Thus, the up-counter value increases from "1" to "2" as illustrated in FIG. 14F.

After updating the up-counter value, in step S104, it is determined whether or not the updated up-counter value is equal to or more than the reference value C1. In relation to the write operation at the time t5, the updated up-counter value is equal to or more than the reference value C1 (here, "2").

Therefore, the process in FIG. 12 proceeds from step S104 to step S106.

The up-counter value equal to or more than the reference value C1 indicates that the voltage value of the program voltage is excessive in relation to characteristics of the memory cell at the time of the write operation at the time t5.

<Step S106>

When the up-counter value is equal to or more than the reference value C1 (Yes in step S104), the memory controller 100 decreases the DAC value of the voltage value IVPGMoffset of the initial program voltage IVPGM by a predetermined value "N3". For example, an absolute value of the value N3 is more than an absolute value of the value N1. In the present embodiment, the value N3 is set to "6".

As illustrated in FIG. 14F, the memory controller 100 decreases the DAC value of the voltage value IVPGMoffset from "14" to "8". By this subtraction process, the DAC value of the voltage value IVPGMoffset in the table TBL is changed.

The memory controller 100 updates the table TBL based on the results of various processes in the first patrol operation for the write operation at the time t5.

After updating the table TBL corresponding to the write operation at the time t5, the write operation is executed by using the initial program voltage IVPGM of the voltage value IVPGMoffset corresponding to the DAC value of "8".

<Time t6>

At a time t6, the write operation is executed by using the initial program voltage IVPGM having a voltage value based on the table TBL in FIG. 14F.

Thereafter, the first patrol operation after the write operation at the time t6 (for example, a sixth write operation) (for example, the first patrol operation after updating the table TBL at the time t6) is executed.

The processes in FIG. 12 are executed based on the results of the ECC process, calculation process, and detection process in this patrol operation.

As described above, the up-counter value is equal to or more than the reference value C1 (=2) for the write operation at the time t6. Therefore, in the determination process in step S100, the process proceeds from step S100 to step S110.

<Step S110>

In step S110, the memory controller 100 determines whether or not the number of "AtoB" cells in the attention area between the "A" state and the "B" state is more than the reference value C0.

As illustrated in FIG. 13, in the write operation at the time t6, the number of "AtoB" cells becomes less than the number of "AtoB" cells in the write operation at the time t5 due to the use of the reduced initial program voltage IVPGMGM. For example, the number of "AtoB" cells in the write operation at the time t6 is less than the reference value C0.

In this case (No in step S110), the memory controller 100 ends the process.

Therefore, as illustrated in FIG. 15A, each piece of information in the table (for example, the DAC value of the initial program voltage) is maintained without being updated from the information (parameter) in FIG. 14F used for the write operation at the time t6.

As a result, after the time t6, the write operation is executed by using the initial program voltage IVPGM of the voltage value IVPGMoffset corresponding to the DAC value of "8".

<Time tn>

At a time tn, the write operation is executed by using the initial program voltage IVPGM having a voltage value based on the table TBL in FIG. 15A. This write operation is executed by using the initial program voltage IVPGM of the voltage value IVPGMoffset corresponding to the DAC value of "8". Thereafter, the first patrol operation after the write operation at the time tn is executed.

The processes in FIG. 12 are executed based on the results of the ECC process, calculation process, and detection process in this patrol operation.

In the patrol operation after the write operation at the time tn, the up-counter value reaches the reference value C1 as illustrated in FIG. 13 (Yes in step S100). The number of "AtoB" cells is more than the reference value C0.

In this case (Yes in step S100 and Yes in step S110), the memory controller 100 executes the process in step S111.

<Step S111>

The memory controller 100 updates a value of a down-counter. Thus, the down-counter value increases. For example, the down-counter value is incremented by the memory controller 100. As illustrated in FIG. 15B, the down-counter value increases from "0" to "1".

<Step S112>

In step S112, after incrementing the down-counter value, the memory controller 100 determines whether or not the incremented down-counter value is equal to or more than the reference value C2.

In the write operation at the time tn in FIG. 13, the down-counter value is less than the reference value C2. In this case (No in step S112), the process in FIG. 12 ends after step S112.

The voltage value IVPGMoffset (DAC value) in the table TBL is maintained. Therefore, after the time tn, the write operation is executed by using the initial program voltage IVPGM of the voltage value IVPGMoffset corresponding to the DAC value of "8" as illustrated in the table TBL in FIG. 15B.

<Time tn+1>

At a time tn+1, the write operation is executed by using the initial program voltage IVPGM having a voltage value based on the table TBL in FIG. 15B. Thereafter, the first patrol operation after the write operation at the time tn+1 is executed.

The process in FIG. 12 is executed based on the result of the ECC process and the calculation process in this patrol operation.

As illustrated in FIG. 13, in the patrol operation for the write operation at the time tn+1, the up-counter value is equal to or more than the reference value C1, and the number of "AtoB" cells is less than the reference value C0.

Therefore, the memory controller 100 ends the processes in FIG. 12 through the determination processes in steps S100 and S110.

As a result, as illustrated in FIG. 15C, the DAC value of the initial program voltage IVPGMoffset in the table TBL is maintained.

<Time tn+2>

At a time tn+2, the write operation is executed by using the initial program voltage IVPGM having a voltage value based on the table TBL in FIG. 15C. The first patrol operation after the write operation is executed.

As illustrated in FIG. 13, the number of "AtoB" cells is more than the reference value C0 in the results of the ECC process, the calculation process, and the detection process in the patrol operation for the write operation at the time tn+2.

Therefore, the memory controller 100 updates the down-counter value, after the processes in steps S100 and S110.

Thus, the down-counter value is incremented from "1" to "2" as illustrated in FIG. 15D.

In step S112, the incremented down-counter value is less than the reference value C2 (here, "3").

In this case, the memory controller 100 ends the processes in FIG. 12.

As a result, the DAC value of the initial program voltage IVPGMoffset in the table TBL is maintained.

<Time tn+3>

At a time tn+3, the write operation is executed by using the initial program voltage IVPGM having a voltage value based on the table TBL in FIG. 15D. Thereafter, the first patrol operation after the write operation at the time tn+3 is executed.

The processes in FIG. 12 are executed based on the results of the ECC process, calculation process, and detection process in this patrol operation.

As illustrated in FIG. 13, the number of "AtoB" cells is more than the reference value C0 in the results of the ECC process, the calculation process, and the detection process in the patrol operation for the write operation at the time tn+3.

Therefore, the memory controller 100 increments the down-counter value after the determination process in steps S100 and S110. Thus, the down-counter value increases from "2" to "3" as illustrated in FIG. 15E.

In step S113, the memory controller 100 determines whether or not the current down-counter value is equal to or more than the reference value C2. Here, the down-counter value set to "3" is equal to or more than the reference value C2 ("3"). The down-counter value equal to or more than the reference value C2 indicates that the initial program voltage IVPGM is preferably reduced in consideration of the characteristics of the memory cell at the time of the write operation executed at the time tn+3.

In this case (Yes in step S112), the memory controller 100 executes the process in step S113.

<Step S113>

In step S113, when the down-counter value is equal to or more than the reference value C2, the memory controller 100 decreases the DAC value of the voltage value IVPGMoffset of the initial program voltage IVPGM by a predetermined value "N4". For example, the value N4 is equal to or less than the value N1. In the present embodiment, the value N4 is set to "1".

As illustrated in FIG. 15E, the memory controller 100 decreases the DAC value of the voltage value IVPGMoffset from "8" to "7". According to this subtraction process, the DAC value of the voltage value IVPGMoffset in the table TBL is changed.

The down-counter value may be reset to "0", after the DAC value of the voltage value IVPGMoffset is changed in step S113.

In this manner, the memory controller 100 updates the table TBL based on the results of various processes in the patrol operation for the write operation at the time tn+3.

As a result, after the time tn+3, the write operation is executed by using the initial program voltage IVPGM of the voltage value IVPGMoffset corresponding to the DAC value of "7" based on the voltage information table TBL illustrated in (e) in FIG. 15E.

As described above, in the memory system according to the present embodiment, the setting process on the initial program voltage (for example, the optimization process on the initial program voltage) is completed.

In general, the NAND flash memory is shipped in a state in which the voltage value of the initial program voltage IVPGM is set to a value lower than the upper limit value.

In the present embodiment, for example, in a first stage of setting the initial program voltage (for example, a period from the time t1 to the time t5), the initial program voltage is set by using the detection result of the memory cell in the over-programmed state so as to reach as close to the upper limit value as possible.

Further, when the number of times of writing increases with use of the memory system, the memory cell of the NAND flash memory has a characteristic that writing of data becomes relatively easy (for example, a writing speed becomes faster). Therefore, if the use of the initial program voltage having a voltage value near the upper limit value is continued, over-programming is likely to occur.

In the present embodiment, in a second stage of setting the initial program voltage (for example, a period from the time tn to the time tn+4), according to the detection result of the over-programmed memory cell, the voltage value of the initial program voltage is reset to a voltage value lower than the voltage value set in the first stage.

Thus, in the present embodiment, the initial program voltage IVPGM used for the write operation by the full sequence method is set to a more appropriate voltage value according to the use status of the memory system (the NAND flash memory). As a result, over-programming is reduced during the write operation.

(1b-3) Step-Up Voltage Setting in Patrol Operation

Figure 16:
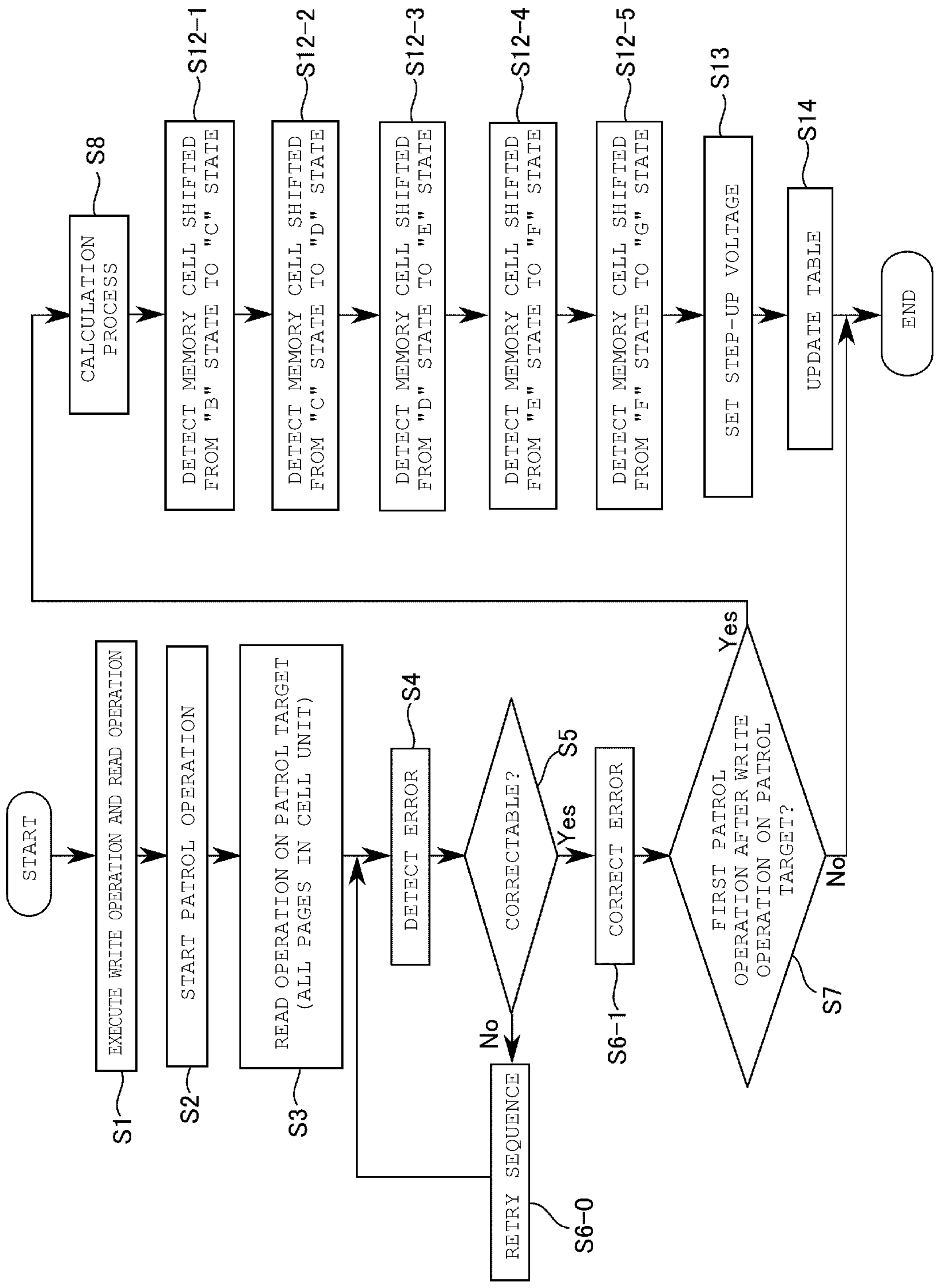
FIG. 16 is a flowchart of an operation of a memory system according to a first embodiment.

FIG. 16 is a flowchart illustrating a method of setting the step-up voltage dVPGM (an optimization process on a voltage value) in a patrol operation of the memory system according to the present embodiment.

As illustrated in FIG. 16, in the same manner as the example illustrated in FIG. 11, the processes from step S1 to step S8 are executed.

<Steps S12-1 to S12-5>

After the calculation process in step S8, based on the result of the calculation process (for example, the bit shift table TBLz), the memory cell having the threshold voltage shifted from the state corresponding to the data to be stored to the upper state is detected.

In step S12-1, the memory controller 100 detects a memory cell having a threshold voltage shifted from the "B" state to the "C" state (hereinafter, also referred to as the "BtoC" cell) by using the bit shift table TBLz. For example, the memory controller 100 counts the number of memory cells shifted from the "B" state to the "C" state.

In step S12-2, the memory controller 100 detects a memory cell having a threshold voltage shifted from the "C" state to the "D" state (hereinafter, also referred to as the "CtoD" cell) by using the bit shift table TBLz. For example, the memory controller 100 counts the number of memory cells shifted from the "C" state to the "D" state in the bit shift table TBLz.

In step S12-3, the memory controller 100 detects a memory cell having a threshold voltage shifted from the "D" state to the "E" state (hereinafter, also referred to as the "DtoE" cell) by using the bit shift table TBLz. For example, the memory controller 100 counts the number of memory cells shifted from the "D" state to the "E" state in the bit shift table TBLz.

In step S12-4, the memory controller 100 detects a memory cell having a threshold voltage shifted from the "E" state to the "F" state (hereinafter, also referred to as the "EtoF" cell) by using the bit shift table TBLz. For example, the memory controller 100 counts the number of memory cells shifted from the "E" state to the "F" state in the bit shift table TBLz.

In step S12-5, the memory controller 100 detects a memory cell having a threshold voltage shifted from the "F" state to the "G" state (hereinafter, also referred to as the "FtoG" cell) by using the bit shift table TBLz. For example, the memory controller 100 counts the number of memory cells shifted from the "F" state to the "G" state in the bit shift table TBLz.

<Step S13>

In step S13, the memory controller 100 executes a setting process on a voltage value of the step-up voltage dVPGM based on the detection result of the memory cell having the threshold voltage shifted to the higher state.

Thus, the voltage value of the step-up voltage dVPGM is set to a more appropriate value.

For example, when a total of the number of "BtoC" cells, the number of "CtoD" cells, the number of "DtoE" cells, the number of "EtoF" cells, and the number of "FtoG" cells is less than a certain reference value, the memory controller 100 sets information (for example, a DAC value) so as to maintain or increase the voltage value of the step-up voltage dVPGM. For example, when a total of the numbers of "BtoC" cells to "FtoG" cells is equal to or more than the certain reference value, the memory controller 100 sets information (DAC value) so as to decrease the voltage value of the step-up voltage dVPGM.

<Step S14>

In step S14, the memory controller 100 updates a value in the voltage information table TBL to a value indicating the set voltage value of the step-up voltage dVPGM based on the result of the setting process on the step-up voltage.

The memory controller 100 notifies the flash memory 10 of information (a value) of the updated voltage information table TBL at a certain timing.

As described above, in the present embodiment, a magnitude of the step-up voltage dVPGM is set (adjusted and corrected) to a more appropriate value, by the processes in FIG. 16. The magnitude of the step-up voltage dVPGM may be maintained at a default value according to the above processes.

As described above, in the memory system according to the present embodiment, the patrol operation includes the calculation process based on the result of the ECC process (step S8), detection of the memory cells in the over-programmed state (steps S12-1 to S12-5), setting of the step-up voltage (S13), and updating of the voltage information table (step S14), in addition to the read operation and the ECC process on a certain memory space. The processes in steps S8 to S14 may be handled as an operation (a sequence) different from the patrol operation.

Specific Example

A more specific example of a method of setting a step-up voltage (for example, an optimization process on the voltage value) in a patrol operation of the memory system according to the present embodiment will be described with reference to FIGS. 17 to 19E.

Figure 17:
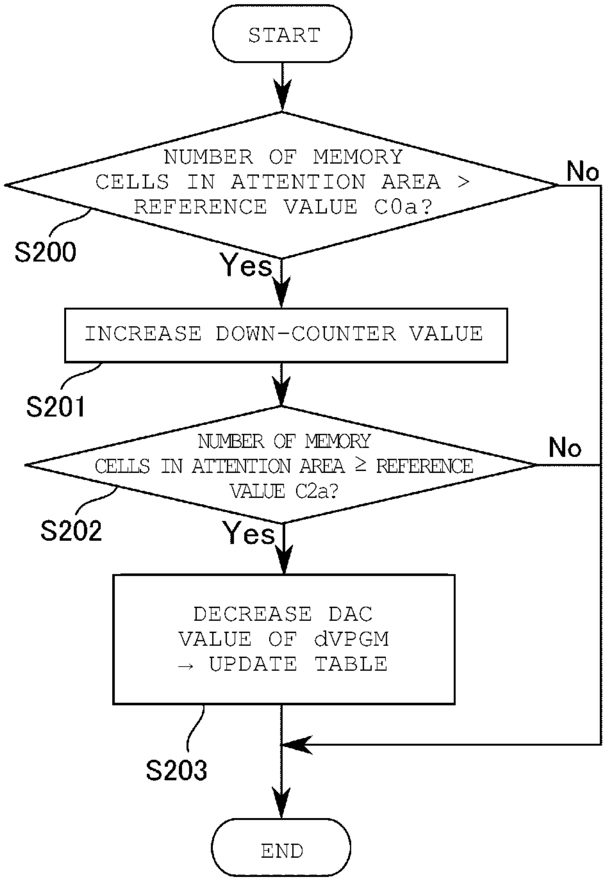
FIG. 17 is a flowchart of an operation of a memory system according to a first embodiment.

FIG. 17 is a flowchart illustrating a specific example of a processing sequence using a detection result of memory cells (for example, over-programmed cells) in an attention area in a patrol operation of the memory system according to the present embodiment is executed.

Figures 18, 19A:
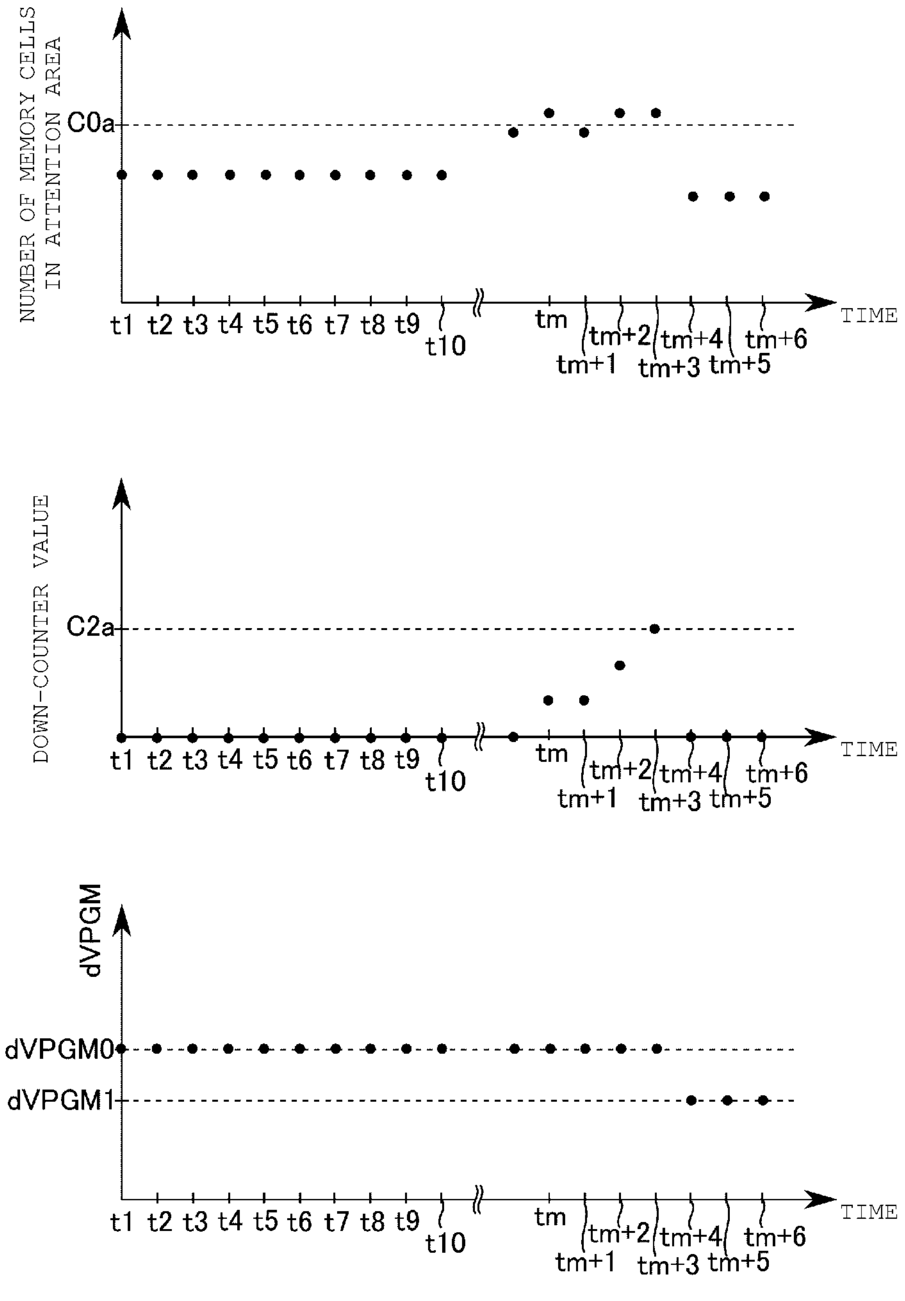

FIG. 18 is a schematic diagram illustrating a transition of various parameters during a setting process on a step-up voltage in the memory system of the present embodiment. FIG. 18 is a graph illustrating a relationship between the number of memory cells in an area in which distributions overlap with each other in a certain state, a down-counter value, a voltage value of the step-up voltage, and a time.

FIGS. 19A to 19E are schematic diagrams illustrating a transition of each value in a table in the setting process on the step-up voltage in the memory system of the present embodiment.

In the example in FIGS. 17 to 19E, the setting process on the step-up voltage dVPGM in a control unit having a chip ID of "0", a block number of "0", a word line number of "0", and a string unit number of "0" (an access unit in which data is read and written) will be described.

In the setting process on the step-up voltage, each of over-programmed areas between the distributions of the states adjacent to each other regarding the "B" to "G" states becomes an attention area.

After use of the memory system is started (for example, after power supply to the memory system is turned on), a voltage value of the step-up voltage dVPGM is set as follows according to an occurrence state of over-programming (the number of memory cells in an over-programmed state).

<Initial State of Memory System>

FIG. 19A illustrates an initial state of a table related to a setting of a step-up voltage. In an initial state of the memory system, a voltage value of the step-up voltage dVPGM is set to a default value (dVPGM0).

Therefore, during a certain time in a period from a start of use of the memory system (for example, the state when the memory system is shipped) to a time after a first patrol operation after a write operation is executed, the write operation is executed by using the step-up voltage dVPGM with the default value.

After the use of the memory system is started, the write operation is executed.

<Time t1>

At a time t1, the write operation using the step-up voltage dVPGM having the default value dVPGM0 is executed. Thereafter, a first patrol operation after the write operation at the time t1 is executed at a certain timing. In the patrol operation, memory cells in an over-program area (an attention area) related to a setting of the step-up voltage are detected. For example, the memory controller 100 detects the "BtoC" cell, the "CtoD" cell, the "DtoE" cell, the "EtoF" cell, and the "FtoG" cell based on read results and results of an ECC process on all pages in the patrol operation. The memory controller 100 counts the number of "BtoC" cells, "CtoD" cells, "DtoE" cells, "EtoF" cells, and "FtoG" cells by using the created bit shift table TBLz.

<Step S200>

In step S200 in FIG. 17, the memory controller 100 determines whether or not the number of these over-programmed cells is more than a reference value C0*a*.

As illustrated in FIG. 18, a total of the number of "BtoC" cells, the number of "CtoD" cells, the number of "DtoE" cells, the number of "EtoF" cells, and the number of "FtoG" cells (hereinafter, also simply referred to as an attention cell) at the time t1 is less than the reference value C0*a*.

In this case (No in step S200), the memory controller 100 ends the processes in FIG. 17 without updating the table.

As a result, as illustrated in FIG. 19B, the step-up voltage dVPGM is maintained at the default value dVPGM0.

<Time t2>

At a time t2, the write operation is executed by using the step-up voltage dVPGM having a voltage value based on the table TBL in FIG. 19B. Thereafter, the first patrol operation after the write operation at the time t2 is executed.

As illustrated in FIG. 18, in the ECC process and the calculation process of the first patrol operation after the write operation at the time t2, a total of the numbers of "BtoC" to "FtoG" cells detected is equal to or less than the reference value C0*a*.

Therefore, after the process in step S200, the memory controller 100 ends the processes in FIG. 17 without changing the voltage value of the step-up voltage dVPGM (updating the table).

During a period after the time t2 until the total of the numbers of "BtoC" to "FtoG" cells becomes more than the reference value C0*a*, the memory controller 100 ends the processes in FIG. 17 without updating the voltage value of the step-up voltage dVPGM in the table TBL.

Therefore, in the memory system of the present embodiment, the write operation using the step-up voltage dVPGM of the default value dVPGM0 is executed during a period when the total of the numbers of "BtoC" to "FtoG" cells is equal to or less than the reference value C0*a*.

<Time tm>

At a time tm, the write operation is executed by using the step-up voltage dVPGM having a voltage value based on the table TBL in FIG. 19B. The first patrol operation after the write operation at the time tm is executed at a certain timing after the time tm.

As illustrated in FIG. 18, in the results of the ECC process, the calculation process, and the process in the patrol operation for the write operation at the time tm, the total of the numbers of "BtoC" to "FtoG" cells (attention cells) becomes more than the reference value C0*a*.

In this case (Yes in step S200), the process proceeds from step S200 to step S201.

When the number of attention cells is more than the reference value C0*a*, the memory controller 100 executes the process in step S201.

The memory controller 100 updates a value of a down-counter. Thus, the down-counter value increases.

For example, the down-counter value is incremented by the memory controller 100. As illustrated in FIG. 19C, the down-counter value increases from "0" to "1".

<Step S202>

In step S202, after the down-counter value is incremented, the memory controller 100 determines whether or not the incremented down-counter value is equal to or more than a reference value C2*a*.

As illustrated in FIG. 18, in the patrol operation corresponding to the write operation at the time tm, the down-counter value is less than the reference value C2$a$ (for example, C2$a$="3").

In this case (No in step S202), the memory controller 100 ends the processes in FIG. 17 related to the result of the write operation at the time tm without updating the step-up voltage.

As a result, as illustrated in FIG. 19C, the step-up voltage dVPGM is maintained at the default value dVPGM0. After the first patrol operation for the write operation at the time tm, the step-up voltage dVPGM used for the write operation is set based on the parameters in the table TBL in FIG. 19C.

<Time tm+1>

At a time tm+1, the write operation is executed by using the step-up voltage dVPGM having a voltage value based on the table TBL in FIG. 19C. Thereafter, the first patrol operation after the write operation at the time tm+1 is executed.

As illustrated in FIG. 18, in the results of the ECC process, the calculation process, and a detection process in the patrol operation at the time tm+1, a total number of attention cells is equal to or less than the reference value C0$a$.

In this case (No in step S200), the memory controller 100 ends the processes in FIG. 17 at the time tm+1.

As a result, a value of the step-up voltage dVPGM and a value of the down-counter value in the table TBL are maintained without being updated.

Therefore, the value of the step-up voltage dVPGM is maintained at the default value dVPGM0.

<Time tm+2>

At a time tm+2, the write operation is executed by using the step-up voltage dVPGM having a voltage value based on the table TBL in FIG. 19C. Thereafter, the first patrol operation after the write operation at the time tm+2 is executed.

As illustrated in FIG. 18, in the results of the ECC process, the calculation process, and the detection process in the patrol operation for the write operation at the time tm+2, a total number of attention cells is more than the reference value C0$a$.

Therefore, the memory controller 100 updates the down-counter value. For example, the down-counter value is incremented. As illustrated in FIG. 19D, the down-counter value increases from "1" to "2".

Thereafter, in step S202, the memory controller 100 determines whether or not the updated down-counter value is equal to or more than the reference value C2$a$.

As illustrated in FIG. 18, at the time tm+2, the down-counter value is less than the reference value C2$a$.

Therefore, the memory controller 100 ends the processes in FIG. 17 related to the result of the write operation at the time tm+2.

<Time tm+3>

At a time tm+3, the write operation is executed by using the step-up voltage dVPGM having a voltage value based on the table TBL in FIG. 19D. The first patrol operation after the write operation after the time tm+3 is executed.

As illustrated in FIG. 18, in the results of the ECC process, the calculation process, and the detection process in the patrol operation for the write operation at the time tm+3, a total number of attention cells is more than the reference value C0$a$.

Therefore, the down-counter value is updated by being incremented by the memory controller 100. As illustrated in FIG. 19E, the down-counter value increases from "2" to "3".

Thereafter, in step S202, it is determined whether or not the updated down-counter value is equal to or more than the reference value C2$a$.

As illustrated in FIG. 18, at the time tm+3, the down-counter value is equal to or more than the reference value C2$a$. The determination results in step S200 and step S202 at the time tm+3 indicate that a magnitude of the step-up voltage that is currently set is excessive in relation to a current memory cell characteristic (for example, during the write operation at the time tm+3).

In this case (Yes in step S202), the memory controller 100 decreases a DAC value of the voltage value of the step-up voltage dVPGM by a predetermined value.

As illustrated in FIG. 19E, the voltage value of the step-up voltage dVPGM is changed from the voltage value dVPGM0 to a voltage value dVPGM1. The voltage dVPGM1 is less than the voltage dVPGM0.

In this manner, the memory controller 100 reduces the magnitude of the step-up voltage based on the results of various processes in the patrol operation.

Thus, the memory controller 100 updates the table TBL related to information on the step-up voltage dVPGM based on the results of various processes in the patrol operation at the time tm+3. The parameters related to the step-up voltage dVPGM in the table are set as illustrated in FIG. 19E. The down-counter value in the table TBL may be reset to "0".

Thereafter, the memory controller 100 ends the processes in FIG. 17 related to the write operation at the time tm+3.

After updating the table TBL at the time tm+3, the write operation is executed by using the step-up voltage dVPGM (dVPGM1) lower than the default value, based on the table TBL in FIG. 19E.

Thereafter, substantially the same processes as the processes in FIGS. 17 to 19E are executed with the progression in use of the memory system.

As described above, in the memory system of the present embodiment, the setting process on the step-up voltage (for example, the optimization process on the step-up voltage) is completed.

Thus, the initial program voltage IVPGM used for the write operation by the full sequence method is set to a more appropriate voltage value.

As a result, the memory system according to the present embodiment can reduce the number of write loops in the flash memory.

Furthermore, in relation to the characteristics of the memory cell, over-programming due to an excessive voltage is reduced during the write operation.

(1b-4) Application Example

An application example of the memory system according to the present embodiment will be described with reference to FIG. 20.

As described above, in the patrol operation, reading of data from all pages is executed. The optimization process on the initial program voltage IVPGM and the step-up voltage dVPGM of the program voltage is executed by using a result of reading data from all pages and a result of the ECC process on the read data.

Therefore, as described below, the optimization process on the initial program voltage IVPGM and the optimization process on the step-up voltage dVPGM in the present embodiment can be executed as continuous processes.

Figure 20:
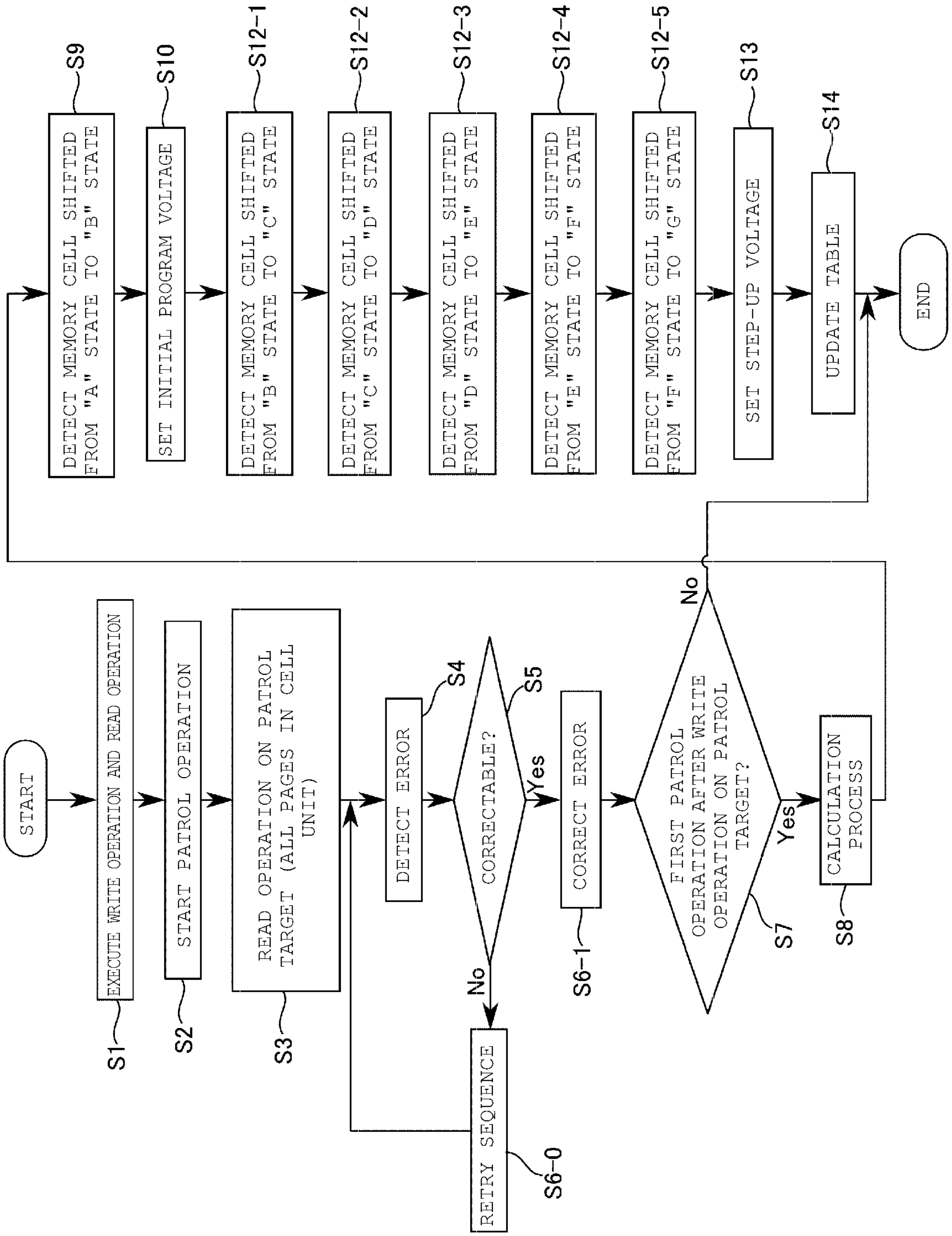
FIG. 20 is a flowchart of an operation of a memory system according to a first embodiment.

FIG. 20 is a flowchart illustrating an application example of the memory system according to the present embodiment.

As illustrated in FIG. 20, in the same manner as the processes in steps S1 to S8 in FIG. 11 (and FIG. 16), the first patrol operation after the write operation is executed in the processes in steps S1 to S8. In this first patrol operation, data is read from a patrol target of the flash memory 10 (for example, all pages in a cell unit). Detection and correction of an error are executed on the read data.

The calculation process in step S8 is executed by using the read data before error correction and the read data after error correction. For example, the bit shift table TBLz is created based on a result of this calculation process.

After the calculation process, in step S9, the memory controller 100 detects an "ErtoA" cell based on the result of the calculation process. For example, the memory controller 100 counts the number of "ErtoA" cells.

In step S10, the memory controller 100 executes a process of optimizing a voltage of the initial program voltage IVPGM based on a detection result of the "AtoB" cell.

Thus, the voltage value of the initial program voltage IVPGM is acquired.

Thereafter, as in steps S12-1 to S12-5, based on a result of the calculation process, the memory controller 100 detects the "BtoC" cell, the "CtoD" cell, the "DtoE" cell, the "EtoF" cell, and the "FtoG" cell. For example, the number of those memory cells (over-programmed cells) is counted.

In step S13, the memory controller executes a process of optimizing a voltage of the step-up voltage dVPGM based on a detection result of the cells in steps S12-1 to S12-5.

Thus, the voltage value of the step-up voltage dVPGM is acquired.

The number of memory cells having a threshold voltage shifted from a state corresponding to data to be originally stored to a one-level higher state is counted.

Based on this result, the voltage value of the step-up voltage dVPGM is set.

In step S14, based on the result of the setting process of the initial program voltage and the result of the setting process of the step-up voltage, the memory controller 100 updates values in the voltage information table TBL into values indicating the set voltage values of the voltages IVPGM and dVPGM.

For example, the processes in FIGS. 12 and 17 may be respectively executed at the time of setting the initial program voltage and the step-up voltage.

As described above, the memory system according to the present embodiment can execute the optimization process on the program voltage and the step-up voltage with one processing sequence.

(d) Summary

As described above, the memory system according to the present embodiment adjusts and sets a plurality of voltages (for example, at least one of the initial program voltage and the step-up voltage) used for the write operation, according to the result of reading data and the result of the ECC process. For example, the memory system according to the present embodiment sets the plurality of voltages used for the write operation to more appropriate values, according to the current characteristics of the memory cell of the flash memory (for example, a write speed of the memory cell).

Thus, the memory system according to the present embodiment can reduce the number of write loops during the write operation of the flash memory.

As a result, the memory system according to the present embodiment can speed up the write operation.

In addition, the memory system according to the present embodiment can set the voltage in accordance with a change in the characteristics of the flash memory (for example, a change with time or deterioration due to use). Thus, the memory system according to the present embodiment can prevent the threshold voltage of the memory cell from reaching an unintended value (state), such as over-programming due to an excessive programmed voltage, in relation to the characteristics of the memory cell.

As a result, the memory system according to the present embodiment can improve a reliability of data.

As described above, the memory system according to the present embodiment can provide a high-performance memory system.

(2) Second Embodiment

A memory system and a control method of the memory system according to a second embodiment will be described with reference to FIGS. 21 to 26.

In addition to the various voltages used for the write operation, a voltage used for an erase operation may be determined according to the number of memory cells of which states are shifted.

Hereinafter, a method of setting the voltage used for the erase operation based on a result of the read operation and the ECC process (the optimization process) will be described.

Figure 21:
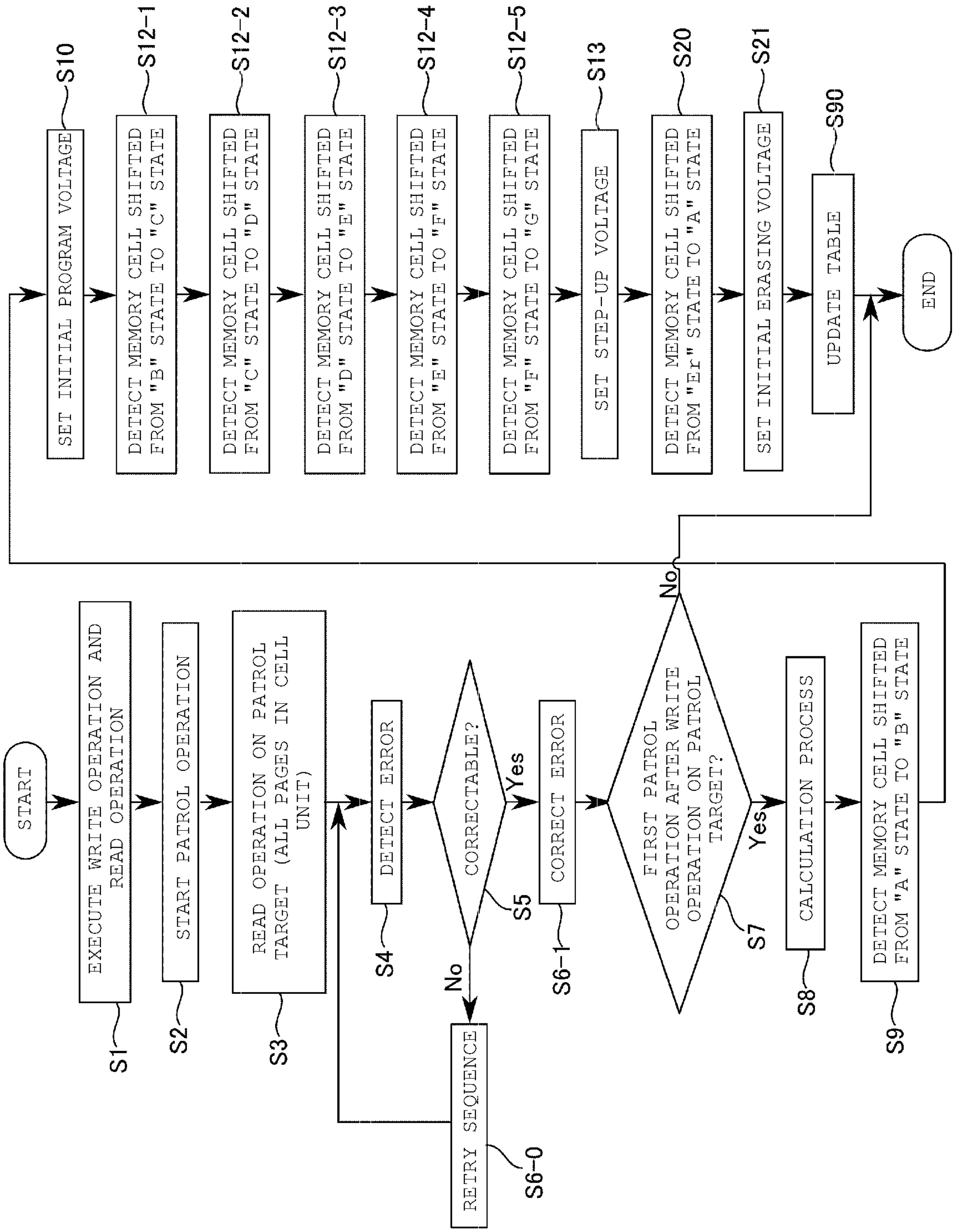
FIG. 21 is a flowchart of an operation of a memory system according to a second embodiment.

FIG. 21 is a flowchart illustrating a method of setting an erasing voltage in a patrol operation, in an operation example of the memory system according to the second embodiment.

As illustrated in FIG. 21, as in the process flow according to the first embodiment (for example, the process flow in FIG. 11), a voltage value of the initial program voltage IVPGM and a voltage value of the step-up voltage dVPGM are respectively determined based on a result of the read operation and a result of the ECC process in the patrol operation.

Thereafter, as in steps S20 and S21, a setting process on a voltage used for the erase operation (for example, an optimization process on an initial erasing voltage) is executed.

<Step S20>

In the process of setting the initial erasing voltage, an over-programmed area (an area in which the "ErtoA" cells exist) between a distribution of the "Er" state and a distribution of the "A" state is an attention area for setting an initial erasing voltage IVERA (hereinafter, also referred to as an under-erased area).

In step S20, the memory controller 100 detects a memory cell (the "ErtoA" cell) having a threshold voltage shifted from a value corresponding to the "Er" state to a value corresponding to the "A" state. For example, the memory controller 100 counts the number of "ErtoA" cells.

<Step S21>

The memory controller 100 determines a voltage value of the initial erasing voltage IVERA based on a detection result of the "ErtoA" cells (the number of "ErtoA" cells).

Thereafter, in step S90, the memory controller 100 updates the values in the voltage information table TBL regarding the voltage value of the initial erasing voltage IVERA, along with the voltage value of the initial program voltage IVPGM and the voltage value of the step-up voltage dVPGM.

As described above, the memory system according to the present embodiment can execute the optimization process on the voltage (for example, the initial erasing voltage) used for the erase operation.

In the present embodiment, only the setting process on the initial erasing voltage may be performed without executing the setting process on the initial program voltage IVPGM and the step-up voltage dVPGM, based on the result of the read operation and the ECC process in the patrol operation.

Specific Example

A more specific example of the method of setting the erasing voltage (for example, the optimization process on the voltage value) in the patrol operation in the memory system of the present embodiment will be described with reference to FIGS. 22 to 25E.

Figure 22:
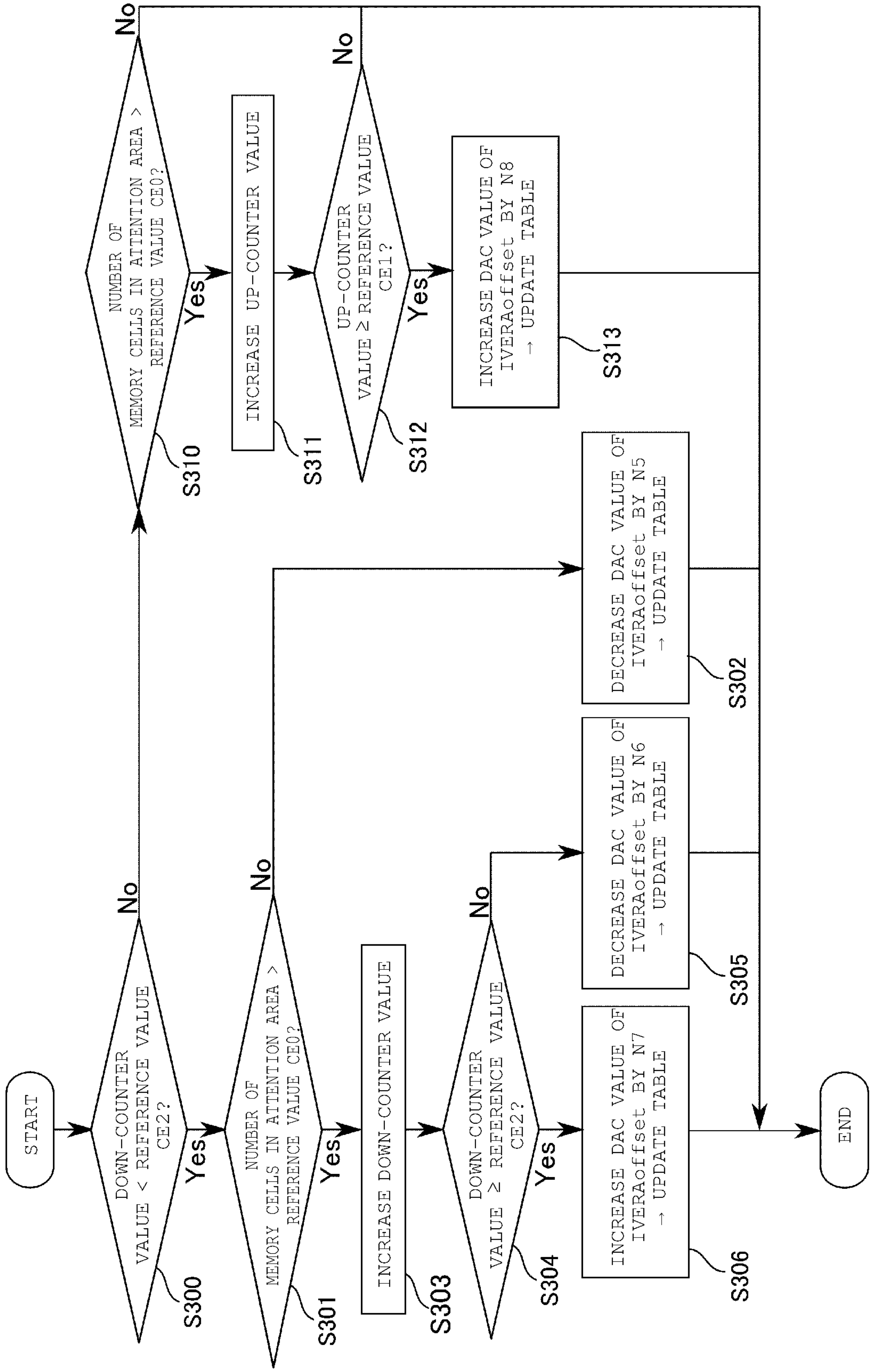
FIG. 22 is a flowchart of an operation of a memory system according to a second embodiment.

FIG. 22 is a flowchart illustrating a specific example of a processing sequence using a detection result of a memory cell having an erase failure in a patrol operation of the memory system according to the present embodiment.

Figure 23:
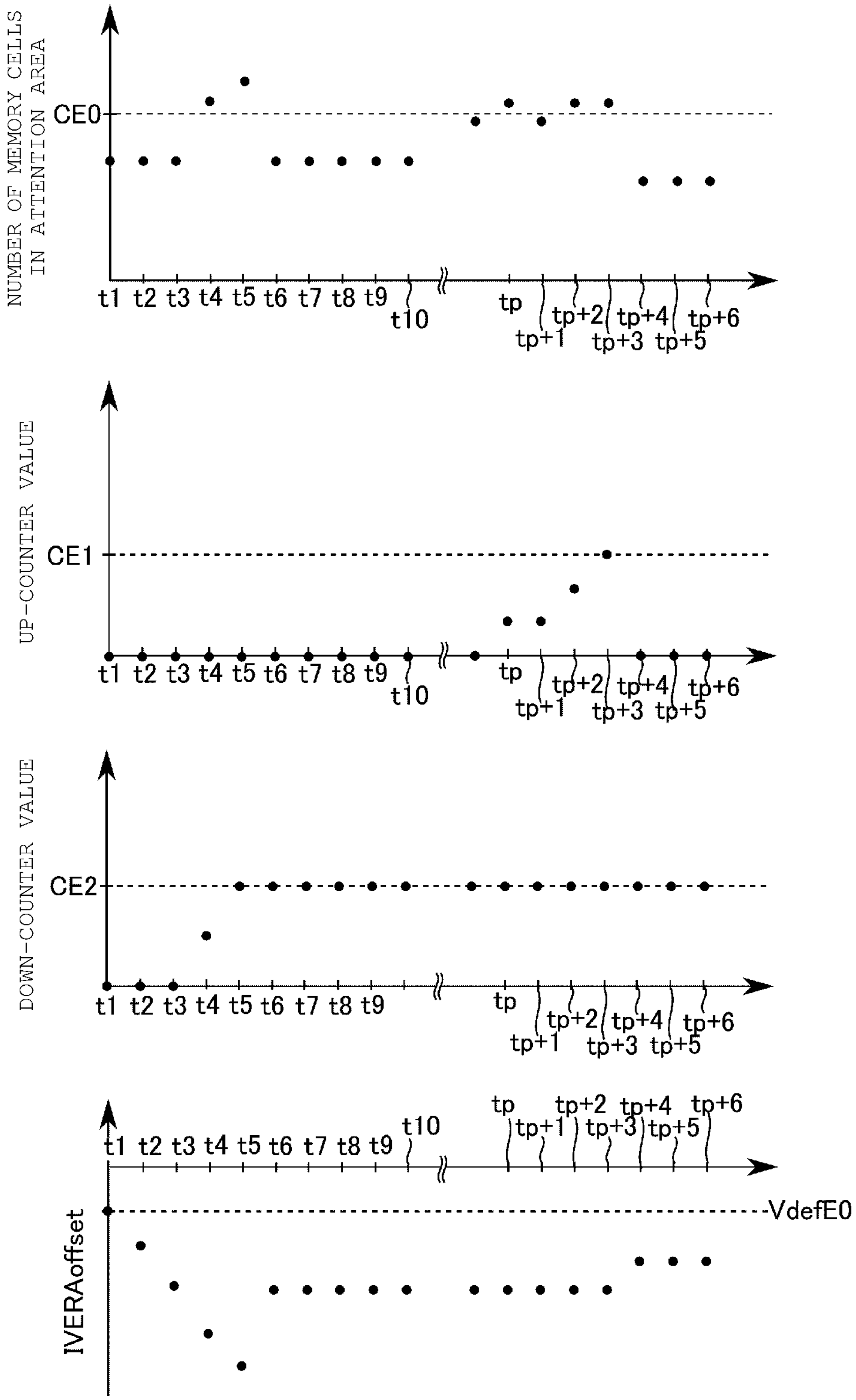
FIG. 23 is a schematic diagram illustrating a transition in various parameters during a setting process of an erasing voltage in the memory system according to a second embodiment.

FIG. 23 is a schematic diagram illustrating a transition in various parameters during a setting process on an erasing voltage in the memory system according to the present embodiment. FIG. 23 is a graph illustrating a relationship between the number of memory cells in an attention area, an up-counter value, a down-counter value, a voltage value of an erasing voltage, and a time in an attention area related to the "Er" state and the "A" state.

FIGS. 24A to 24F and FIGS. 25A to 25E are schematic diagrams illustrating a transition of each value in a voltage information table in the setting process on the erasing voltage in the memory system according to the second embodiment.

In the example in FIGS. 22 to 25E, the setting process on the initial erasing voltage IVERA in a control unit of a chip ID of "0" and a block number of "0" will be described. Here, a value of the initial erasing voltage IVERA is calculated from the control unit of a word line number of "0" and a string unit number of "0". The word line number and the string unit number are not limited to the above values.

As described above, in the setting process on the initial erasing voltage, an under-erased area in which the "ErtoA" cell exists becomes an attention area for setting the initial erasing voltage IVERA.

In this example, after the use of the memory system is started, the voltage value of the initial erasing voltage IVERA is set as follows, according to an occurrence status of the "ErtoA" cells (the number of memory cells in the "ErtoA" state).

<Initial State of Memory System>

FIG. 24A illustrates an initial state of a table related to a setting of an erasing voltage. As illustrated in FIG. 24A, in an initial state of the NAND flash memory (an initial state of the memory system), the voltage value IVERAoffset is information of "00" and is indicated in an erasing voltage information table TBL-ERA. The memory controller 100 does not store setting information related to a voltage value of the initial erasing voltage IVERA. The voltage value IVERAoffset of the initial erasing voltage IVERA is set to a default value. The flash memory 10 executes an erase operation using the initial erasing voltage IVERA having the default value.

Each of a counter value of an up-counter and a counter value of a down-counter is set to "0".

After use of the memory system is started, the erase operation and a write operation are executed.

In the present embodiment, the memory system executes the erase operation on the NAND flash memory by using the initial erasing voltage IVERA having the default value within a period from the start of use of the memory system to a certain time. After the erase operation, the write operation is executed.

<Time t1>

At a certain time t1 from the start of use of the memory system, the write operation (for example, a first write operation from the start of use of the memory system) is executed after the erase operation based on a setting condition of the voltage information table in FIG. 24A. At a certain timing after the erase operation and the write operation at the time t1, a first patrol operation after the write operation at the time t1 is executed (step S2 in FIG. 21). A calculation process and detection of the "ErtoA" cell are executed, based on the patrol operation (steps S8 and S20 in FIG. 21). Thus, the number of "ErtoA" cells in the attention area (the under-erased area) is counted. For example, the number of "ErtoA" cells detected by the patrol operation at the time t1 is less than a reference value CE0.

The processing flow in FIG. 22 is executed by using a result obtained by the patrol operation.

<Step S300>

In step S300, the memory controller 100 determines whether or not the down-counter value is less than a reference value CE2 (for example, "2"). At the time t1, as illustrated in FIG. 23 and FIG. 24A, the down-counter value is less than the reference value CE2.

When the determination result in step S300 is "Yes", the process proceeds to step S301, after step S300.

<Step S301>

In step S301, the memory controller 100 determines whether or not the number of memory cells in the attention area (here, the area of the "ErtoA" cell) is more than the reference value CE0. In the initial state of the memory system, the number of "ErtoA" cells is equal to or less than the reference value CE0. This indicates that the memory cells tend to be in an over-erased state under a current condition of the erasing voltage. In this case, it is possible to reduce a magnitude of the initial erasing voltage IVERA.

When the determination result in step S301 is "No", the process proceeds to step S302, after step S301.

<Step S302>

In step S302, the memory controller 100 decreases a DAC value of the voltage value IVERAoffset of the initial erasing voltage IVERA by a predetermined value "N5 (for example, 4)" based on the determination result in step S301.

The memory controller 100 updates the voltage information table TBL-ERA to reflect the determination result in step S301.

As illustrated in FIG. 24B, the memory controller 100 writes "−4" in an item of the voltage value IVERAoffset of the initial erasing voltage IVERA in the table TBL. Thus, the DAC value of the value IVERAoffset in the table TBL is changed from "00" to "−4".

Thus, the processes based on the result of the patrol operation on the write operation at the time t1 are ended.

After updating the table TBL based on the results of various processes in the write operation and the patrol operation at the time t1, the erase operation is executed by using the initial erasing voltage IVERA of the voltage value IVERAoffset corresponding to a DAC value of "−4", as the parameter of the table TBL in FIG. 24B. In this manner, the voltage value of the initial erasing voltage IVERA is reduced.

<Time t2>

At a time t2, the erase operation and the write operation (for example, a second erase operation and write operation) are executed by using the initial erasing voltage having the voltage value based on the table TBL in FIG. 24B. Thereafter, the first patrol operation after the erase operation and the write operation at the time t2 (for example, the first patrol operation after updating the table TBL at the time t1) is executed.

The processes in FIG. 22 are executed based on the calculation process and the detection result of the "ErtoA" cell in the patrol operation after the erase operation and the write operation at the time t2.

As illustrated in FIG. 23, the results of various processes in the patrol operation for the erase operation and the write operation at the time t2 are the same as the results of various processes in the patrol operation for the erase operation and the write operation at the time t1.

Therefore, the memory controller 100 executes the process in step S302, after steps S300 and S301. The memory controller 100 decreases the DAC value of the voltage value IVERAoffset in the table TBL by the value N5. As illustrated in FIG. 24C, the DAC value of the voltage value IVERAoffset is changed from "−4" to "−8".

In this manner, the memory controller 100 updates the table TBL based on the results of various processes in the patrol operation for the erase operation and the write operation at the time t2.

After updating the table TBL based on the results of various processes in the write operation and the patrol operation at the time t2, the erase operation is executed by using the initial erasing voltage IVERA of the voltage value IVERAoffset corresponding to a DAC value of "−8", as the parameter of the table TBL in FIG. 24C.

<Time t3>

At a time t3, the erase operation and the write operation (for example, a third erase operation and write operation) is executed by using the erasing voltage having the voltage value based on the table TBL in FIG. 24C. Thereafter, the first patrol operation after the erase operation and the write operation at the time t3 (for example, the first patrol operation after updating the table TBL at the time t2) is executed.

The processes in FIG. 22 are executed based on the calculation process and the detection result of the "ErtoA" cell in the patrol operation regarding the erase operation and the write operation at the time t3.

In the same manner as the processes during the patrol operation for the erase operation and the write operation at the time t2, the memory controller 100 decreases the DAC value of the voltage value IVERAoffset in the table TBL by the value N5. Thus, the DAC value of the voltage value IVERAoffset is changed from "−8" to "−12" as illustrated in FIG. 24D.

In this manner, the table TBL is updated based on the results of various processes in the patrol operation for the erase operation and the write operation at the time t3.

After updating the table TBL based on the results of various processes in the write operation and the patrol operation at the time t3, the erase operation is executed by using the initial erasing voltage IVERA of the voltage value IVERAoffset corresponding to a DAC value of "−12", as the parameter of the table TBL in FIG. 24D.

<Time t4>

At a time t4, the erase operation and the write operation (for example, a fourth erase operation and write operation) are executed by using the initial erasing voltage having the voltage value based on the table TBL in FIG. 24D. Thereafter, the first patrol operation after the erase operation and the write operation at the time t4 (for example, the first patrol operation after updating the table TBL at the time t3) is executed.

The processes in FIG. 22 are executed based on the results of various process in this patrol operation.

For example, as the detection result of the "ErtoA" cells in the patrol operation for the erase operation and the write operation at the time t4, the number of "ErtoA" cells becomes more than the reference value CE0, as illustrated in FIG. 23.

In this case, the process proceeds from step S301 to step S303.

<Step S303>

When the number of "ErtoA" cells is more than the reference value CE0 (Yes in step S301), the memory controller 100 updates the value of the down-counter in step S303. Thus, the down-counter value increases. The increase in the down-counter value indicates that the magnitude of the erasing voltage IVERA approaches a lower limit value.

For example, the down-counter value is incremented by the memory controller 100. As illustrated in FIG. 24E, the down-counter value increases from "0" to "1".

<Step S304>

In step S304, after increasing the down-counter value, the memory controller 100 determines whether or not the increased down-counter value is equal to or more than the reference value CE2.

At the time t4 in FIG. 23, the down-counter value is less than the reference value CE2. In this case, the process in FIG. 22 proceeds from step S304 to step S305.

<Step S305>

When the down-counter value is less than the reference value CE2 (No in step S304), the memory controller 100 decreases the DAC value of the voltage value IVERAoffset of the initial erasing voltage IVERA by a predetermined value "N6". For example, the value N6 is set to approximately half the value N5. In this example, the value N6 is set to "−2".

As illustrated in FIG. 24E, the DAC value of the voltage value IVERAoffset is changed from "−12" to "−14".

In this manner, the memory controller 100 updates the voltage information table TBL based on the results of various processes in the patrol operation for the erase operation and the write operation at the time t4.

After updating the table TBL based on the results of various processes in the write operation and the patrol operation at the time t4, the erase operation is executed by using the initial erasing voltage IVERA of the voltage value IVERAoffset corresponding to a DAC value of "−14", as the parameter of the table TBL in FIG. 24E.

<Time t5>

At a time t5, the erase operation and the write operation (for example, a fifth erase operation and write operation) are executed by using the initial erasing voltage having the voltage value based on the table TBL in FIG. 24E. Thereafter, the first patrol operation after the erase operation and the write operation at the time t5 (for example, the first patrol operation after updating the table TBL at the time t4) is executed.

The processes in FIG. 22 are executed based on the ECC process, the calculation process, and the detection result of the "ErtoA" cell in the patrol operation.

As the detection result of the "ErtoA" cells in the patrol operation for the erase operation and the write operation at the time t5, the number of "ErtoA" cells is more than the reference value CE0, as illustrated in FIG. 23. Therefore, the down-counter value is incremented. Thus, the down-counter value increases from "1" to "2" as illustrated in FIG. 24F.

After updating the down-counter value, in step S304, it is determined whether or not the updated down-counter value is equal to or more than the reference value CE2. At the time t5, the updated down-counter value is equal to or more than the reference value CE2 (here, “2”).

Therefore, the process in FIG. 22 proceeds from step S304 to step S306.

<Step S306>

That the updated down-counter value is equal to or more than the reference value CE2 in the determination result in step S304 indicates that the magnitude of the initial erasing voltage IVERA is too low, in relation to the current (at the time of the erase operation and the write operation at the time t5) characteristics of the memory cell. Therefore, when the erase operation is executed by using the initial erasing voltage IVERA having the current set value, the number of under-erased memory cells may be excessive.

Therefore, when the down-counter value is equal to or more than the reference value CE2 (Yes in step S304), in step S306, the memory controller 100 increases the DAC value of the voltage value IVERAoffset of the initial erasing voltage IVERA by a predetermined value “N7”. For example, an absolute value of the value N7 is more than an absolute value of the value N5. In the present embodiment, the value N7 is set to “6”.

As illustrated in FIG. 24F, the memory controller 100 increases the DAC value of the voltage value IVERAoffset from “−14” to “−8”. With this process, the DAC value of the voltage value IVERAoffset in the table TBL is changed.

In this manner, the memory controller 100 updates the table TBL based on the results of various processes in the patrol operation for the erase operation and the write operation at the time t5.

After updating the table TBL based on the results of various processes in the write operation and the patrol operation at the time t5, the erase operation is executed by using the initial erasing voltage IVERA of the voltage value IVERAoffset corresponding to a DAC value of “−8”, as the parameter of the table TBL in FIG. 24F. Thus, the voltage value of the initial erasing voltage IVERA is increased.

<Time t6>

At a time t6, the erase operation and the write operation (for example, a sixth erase operation and write operation) are executed by using the initial erasing voltage having the voltage value based on the table TBL in FIG. 24F. Thereafter, the first patrol operation after the erase operation and the write operation at the time t6 (for example, the first patrol operation after updating the table TBL at the time t5) is executed at a certain timing.

As described above, the down-counter value is equal to or more than the reference value CE2 (=2) in the results of various processes in the patrol operation for the erase operation and the write operation at the time t6. In the determination process in step S300, the process proceeds from step S300 to step S310.

<Step S310>

In step S310 in FIG. 22, the memory controller 100 determines whether or not the number of “ErtoA” cells in the attention area is more than the reference value CE0.

As illustrated in FIG. 23, in the erase operation and the write operation at the time t6, the number of “ErtoA” cells is less than the number of “ErtoA” cells in the erase operation and the write operation at the time t5, due to the use of the reduced initial erasing voltage IVERA. For example, the number of “ErtoA” cells at the time t6 is less than the reference value CE0.

When the determination result in step S310 is “No”, the memory controller 100 ends the processes in FIG. 22.

Therefore, as illustrated in FIG. 25A, each piece of information in the voltage information table TBL (for example, the DAC value of the initial erasing voltage) is maintained without being updated from the setting in the erase operation and the write operation at the time t5.

As a result, after the patrol operation for the erase operation and the write operation at the time t6, the erase operation is executed by using the voltage value IVERAoffset corresponding to the DAC value of “−8”, as the parameter of the table TBL in FIG. 25A.

<Time tp>

At a time tp, based on the table TBL in FIG. 24F. 24, the erase operation is executed by using the initial erasing voltage IVERA of the voltage value IVERAoffset corresponding to the DAC value of “−8”, and then the write operation is executed. Thereafter, the first patrol operation after the erase operation and the write operation is executed.

In the patrol operation for the erase operation and the write operation at the time tp, the down-counter value reaches the reference value CE2 as illustrated in FIG. 23 (No in step S300). In the erase operation and the write operation at the time tp, the number of “ErtoA” cells is more than the reference value CE0.

In this case (No in step S300 and Yes in step S310), the memory controller 100 executes the process in step S311 in FIG. 22.

<Step S311>

In step S311, the memory controller 100 updates the value of the up-counter. Thus, the up-counter value increases. For example, the up-counter value is incremented by the memory controller 100. As illustrated in FIG. 25B, the up-counter value increases from “0” to “1”.

<Step S312>

In step S312, after incrementing the up-counter value, the memory controller 100 determines whether or not the incremented up-counter value is equal to or more than a reference value CE1.

At the time tp, the up-counter value is less than the reference value CE1. In this case (No in step S112), the processes in FIG. 22 are ended, after step S312.

The parameter (the DAC value) of the voltage value IVERAoffset in the table TBL is maintained. Therefore, after the patrol operation for the erase operation and the write operation at the time tp, the erase operation is executed by using the initial erasing voltage IVERA of the voltage value IVERAoffset corresponding to the DAC value of “−8”, as the parameter of the table TBL in FIG. 25B.

<Time tp+1>

At a time tp+1, the erase operation and the write operation are executed by using the initial erasing voltage having the voltage value based on the voltage information table TBL in FIG. 25B. Thereafter, the first patrol operation after the erase operation and the write operation at the time tp+1 is executed at a certain timing.

As illustrated in FIG. 23, as a result of various processes in the first patrol operation after the erase operation and the write operation at the time tp+1, the down-counter value is equal to or more than the reference value CE2, and the number of “ErtoA” cells is less than the reference value CE0. Therefore, the memory controller 100 ends the processes in FIG. 22 through the determination processes in steps S300 and S310.

As a result, as illustrated in FIG. 25C, the DAC value of the initial erasing voltage IVERAoffset in the voltage information table TBL is maintained.

<Time tp+2>

At a time tp+2, the erase operation and the write operation are executed by using the initial erasing voltage having the voltage value based on the voltage information table TBL in FIG. 25C. Thereafter, the first patrol operation after the erase operation and the write operation is executed.

As illustrated in FIG. 23, in the patrol operation for the erase operation and the write operation at the time tp+2, the number of "ErtoA" cells is more than the reference value CE0.

Therefore, the memory controller 100 updates the up-counter value after the processes in steps S300 and S310.

Thus, the up-counter value is incremented from "1" to "2" as illustrated in FIG. 25D.

In step S312, the incremented up-counter value is less than the reference value CE1 (here, "3").

Therefore, the memory controller 100 ends the processes in FIG. 22.

After updating the voltage information table TBL, the DAC value of the initial erasing voltage IVERAoffset in the table TBL is maintained as illustrated in FIG. 25D. After the patrol operation for the erase operation and the write operation at the time tp+2, the erase operation is executed by using the initial erasing voltage IVERA of the voltage value IVERAoffset corresponding to the DAC value of "−8", as the parameter of the table TBL in FIG. 25D.

<Time tp+3>

At a time tp+3, the erase operation and the write operation (for example, a sixth erase operation and write operation) are executed using the initial erasing voltage having the voltage value based on the voltage information table TBL in FIG. 25D. Thereafter, the first patrol operation after the erase operation and the write operation at the time tp+3 is executed.

As illustrated in FIG. 23, the number of "ErtoA" cells in the erase operation and the write operation at the time tp+3 is more than the reference value CE0.

Therefore, the memory controller 100 increments the up-counter value in step S311 in FIG. 22, after the determination processes in steps S300 and S310. Thus, the up-counter value increases from "2" to "3" as illustrated in FIG. 25E.

In step S312, the memory controller 100 determines whether or not the current up-counter value is equal to or more than the reference value CE1. Here, as the result of the erase operation and the write operation at the time tp+3, the up-counter value set to "3" is equal to or more than the reference value CE1 (here, "3").

In this case (Yes in step S312), the memory controller 100 executes the process in step S313.

When the up-counter value is equal to or more than the reference value CE1, this indicates that the voltage value of the initial erasing voltage IVERA is insufficient in relation to the characteristics of the memory cell at the time tp+3.

<Step S313>

In step S313, when the up-counter value is equal to or more than the reference value CE1, the memory controller 100 increases the DAC value of the voltage value IVERAoffset of the initial erasing voltage IVERA by a predetermined value "N8". For example, the value N8 is equal to or less than the value N7. In the present embodiment, the value N8 is set to "1".

As illustrated in FIG. 25E, the memory controller 100 increases the DAC value of the voltage value IVERAoffset from "−8" to "−7". In this manner, the DAC value of the voltage value IVERAoffset in the table TBL is changed.

The up-counter value may be reset to "0" after the DAC value of the voltage value IVERAoffset is changed in step S313.

In this manner, the memory controller 100 updates the voltage information table TBL based on the results of various processes in the first patrol operation after the erase operation and the write operation at the time tp+3.

As a result, after the patrol operation (and the setting process on the erasing voltage) for the erase operation and the write operation at the time tp+3, the erase operation is executed as illustrated in the parameter of the voltage information table TBL in FIG. 25E, by using the initial erasing voltage IVERA of the voltage value IVERAoffset corresponding to the DAC value of "−7". Thus, the voltage value of the initial erasing voltage IVERA is increased.

Thereafter, substantially the same processes as the processes in FIGS. 22 to 25E are executed with the progression in use of the memory system.

Figure 26:
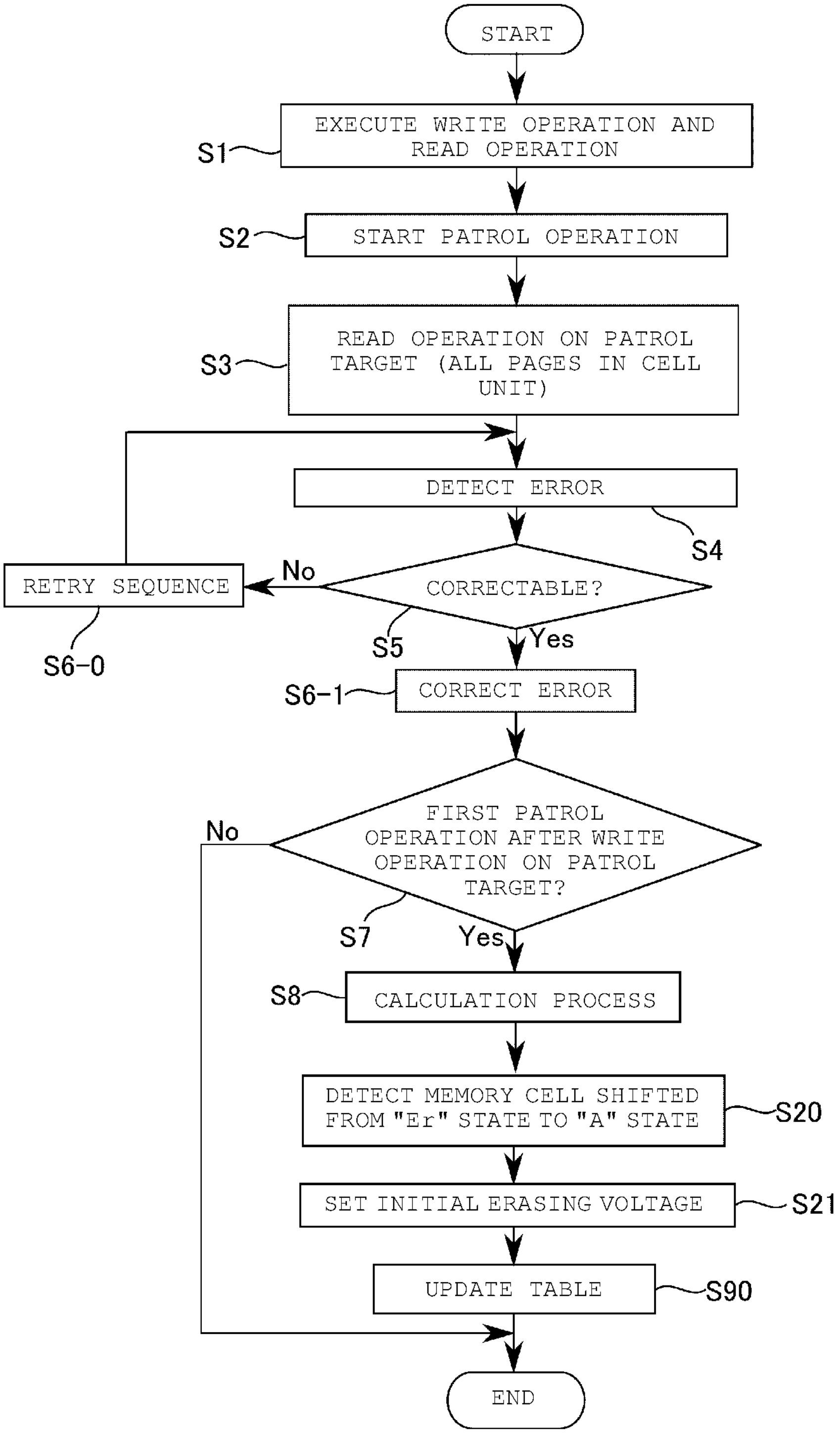
FIG. 26 is a flowchart of an operation of a memory system according to a second embodiment.

FIG. 26 is a flowchart illustrating a modification example of a method of setting an erasing voltage of the memory system according to the present embodiment.

As illustrated in FIG. 26, only a setting (optimization) of an erasing voltage (for example, an initial erasing voltage) may be executed based on a result of various processes in a patrol operation without a setting process on at least one of an initial program voltage and a step-up voltage.

With the memory system according to the present embodiment, the patrol operation includes the calculation process based on the result of the ECC process (step S8), the detection process on the memory cells (step S9, steps S12-1 to S12-5, and S20), setting of the initial erasing voltage (S21), and updating of the voltage information table (step S90), in addition to the read operation and the ECC process on a certain memory space. The processes in steps S8 to S90 may be handled as an operation (a sequence) different from the patrol operation.

As described above, the memory system according to the present embodiment can optimize the voltage value of the erasing voltage based on the results of various processes in the patrol operation.

Therefore, the memory system of the present embodiment has high performance.

(3) Third Embodiment

A memory system and a control method of the memory system according to a third embodiment will be described with reference to FIGS. 27A to 30.

The above embodiment illustrates an example in which a batch write operation is executed on data corresponding to the A state, data corresponding to the B state, . . . data corresponding to the F state, and data corresponding to the G state (a full sequence method).

The write operation used in the NAND flash memory is not limited to the full sequence method.

For example, a write operation by a Foggy-Fine method may be used for the write operation of the NAND flash memory.

Figure 27A:
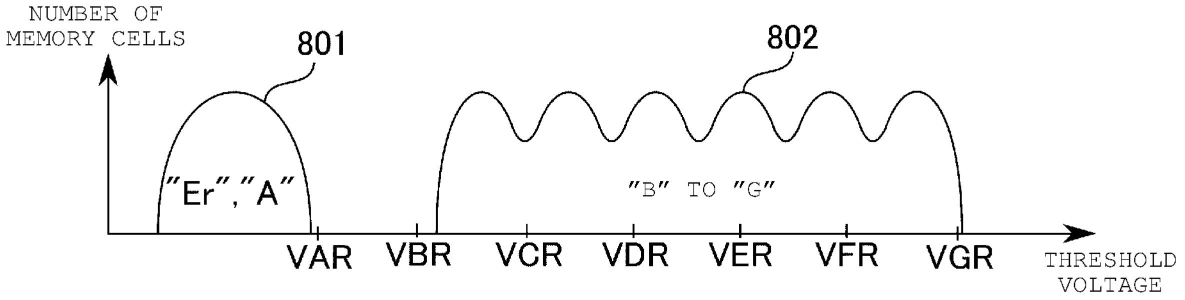
FIGS. 27A, 27B, and 27C are diagrams illustrating aspects of a memory system according to a third embodiment.
Figure 27B:
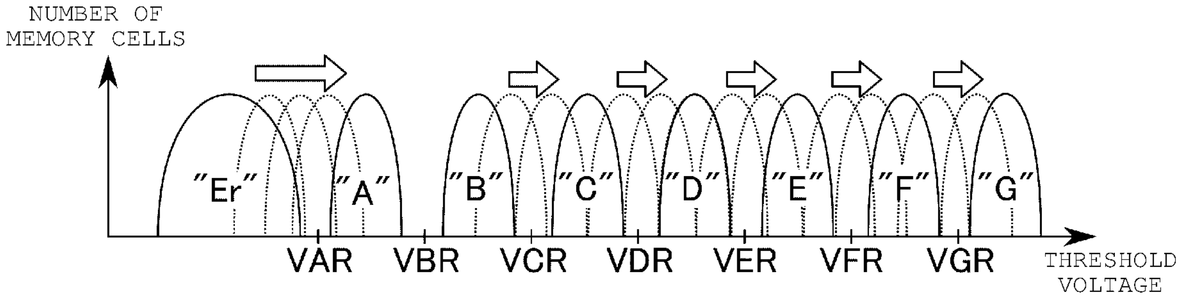
Figure 27C:
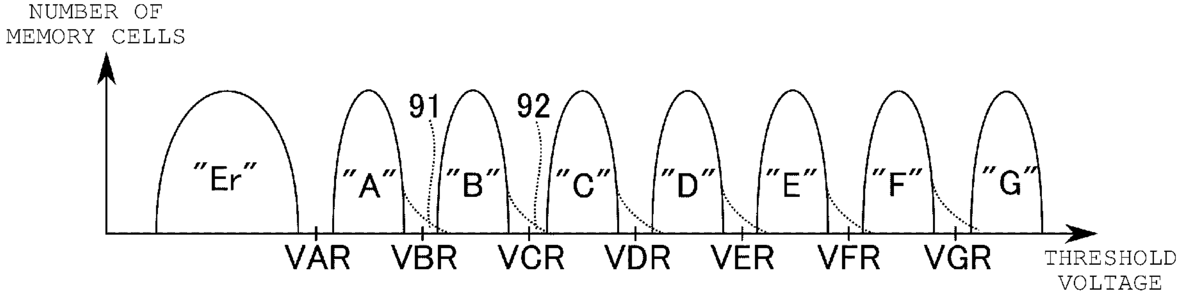

FIGS. 27A, 27B, and 27C are schematic diagrams illustrating aspects of a write operation by a Foggy-Fine method.

In the write operation by the Foggy-Fine method, a Foggy program and a Fine program are executed. In the following, a stage in which the Foggy program is executed is called as a Foggy stage, and a stage in which the Fine program is executed is called as a Fine stage.

As illustrated in FIG. 27A, in the Foggy program (the Foggy stage), two independent threshold voltage distributions 801 and 802 are formed by applying a program voltage to memory cells in the "Er" state.

For example, the distribution 801 is a distribution including memory cells in the "Er" state and memory cells to which data corresponding to the "A" state is written.

The distribution 802 is a distribution including memory cells to which data corresponding to the "B" state to the "G" state are written.

As illustrated in FIG. 27B, in the Fine program (the Fine stage), data writing (application of a program voltage) is executed so as to correspond to each of the eight states. For example, in the same manner as the example in FIG. 8, a program operation from the lower state to the upper state is executed while a step-up voltage is subsequently added to an initial program voltage.

In the write operation by the Foggy-Fine method, a distribution of the "A" state is formed from the distribution 801, and distributions of the "B" state, the "C" state, the "D" state, the "E" state, the "F" state, and the "G" state are formed from the distribution 802.

Thus, a threshold voltage of the memory cell reaches a voltage value corresponding to the data to be written.

As described above, the write operation by the Foggy-Fine method is a program method in which writing of data is performed in two stages so that the threshold voltage of the memory cell is shifted from a rough program state to a program state corresponding to the data.

FIG. 27C is a schematic diagram illustrating fluctuation of a threshold voltage to be taken into consideration when setting a voltage used for a write operation.

With the write operation by the Foggy-Fine method, in the Fine stage of the write operation, from the distribution 801 to the "A" state and from the distribution 802 to the "B", "C", "D", "F", and "G" state, the threshold voltages of the memory cell are increased by applying the program voltage. In first several write loops from start in the Fine stage, the voltage value of the program voltage depends on a magnitude of the initial program voltage since the addition amount of the step-up voltage is small.

In this write method, a magnitude of the initial program voltage IVPGM (hereinafter, also referred to as "IVPGMb") in the Fine stage is preferably set according to an occurrence number 91 which is the number of memory cells (the "AtoB" cells) having a threshold voltage changed from a value (a voltage value) corresponding to the "A" state to a value corresponding to the "B" state.

In addition, a magnitude of the initial program voltage IVPGM (hereinafter, also referred to as "IVPGMa") in the Foggy stage is preferably set according to an occurrence number 92 which is the number of memory cells (the "BtoC" cells) having a threshold voltage changed from a value corresponding to the "B" state to a value corresponding to the "C" state.

In the write operation by the Foggy-Fine method, a voltage value of the step-up voltage is preferably set according to the number of "CtoD" cells, "DtoE" cells, "EtoF" cells, and "FtoG" cells.

(3a) Operation Example

An operation example of the memory system according to the present embodiment will be described with reference to FIG. 28.

Figure 28:
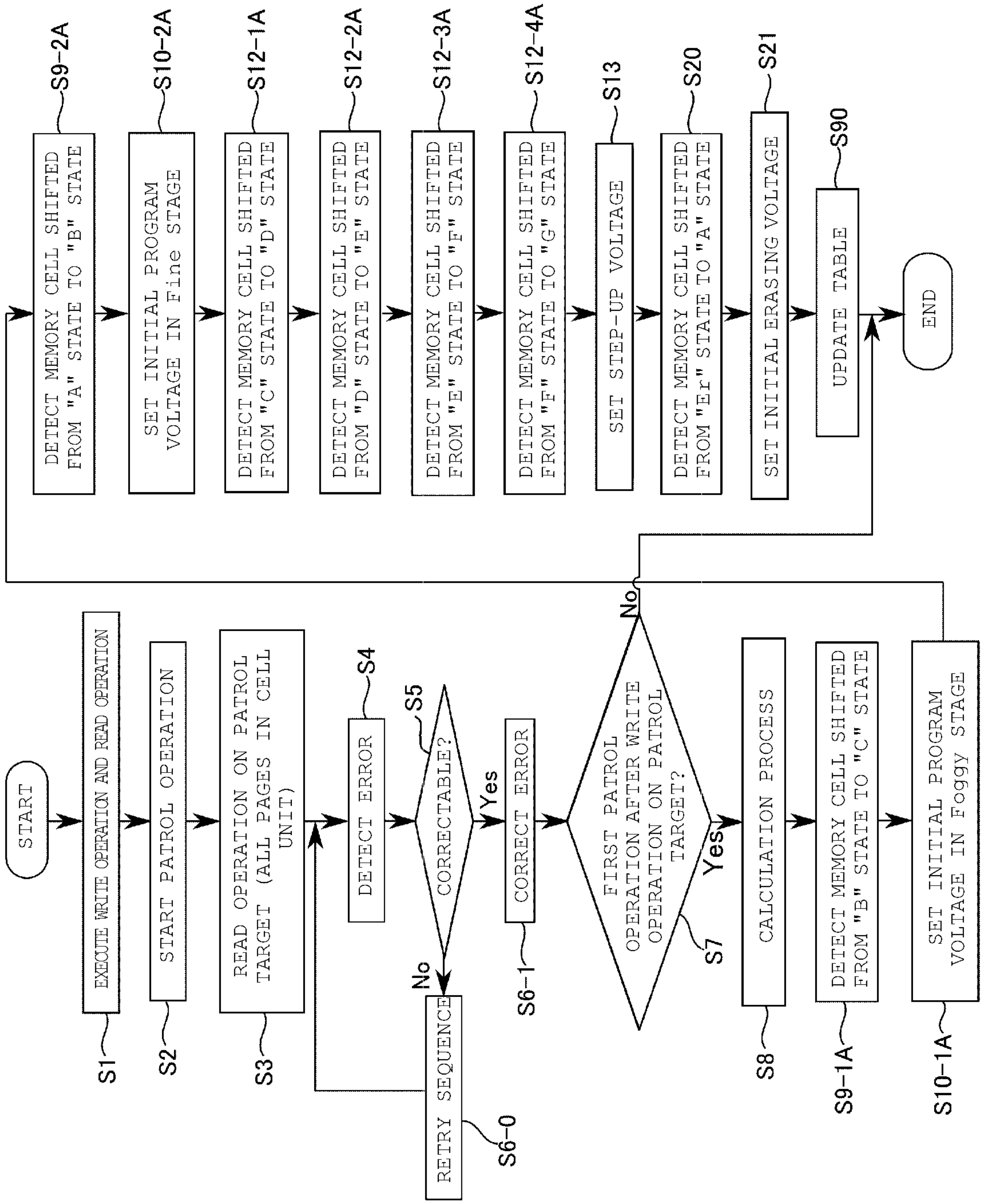
FIG. 28 is a flowchart of an operation of a memory system according to a third embodiment.

FIG. 28 is a flowchart illustrating a setting process on an initial program voltage used in the write operation by the Foggy-Fine method in the present embodiment.

<Steps S1 to S8>

As illustrated in FIG. 28, in the same manner as the above-described embodiment, after use of the memory system is started, the write operation by the Foggy-Fine method is executed in a selected area in the NAND flash memory 10 by using a default program voltage (step S1).

After a certain period of time, the memory controller 100 executes a patrol operation (step S2). For example, data of all pages (for example, all pages of a string unit) belonging to a target of the patrol operation is read (step S3).

The ECC process is executed on the read data of all pages (steps S4, S5, and S6). Thus, corrected read data is generated.

The memory controller 100 determines whether or not the patrol operation being executed is a first patrol operation after the write operation (step S7).

When the patrol operation being executed is the first patrol operation after the write operation, the calculation process is executed by using read data before correction and the read data after correction (step S8). Thus, the bit shift table TBLz is created.

<Step S9-1A>

In step S9-1A, in the present embodiment, the memory controller 100 detects a memory cell (the "BtoC" cell) shifted from the "B" state to the "C" state by using the bit shift table TBLz. For example, the memory controller 100 counts the number of "BtoC" cells.

<Step S10-1A>

In step S10-1A, the memory controller 100 uses a detection result obtained in step S9-1A to execute a setting process on a voltage value of the initial program voltage IVPGMa in the Foggy stage (the Foggy program) in the write operation by the Foggy-Fine method (for example, the optimization process on the voltage value).

The memory controller 100 acquires the voltage value of the initial program voltage IVPGMa in the Foggy stage based on the detection result (for example, the number of counts) obtained by the process in step S9-1A.

In the write operation by the Foggy-Fine method, the value of the initial program voltage IVPGMa in the Foggy stage acts on a threshold voltage of a memory cell to which data in the "B" state is written. Therefore, in the memory system of the present embodiment, regarding the initial program voltage IVPGMa in the Foggy stage, it is possible to set a more approximate voltage value to the initial program voltage IVPGMa based on the calculation process focusing on the degree of error in shifting from the "B" state to the "C" state (for example, the number of "BtoC" cells) in step S9-1A.

Thus, the voltage value of the initial program voltage IVPGMa in the Foggy stage in the write operation by the Foggy-Fine method is set to a more appropriate value.

<Step S9-2A>

In step S9-2A, in the present embodiment, the memory controller 100 detects a memory cell (the "AtoB" cell) shifted from the "A" state to the "B" state by using the bit shift table TBLz. For example, the memory controller 100 counts the number of "AtoB" cells.

<Step S10-2A>

In step S10-2A, the memory controller 100 uses a detection result obtained in step S9-2A to execute a setting process on a voltage value of the initial program voltage IVPGMb in the Fine stage (the Fine program) in the write operation by the Foggy-Fine method (for example, the optimization process on the voltage value).

The memory controller 100 acquires the voltage value of the initial program voltage IVPGMb in the Foggy stage based on the detection result (for example, the number of counts) obtained by the process in step S9-2A.

In the write operation by the Foggy-Fine method, the value of the initial program voltage IVPGMb in the Fine stage acts on a threshold voltage of a memory cell to which data in the "A" state is written. Therefore, in the memory system of the present embodiment, it is possible to set a more approximate voltage value to the initial program voltage IVPGMb in the Fine stage based on the calculation process focusing on the degree of error in shifting from the "A" state to the "B" state (for example, the number of "AtoB" cells) in step S9-2A.

Thus, the voltage value of the initial program voltage IVPGMb in the Fine stage in the write operation by the Foggy-Fine method is set to a more appropriate value.

For example, in the present embodiment, a setting process on the step-up voltage is executed subsequent to the setting process on the initial program voltage.

<Step S12-1A>

In step S12-1A, the memory controller 100 detects a memory cell (the "CtoD" cell) shifted from the "C" state to the "D" state by using the bit shift table TBLz. For example, the memory controller 100 counts the number of "CtoD" cells.

<Step S12-2A>

In step S12-1A, the memory controller 100 detects a memory cell (the "DtoE" cell) shifted from the "D" state to the "E" state by using the bit shift table TBLz. For example, the memory controller 100 counts the number of "DtoE" cells.

<Step S12-3A>

In step S12-3A, the memory controller 100 detects a memory cell (the "EtoF" cell) shifted from the "E" state to the "F" state by using the bit shift table TBLz. For example, the memory controller 100 counts the number of "EtoF" cells.

<Step S12-4A>

In step S12-4A, the memory controller 100 detects a memory cell (the "FtoG" cell) shifted from the "F" state to the "G" state by using the bit shift table TBLz. For example, the memory controller 100 counts the number of "FtoG" cells.

<Step S13>

In step S13, the memory controller 100 executes the setting process on the step-up voltage.

The memory controller 100 acquires a voltage value of the step-up voltage dVPGM based on a detection result (for example, the number of counts) obtained by the processes from step S12-1A to step S12-4A.

For example, when a total of the number of "CtoD" cells, the number of "DtoE" cells, the number of "EtoF" cells, and the number of "FtoG" cells is less than a certain reference value, the memory controller 100 sets information (for example, a DAC value) so as to maintain or increase the voltage value of the step-up voltage dVPGM. For example, when the total of the numbers of "CtoD" cells to "FtoG" cells is equal to or more than the certain reference value, the memory controller 100 sets the information (the DAC value) so as to decrease the voltage value of the step-up voltage dVPGM.

Thus, the step-up voltage dVPGM used in the write operation by the Foggy-Fine method is set to a more appropriate voltage value.

With the memory system in which the write operation by the Foggy-Fine method is executed, the voltage used as the erasing voltage may be determined based on the result of the read operation and the result of the ECC process, in the same manner as in the memory system in which the write operation by the full sequence method is executed.

As illustrated in steps S20 and S21 in FIG. 28, after the setting process on the voltage value of the step-up voltage dVPGM in step S13, the setting process of the voltage used for the erase operation (for example, the optimization process of the initial erasing voltage IVERA) is executed.

In steps S20 and S21, the memory controller 100 determines a voltage value of the initial erasing voltage IVERA based on a detection result of the "ErtoA" cells (the number of "ErtoA" cells).

Thereafter, in step S90, the memory controller 100 updates the values in the voltage information table TBL regarding the voltage value of the initial erasing voltage IVERA, along with the voltage value of the initial program voltage IVPGM and the voltage value of the step-up voltage dVPGM.

As described above, in the memory system according to the present embodiment, various voltages used for the write operation and the erase operation are set to more appropriate values.

A modification example of the flash memory according to the present embodiment will be described with reference to FIGS. 29 and 30.

The initial program voltages IVPGMa and IVPGMb and the step-up voltage dVPGM of the write operation by the Foggy-Fine method may be determined by different processes.

Figure 29:
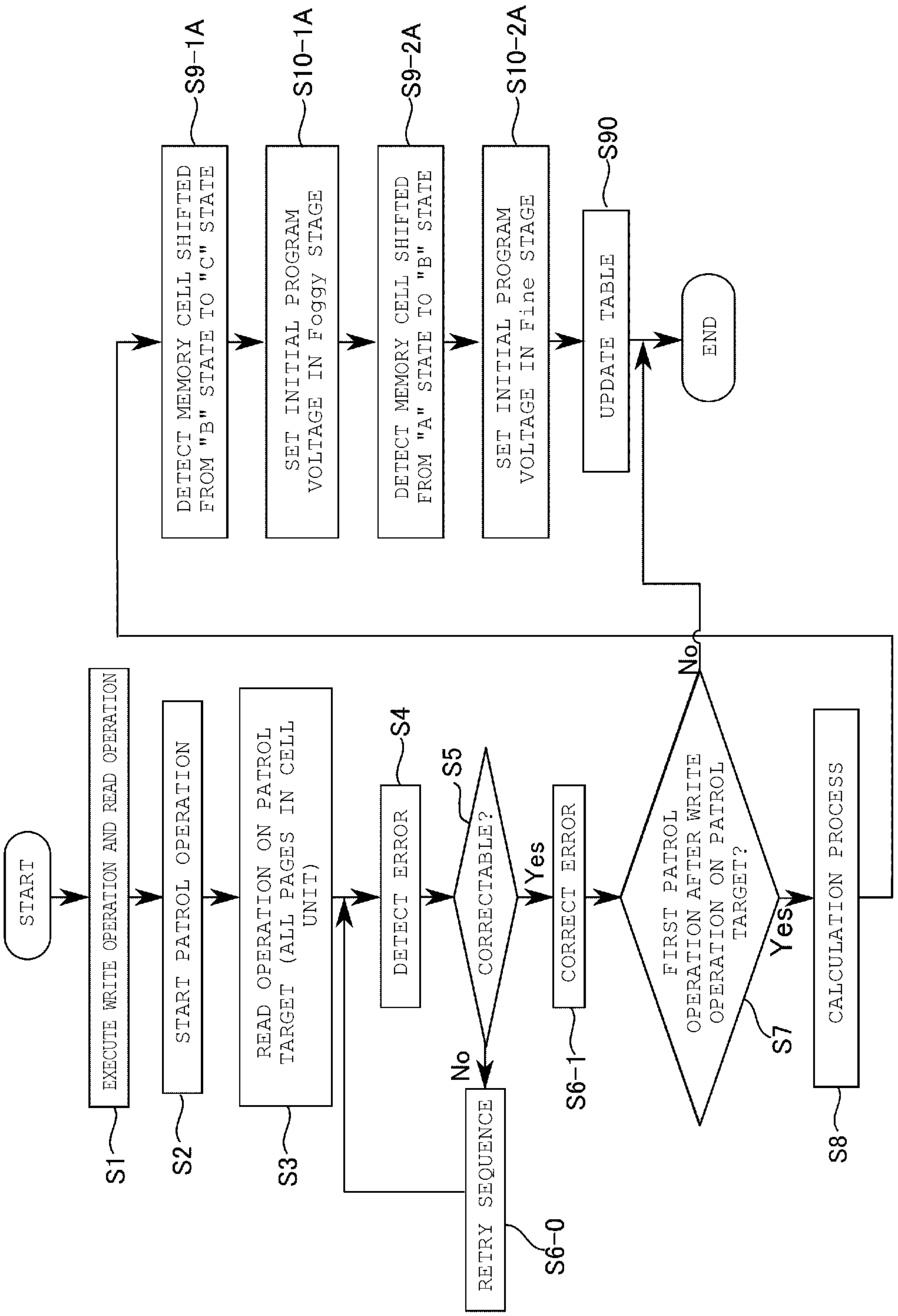
FIG. 29 is a flowchart of an operation of a memory system according to a third embodiment.

FIG. 29 is a flowchart illustrating a setting process on an initial program voltage used in the write operation by the Foggy-Fine method in the present embodiment.

The process flow in FIG. 29 illustrates a process flow of executing only the setting process on the initial program voltage without executing the setting process on the step-up voltage during a first patrol operation after the write operation by the Foggy-Fine method.

As illustrated in FIG. 29, a calculation process is executed based on a result of a read operation and a result of an ECC process in a patrol operation (step S8). Based on a detection result (the number of counted memory cells) of the "BtoC" cells and the "AtoB" cells, voltage values of the initial program voltage IVPGMa in the Foggy stage and the initial program voltage IVPGMb in the Fine stage are respectively set (step S9-1A, S9-2A, S10-1A, and S10-2A). Values of the voltage information table TBL are updated to a value in accordance with each of the set initial program voltages IVPGMa and IVPGMb (step S90).

Thus, the voltage value of the initial program voltage IVPGM is set to a more appropriate value.

Figure 30:
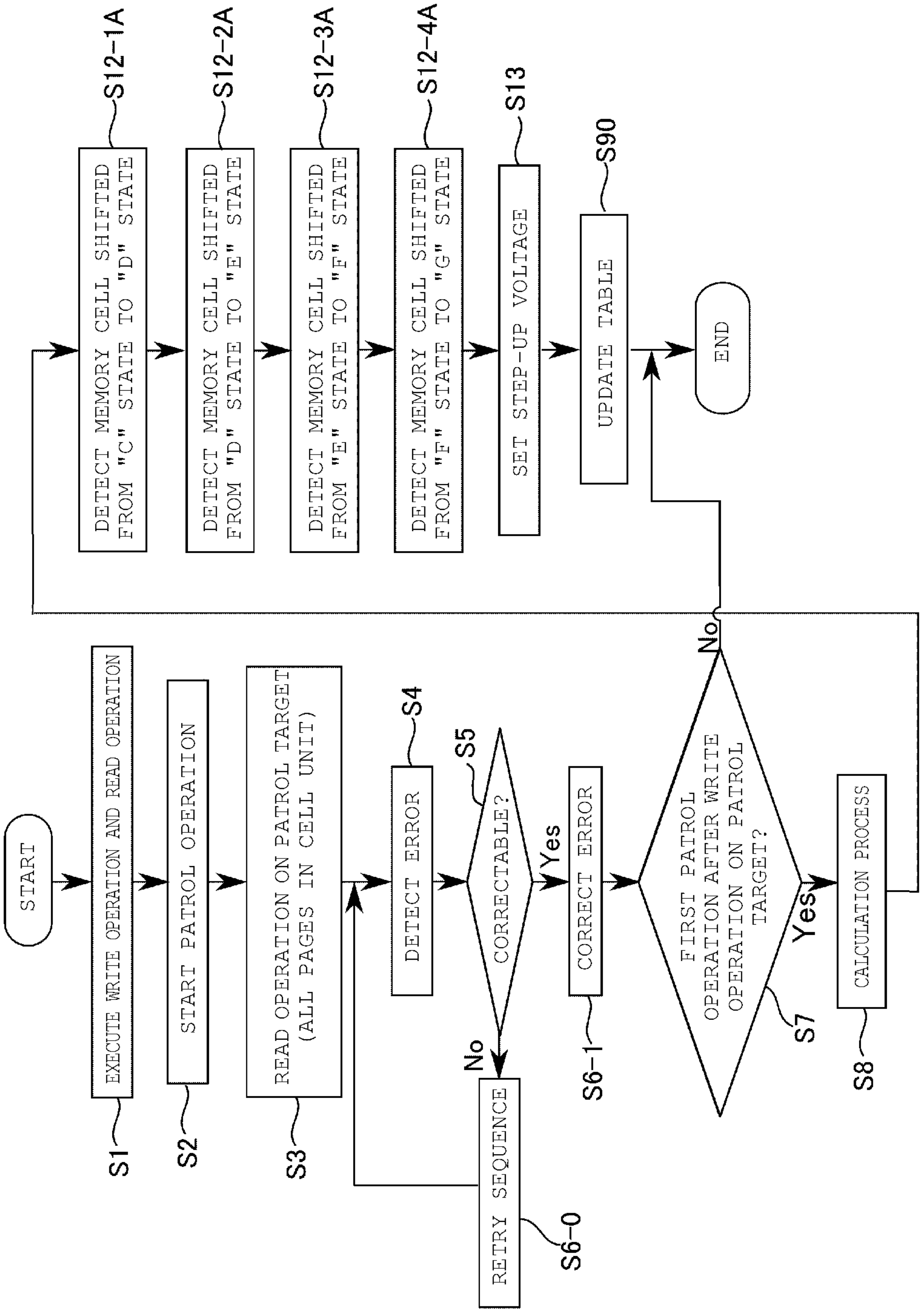
FIG. 30 is a flowchart of an operation of a memory system according to a third embodiment.

FIG. 30 is a flowchart illustrating a setting of an initial value of a step-up voltage in a NAND flash memory using the write operation by the Foggy-Fine method in the present embodiment.

The process flow in FIG. 30 illustrates a process flow of executing only a setting process on the step-up voltage without executing the setting process on the initial program voltage during a first patrol operation after the write operation by the Foggy-Fine method.

As illustrated in FIG. 30, after the calculation process in step S8, the "CtoD" cells, the "DtoE" cells, the "EtoF" cells, and the "FtoG" cells are detected (steps S12-1A to S12-4A).

The voltage value of the step-up voltage dVPGM is set based on a detection result (the number of counted memory cells) of the "CtoD" cell, the "DtoE" cell, the "EtoF" cell, and the "FtoG" cell (step S13). The values of the voltage information table TBL are updated to the values in accordance with the set step-up voltage dVPGM (step S90).

Thus, the voltage value of the step-up voltage dVPGM is set to a more appropriate value.

In the present embodiment, with the NAND flash memory using the write operation by the Foggy-Fine method, the initial program voltages IVPGMa and IVPGMb and the step-up voltage dVPGM may be executed with substantially the same operation as the above-described processes in FIGS. 12 and 17.

The setting of the initial value of the erasing voltage in the NAND flash memory using the write operation by the Foggy-Fine method may be executed without the setting process on the initial program voltages IVPGMa and IVPGMb and the step-up voltage dVPGM.

With the memory system according to the present embodiment, the patrol operation includes the calculation process based on the result of the ECC process (step S8), the detection process (steps S9-1A, S9-2A, and S12-1A to S12-4A), setting of various voltages (steps S10-1A, S10-2A, S13, and S21), and updating of the voltage information table (step S90), in addition to the read operation and the ECC process on a certain memory space. The processes in steps S8 to S90 may be handled as an operation (a sequence) different from the patrol operation.

As described above, the memory system according to the third embodiment can obtain substantially the same effects as the memory systems according to the embodiments already described above.

(4) Fourth Embodiment

A memory system and a control method of the memory system according to a fourth embodiment will be described with reference to FIGS. 31A to 34.

In the fourth embodiment, a write operation by an LM-Fine method is used for a write operation on a NAND flash memory.

The write operation by the LM-Fine method is a program method in which data is written in two stages, in the same manner as the write operation by the Foggy-Fine method.

Figure 31A:
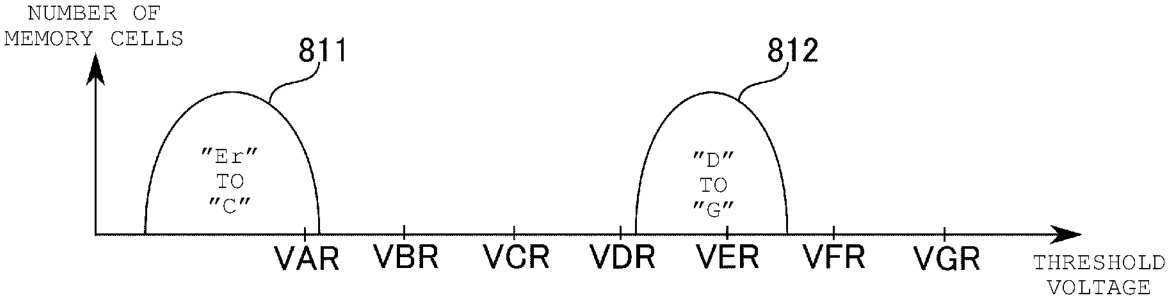
FIGS. 31A, 31B, and 31C are diagrams illustrating aspects of a memory system according to a fourth embodiment.
Figure 31B:
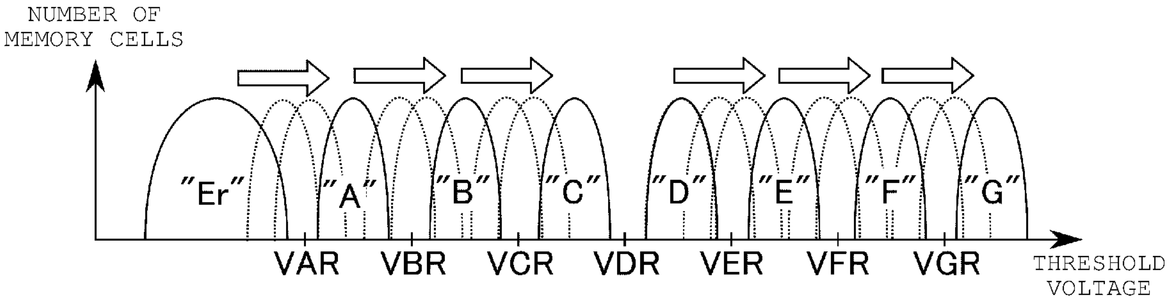
Figure 31C:
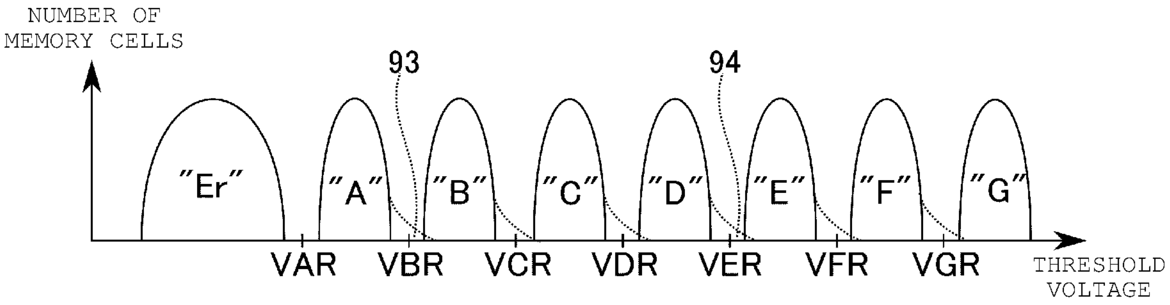

FIGS. 31A to 31C are schematic diagrams illustrating the write operation by the LM-Fine method.

In the write operation by the LM-Fine method, an LM program and a Fine program are executed. In the following, a stage in which the LM program is executed is called as a LM stage, and a stage in which the Fine program is executed is called as a Fine stage.

As illustrated in FIG. 31A, in the LM program (the LM stage), two independent threshold voltage distributions 811 and 812 are formed by applying a program voltage to a memory cell in the "Er" state.

For example, the distribution 811 is a distribution including memory cells to which pieces of data respectively corresponding to the "Er" state to the "C" state are written.

The distribution 812 is a distribution including memory cells to which pieces of data respectively corresponding to the "D" state to the "G" state are written.

As illustrated in FIG. 31B, in the Fine program (Fine stage), data writing (application of the program voltage) is executed so as to correspond to each of the eight states. For example, in the same manner as the example in FIG. 8, a program operation from the lower state to the upper state is executed while a step-up voltage is subsequently added to an initial program voltage.

In the write operation by the LM-Fine method, in the Fine program, a distribution of each of the "Er" state, the "A" state, the "B" state, and the "C" state is formed from the distribution 811, and a distribution of each of the "D" state, the "E" state, the "F" state, and the "G" state is formed from the distribution 812.

Thus, a threshold voltage of the memory cell reaches a voltage value corresponding to the data to be written.

FIG. 31C is a schematic diagram illustrating fluctuation of a threshold voltage to be taken into consideration when setting a voltage used for a write operation.

With the write operation by the LM-Fine method, in the Fine stage of the write operation, from the distribution 811 to the "A", "B", and "C" states and from the distribution 812 to the "E", "F", and "G" states, the threshold voltages of the memory cell are increased by applying the program voltage. In first several write loops from start in the Fine stage, the voltage value of the program voltage depends on a magnitude of the initial program voltage since the addition amount of the step-up voltage is small.

Therefore, in this write method, a magnitude of the initial program voltage IVPGM (hereinafter, also referred to as "IVPGMd") in the Fine stage (the Fine program) is preferably set according to an occurrence number 93 which is the number of memory cells (the "AtoB" cells) having a threshold voltage changed from a value (a voltage value) corresponding to the "A" state to a value corresponding to the "B" state.

Further, a magnitude of the initial program voltage IVPGM (hereinafter, also referred to as "IVPGMc") in the LM stage (the LM program) is preferably set, according to an occurrence number 94 which is the number of memory cells (the "DtoE" cells) having a threshold voltage changed from a value corresponding to the "D" state to a value corresponding to the "E" state.

In the write operation by the LM-Fine method, a voltage value of the step-up voltage dVPGM is preferably set, according to the number of occurrences of the "BtoC" cell, the "CtoD" cell, the "EtoF" cell, and the "FtoG" cell.

(4a) Operation Example

An operation example of the memory system according to the fourth embodiment will be described with reference to FIG. 32.

<Steps S1 to S8>

Figure 32:
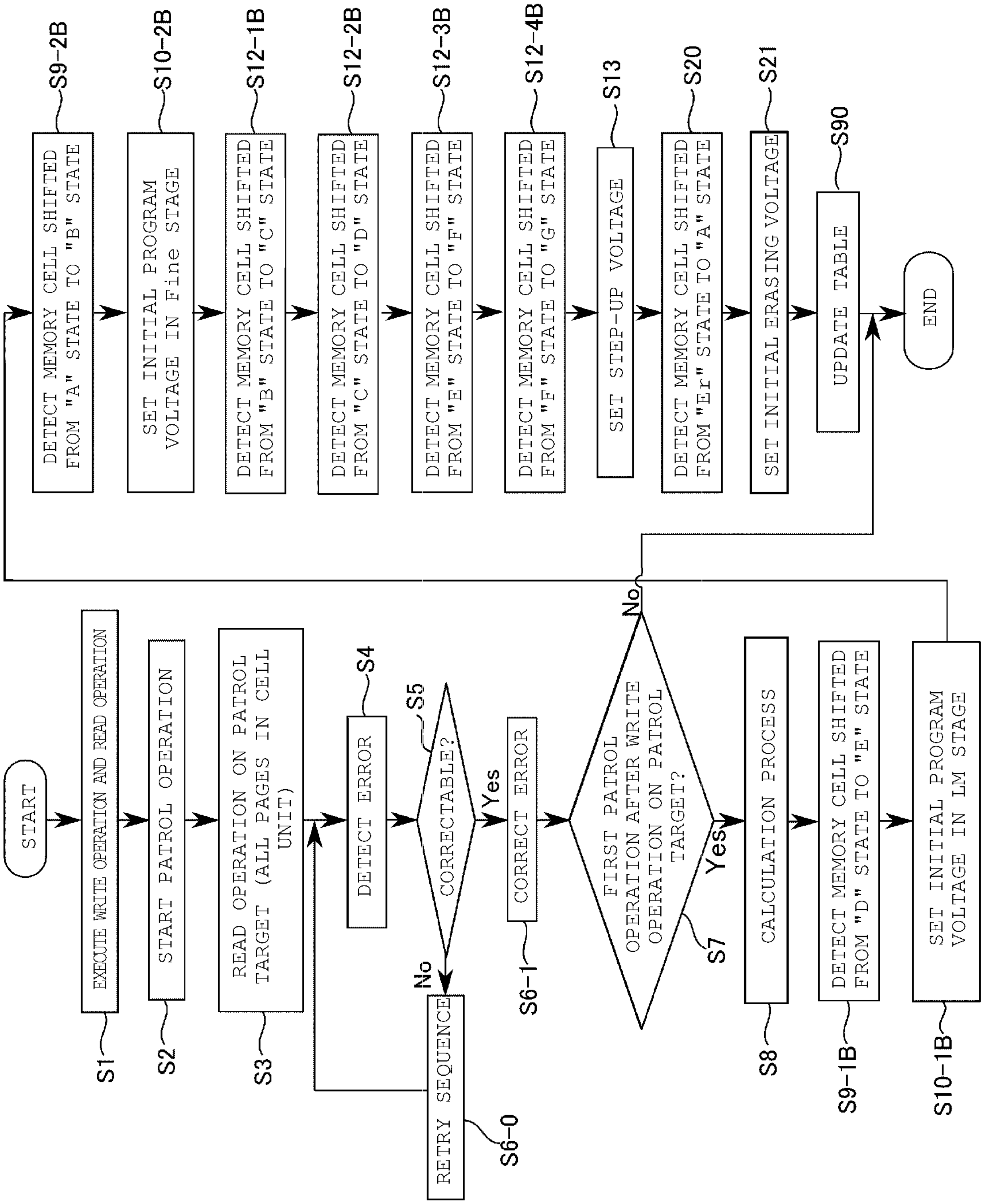
FIG. 32 is a flowchart of an operation of a memory system according to a fourth embodiment.

As illustrated in FIG. 32, in the same manner as the above-described embodiment, after use of the memory system is started, the write operation by the LM-Fine method is executed on a selected area in the NAND flash memory 10 by using a default program voltage (step S1).

After a certain period, the memory controller 100 executes a patrol operation (step S2). Data reading is executed on all pages (for example, all pages in a string unit) belonging to a target of the patrol operation (step S3).

The ECC process is executed on the read data of all pages (steps S4, S5, and S6). Thus, read data after error correction is generated.

The memory controller 100 determines whether or not the patrol operation being executed is a first patrol operation after the write operation (step S7).

When the patrol operation being executed is the first patrol operation after the write operation, the calculation process is executed by using read data before correction and the read data after correction (step S8). Thus, the bit shift table TBLz is created.

<Step S9-1B>

In step S9-1B, the memory controller 100 detects a memory cell (the "DtoE" cell) shifted from the "D" state to the "E" state, by using the bit shift table TBLz. For example, the memory controller 100 counts the number of "DtoE" cells.

<Step S10-1B>

In step S10-1B, the memory controller 100 uses a detection result obtained in step S9-1B to execute a setting process on a voltage value of the initial program voltage IVPGMc in the LM stage (the LM program) in the write operation by the LM-Fine method (for example, the optimization process on the voltage value).

The memory controller 100 acquires the voltage value of the initial program voltage IVPGMc in the LM stage based on the detection result (for example, the number of counts) obtained by the process in step S9-1B.

In the write operation by the LM-Fine method, the voltage value of the initial program voltage IVPGMc in the LM stage acts on a threshold voltage of the memory cell to which data corresponding to the "D" state is written. Therefore, it is possible to set a more appropriate voltage value to the initial program voltage IVPGMc based on the calculation process focusing on the degree of error (the number of "DtoE" cells) in shifting from the "D" state to the "E" state in step S9-1B.

Thus, the voltage value of the initial program voltage IVPGMc in the LM stage used for the write operation by the LM-Fine method is set to a more appropriate value.

<Step S9-2B>

In step S9-2B, in the present embodiment, the memory controller 100 detects a memory cell (the "AtoB" cell) shifted from the "A" state to the "B" state by using the bit shift table TBLz. For example, the memory controller 100 counts the number of "AtoB" cells.

<Step S10-2B>

In step S10-2B, the memory controller 100 uses a detection result obtained in step S9-2B to execute a setting process on a voltage value of the initial program voltage IVPGMd in the Fine stage (the Fine program) in the write operation by the LM-Fine method (for example, the optimization process on the voltage value).

The memory controller 100 acquires the voltage value of the initial program voltage IVPGMd based on the detection result (for example, the number of counts) obtained by the process in step S9-2B.

In the write operation by the LM-Fine method, the voltage value of the initial program voltage IVPGMd in the Fine stage acts on a threshold voltage of the memory cell to which data corresponding to the "A" state is written. Therefore, it is possible to set a more appropriate voltage value to the initial program voltage IVPGMd based on the calculation process focusing on the degree of error (the number of "AtoB" cells) in shifting from the "A" state to the "B" state in step S9-2B.

Thus, the voltage value of the initial program voltage IVPGMd in the Fine stage used for the write operation by the LM-Fine method is set to a more appropriate value.

For example, a setting process on the step-up voltage is executed subsequent to the setting process on the initial program voltage.

<Step S12-1B>

In step S12-1B, the memory controller 100 detects the "BtoC" cell by using the bit shift table TBLz. For example, the memory controller 100 counts the number of "BtoC" cells.

<Step S12-2B>

In step S12-2B, the memory controller 100 detects the "CtoD" cell by using the bit shift table TBLz. For example, the memory controller 100 counts the number of "CtoD" cells.

<Step S12-3B>

In step S12-3B, the memory controller 100 detects the "EtoF" cell by using the bit shift table TBLz. For example, the memory controller 100 counts the number of "EtoF" cells.

<Step S12-4B>

In step S12-4B, the memory controller 100 detects the "FtoG" cell by using the bit shift table TBLz. For example, the memory controller 100 counts the number of "FtoG" cells.

<Step S13>

In step S13, the memory controller 100 executes the setting process on the step-up voltage.

The memory controller 100 acquires a voltage value of the step-up voltage dVPGM based on a detection result (for example, the number of counts) obtained by the processes from step S12-1B to step S12-4B.

Thus, the step-up voltage dVPGM used in the write operation by the LM-Fine method is set to a more appropriate voltage value.

With the memory system including the NAND flash memory which executes the write operation by the LM-Fine method, the voltage used as the erasing voltage may be determined based on the result of the read operation and the result of the ECC process, in the same manner as in the above embodiments.

As illustrated in steps S20 and S21 in FIG. 32, after the setting process on the voltage value of the step-up voltage dVPGM in step S13, the setting process of the voltage used for the erase operation (for example, the optimization process of the initial erasing voltage IVERA) is executed.

In steps S20 and S21, the memory controller 100 determines a voltage value of the initial erasing voltage IVERA based on a detection result of the "ErtoA" cells (the number of "ErtoA" cells).

Thereafter, in step S90, the memory controller 100 updates the values in the voltage information table TBL regarding the voltage value of the initial erasing voltage IVERA, along with the voltage value of the initial program voltage IVPGM and the voltage value of the step-up voltage dVPGM.

As described above, various voltages used for the write operation and the erase operation are set to more appropriate values.

A modification example of the memory system according to the present disclosure will be described with reference to FIGS. 33 and 34.

The initial program voltages IVPGMc and IVPGMd and the step-up voltage dVPGM of the write operation by the LM-Fine method may be determined by different processes.

Figure 33:
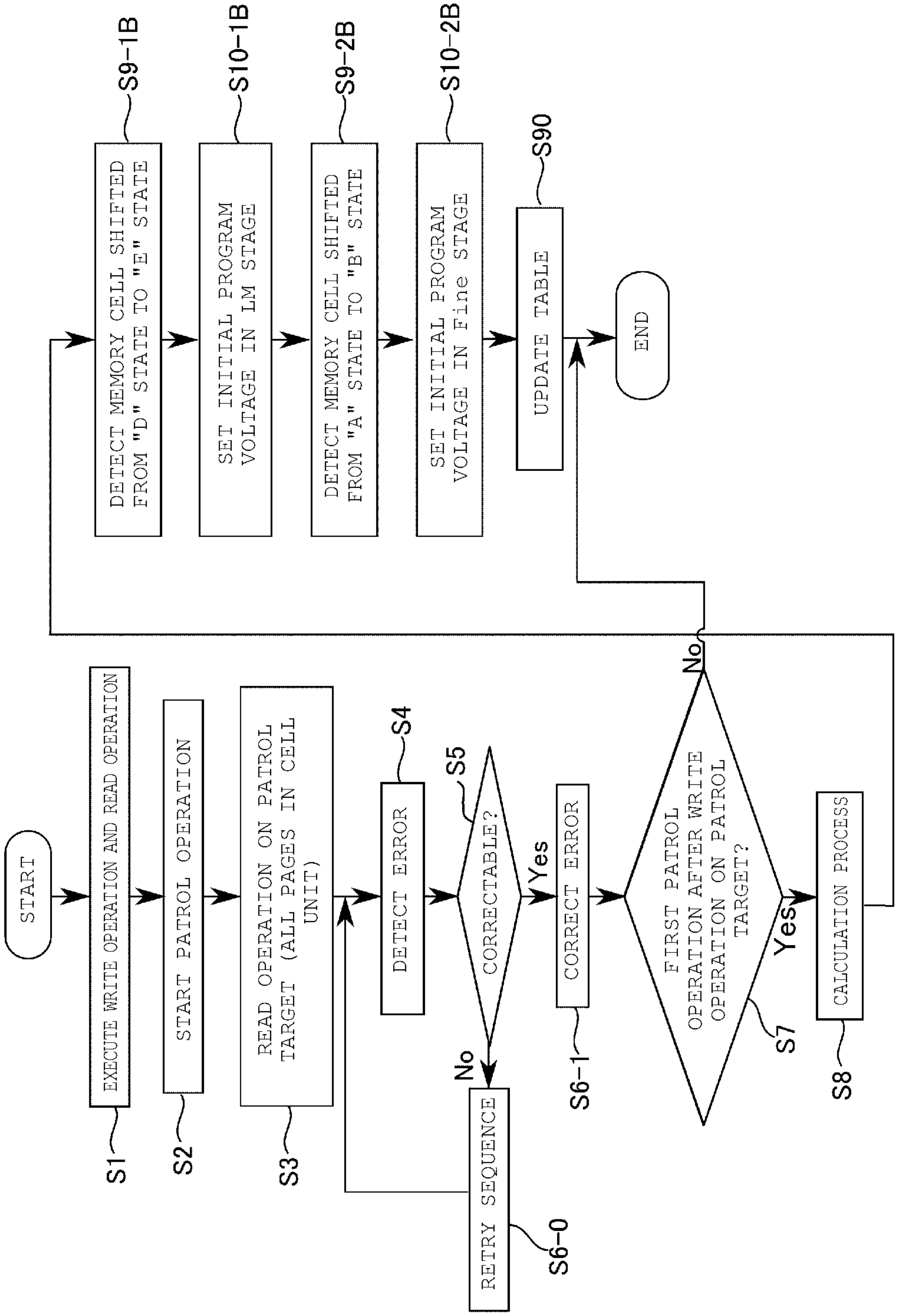
FIG. 33 is a flowchart of an operation of a memory system according to a fourth embodiment.

FIG. 33 is a flowchart illustrating a setting process on an initial program voltage used in the write operation by the LM-Fine method in the present embodiment.

The process flow in FIG. 33 illustrates a process flow of executing only a setting process on the initial program voltage without executing a setting process on the step-up voltage during a first patrol operation after the write operation by the LM-Fine method.

As illustrated in FIG. 33, a calculation process is executed based on a result of a read operation and a result of an ECC process in a patrol operation (step S8). Thereafter, a voltage value of the initial program voltage IVPGMc in the LM stage and a voltage value of the initial program voltage IVPGMd in the Fine stage are respectively set based on a detection result (the number of counted memory cells) of the "DtoE" and "AtoB" cells (steps S9-1B, S9-2B, S10-1B, and S10-2B). Values of the voltage information table TBL are updated to values in accordance with the set initial program voltages IVPGMc and IVPGMd (step S90).

Thus, the voltage value of the initial program voltage IVPGM is set to a more appropriate value.

Figure 34:
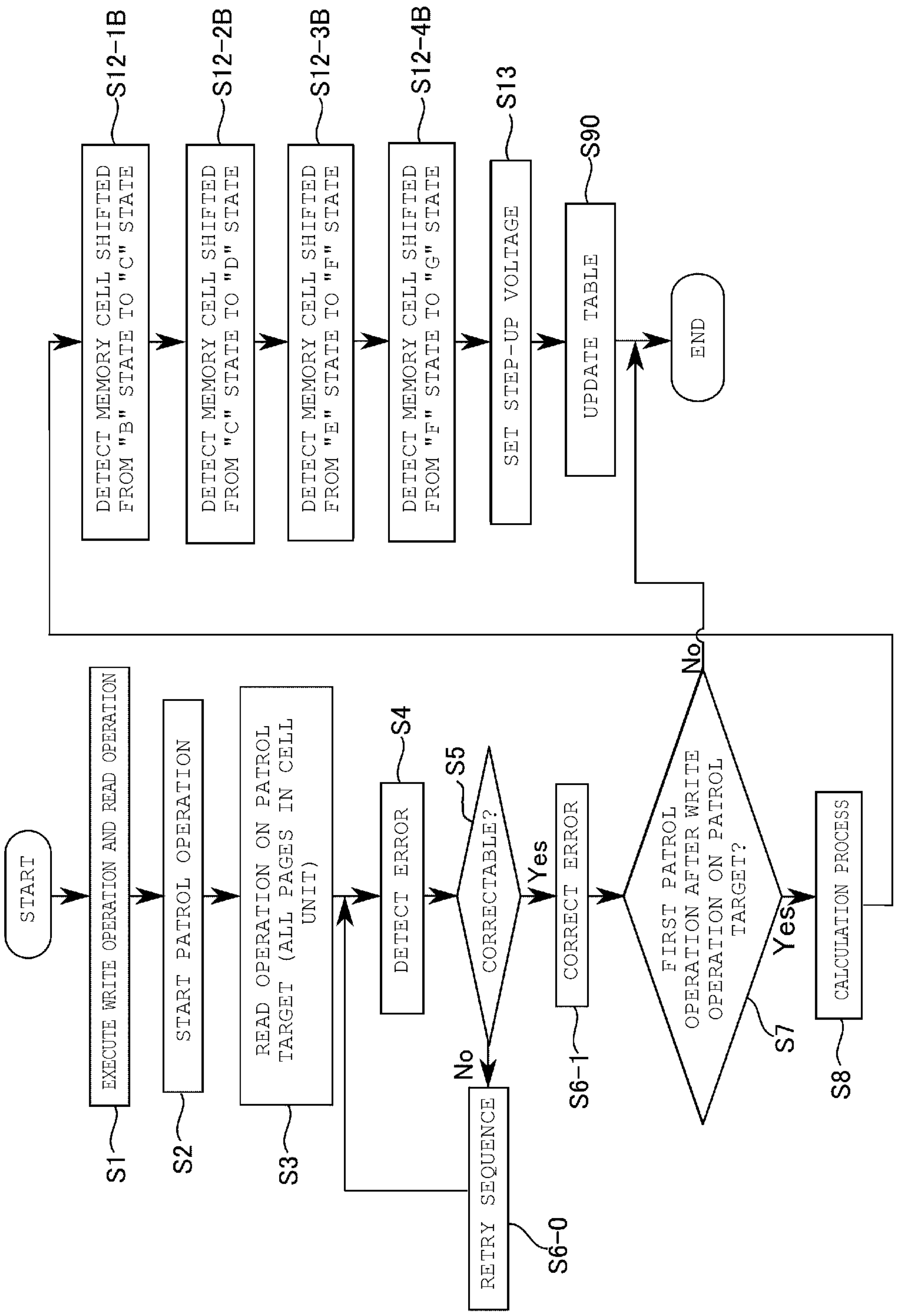
FIG. 34 is a flowchart of an operation of a memory system according to a fourth embodiment.

FIG. 34 is a flowchart illustrating a setting of an initial value of a step-up voltage in a NAND flash memory using the write operation by the LM-Fine method in the present embodiment.

The processing flow in FIG. 34 illustrates a processing flow of executing only a setting process on the step-up voltage without executing a setting process on the initial program voltage during the first patrol operation after the write operation by the LM-Fine method.

As illustrated in FIG. 34, after the calculation process in step S8, the "BtoC" cells, the "CtoD" cells, the "EtoF" cells, and the "FtoG" cells are detected (steps S12-1B to S12-4B).

The voltage value of the step-up voltage dVPGM is set based on a detection result (the number of counted memory cells) of the "BtoC" cell, the "CtoD" cell, the "EtoF" cell, and the "FtoG" cell (step S13). The values of the voltage information table TBL are updated to the values in accordance with the set step-up voltage dVPGM (step S90).

For example, when a total of the number of "BtoC" cells, the number of "CtoD" cells, the number of "EtoF" cells, and the number of "FtoG" cells is less than a certain reference value, the memory controller 100 sets information (for example, a DAC value) so as to maintain or increase the voltage value of the step-up voltage dVPGM. For example, when a total of the numbers of "BtoC" cells, "CtoD" cells, "EtoF" cells, and "FtoG" cells is equal to or more than the certain reference value, the memory controller 100 sets the information (the DAC value) so as to decrease the voltage value of the step-up voltage dVPGM.

Thus, the voltage value of the step-up voltage dVPGM is set to a more appropriate value.

In the present embodiment, with the NAND flash memory using the write operation by the LM-Fine method, the initial program voltage IVPGM and the step-up voltage dVPGM may be executed with substantially the same operation as the above-described processes in FIGS. 12 and 17.

The setting of the initial value of the erasing voltage in the NAND flash memory using the write operation by the LM-Fine method may be executed without the setting process on the initial program voltage IVPGM and the step-up voltage dVPGM.

As described above, with the memory system according to the present embodiment, the patrol operation includes the calculation process based on the result of the ECC process (step S8), the detection process (steps S9-1B, S9-2B, and S12-1B to S12-4B), setting of various voltages (steps S10-1B, S10-2B, S13, and S21), and updating of the voltage information table (step S90), in addition to the read operation and the ECC process on a certain memory space. The processes in steps S8 to S90 may be handled as an operation (a sequence) different from the patrol operation.

As described above, the memory system according to the fourth embodiment can obtain substantially the same effects as the memory system according to the other embodiments already described above.

(5) Fifth Embodiment

A memory system and a control method of the memory system according to a fifth embodiment will be described with reference to FIG. 35.

In the above-described embodiments, the optimization process is executed on various voltages used in the operation of the flash memory based on the result of the read operation in the patrol operation.

In some cases, the controller may not execute the patrol, according to specifications of the memory system or settings of a user. Such a memory system can execute the optimization process on various voltages used for the operation of the flash memory by using the result of the read operation.

In the following, an example in which the optimization process is performed on the erasing voltage based on a result of a read operation (a host read) in response to an instruction (a request) from the host device 2 will be described.

(5a) Operation Example

Figure 35:
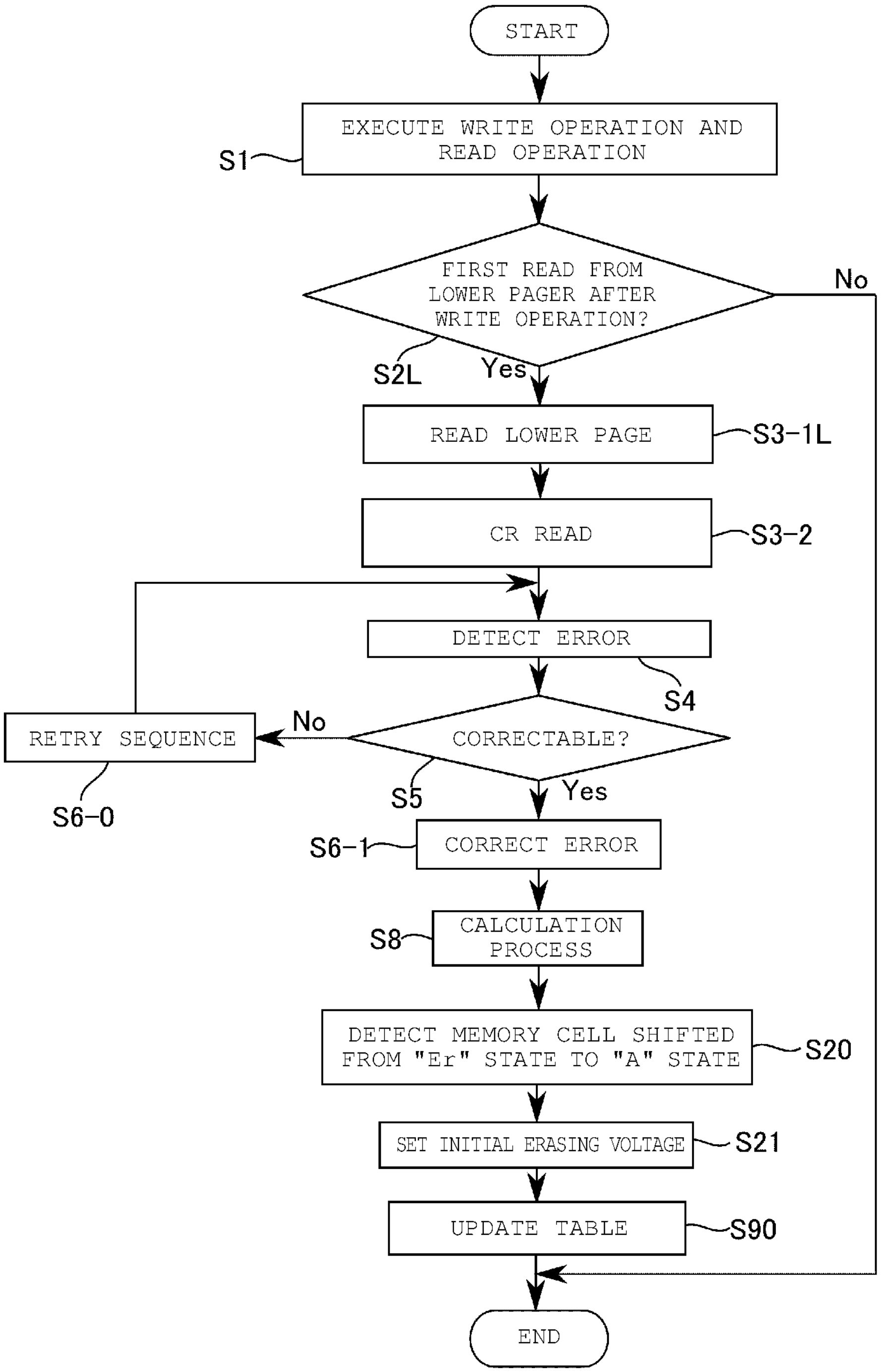
FIG. 35 is a flowchart of an operation of a memory system according to a fifth embodiment.

With reference to FIG. 35, a setting process on an erasing voltage based on a result of a host read in a memory system according to the fifth embodiment will be described.

FIG. 35 is a flowchart illustrating a modification example of the memory system according to the present disclosure.

As illustrated in FIG. 35, a write operation and a read operation for the NAND flash memory 10 are executed (step S1).

<Step S2L>

In step S2L, during the read operation, the memory controller 100 determines whether or not a read operation to be executed in response to a command is a read from a first lower page after the write operation. When the read operation to be executed is not the first read from the lower page after the write operation (when "No" in step S2L), the flow of this example is ended.

<Step S3-1L>

When the read operation to be executed is the first read of the lower page after the write operation (when "Yes" in step S2L), the flash memory 10 executes the read on a selected address of the lower page.

<Step S3-2>

In step S3-2, after reading the lower page, the memory controller 100 causes the flash memory 10 which executes the read on the lower page to execute a single-state read (hereinafter, also referred to as CR read) using the voltage VCR for the selected address (a memory cell belonging to the selected word line). Thus, it is determined whether or not the selected cell in reading the lower page is turned on at the voltage VCR.

After the CR read, the memory controller 100 executes the ECC process (steps S4, S5, and S6-1) and the calculation process (step S8) (and a retry sequence) in the same manner as in the above-described embodiments.

<Step S20>

In step S20, the memory controller 100 detects and counts the "ErtoA" cells based on a result of the lower page read and the CR read, and a result of the calculation process using a result of the ECC process.

<Step S21>

In step S21, based on a detection result of the "ErtoA" cell, the memory controller 100 executes a setting of the initial erasing voltage IVERA (the optimization process on the initial erasing voltage IVERA).

Thereafter, the memory controller 100 writes a result of the setting of the initial erasing voltage IVERA in the voltage information table TBL. Thus, the voltage information table TBL is updated (step S90).

As described above, the voltage used for the erase operation (for example, the initial erasing voltage) can be set to a more appropriate value by using the read result of one page by the host read.

Therefore, the memory system according to the fifth embodiment can obtain the same results as those of the other above-described embodiments.

(6) Modification Example

Modifications of a memory system according to the present disclosure will be described with reference to FIGS. 36 to 41.

As described above, in a memory system which does not execute the patrol operation, the state shift cell may be detected based on the result of the read operation during the host read and the result of the ECC process. The magnitudes of the initial program voltage and the step-up voltage may be set to more appropriate values by a calculation process on the result obtained in this manner.

(6a) Detection of "AtoB" cell

Figure 36:
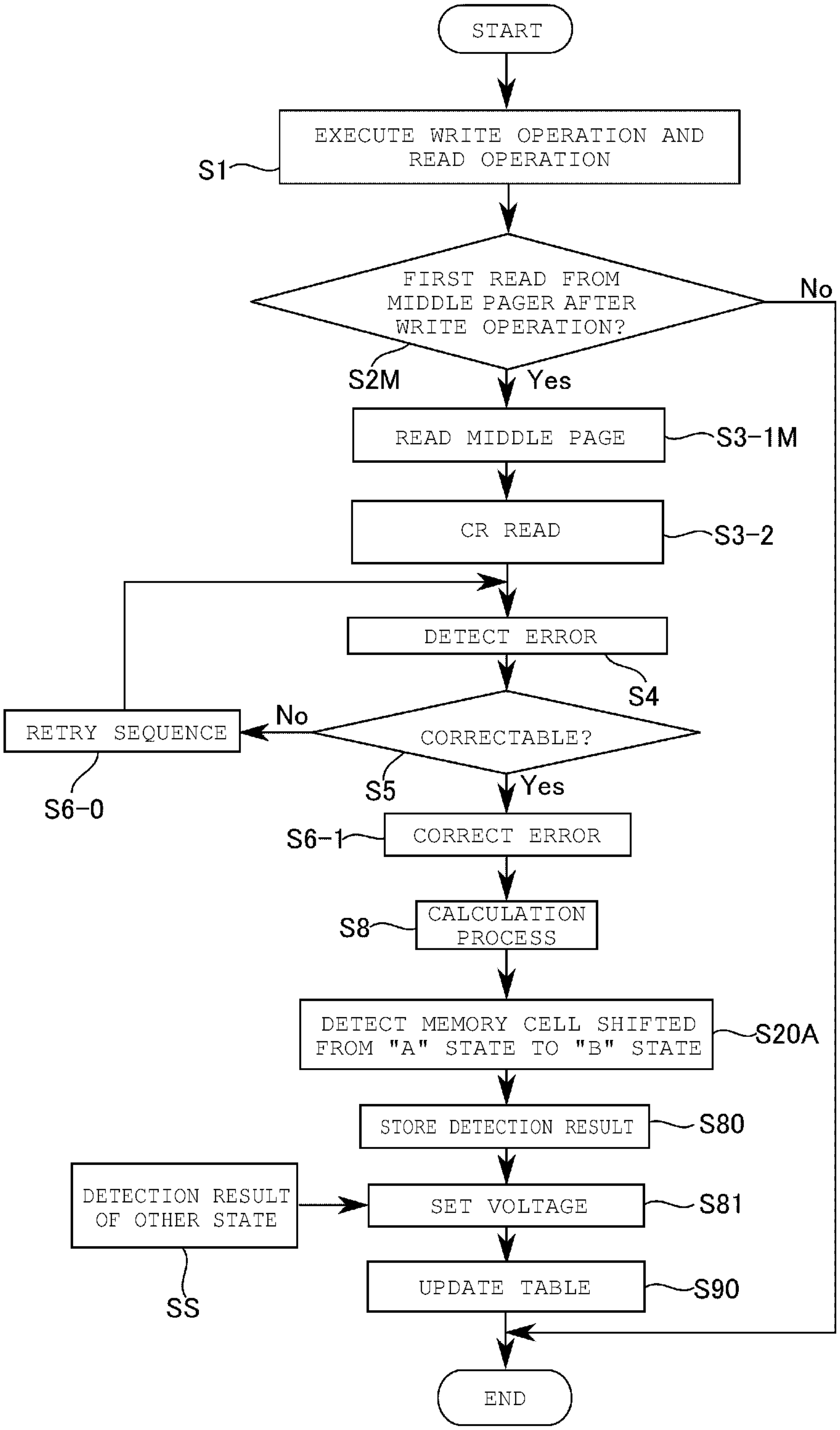
FIG. 36 is a flowchart related to a modification of a memory system according to the present disclosure.

FIG. 36 is a flowchart illustrating a modification example of the memory system according to the present disclosure.

As illustrated in FIG. 36, a write operation and a read operation for the NAND flash memory 10 are executed (step S1).

<Step S2M>

In step S2M, during the read operation, the memory controller 100 determines whether or not a read operation to be executed in response to a command is a read from a first middle page after the write operation. When the read operation to be executed is not the first read from the middle page after the write operation (when "No" in step S2M), the flow of this example is ended.

<Step S3-1M>

When the read operation to be executed is the first read of the middle page after the write operation (when "Yes" in step S2M), the flash memory 10 executes the read on a selected address of the middle page in step S3-1M.

<Step S3-2>

In step S3-2, after reading the middle page, the memory controller 100 causes the flash memory 10 which executes the read on the middle page to execute a single-state read (the CR read) using the voltage VCR for the selected address. Thus, it is determined whether or not the selected cell in reading the middle page is turned on at the voltage VCR.

After the CR read, the memory controller 100 executes the ECC process (steps S4 to S6-1) and the calculation process (step S8) (and a retry sequence) in the same manner as in the above-described embodiment.

<Step S20A>

In step S20A, the memory controller 100 detects and counts the "AtoB" cells based on a result of the middle page read and the CR read, and a result of the calculation process using a result of the ECC process.

<Step S80>

In step S80, the memory controller 100 stores results of the detection and the count of the "AtoB" cells in a memory or a management table.

<Step S81>

In step S81, based on the detection result of the "AtoB" cell and a detection result SS of the state shift cells (the "BtoC" cell to the "FtoG" cell) related to other states, the memory controller 100 executes a setting on at least one of the initial program voltage IVPGM and the step-up voltage dVPGM (the optimization process on the voltage value).

Thereafter, the memory controller 100 writes a result of the voltage setting in the voltage information table TBL. Thus, the voltage information table TBL is updated (step S90).

(6b) Detection of "BtoC" cell

Figure 37:
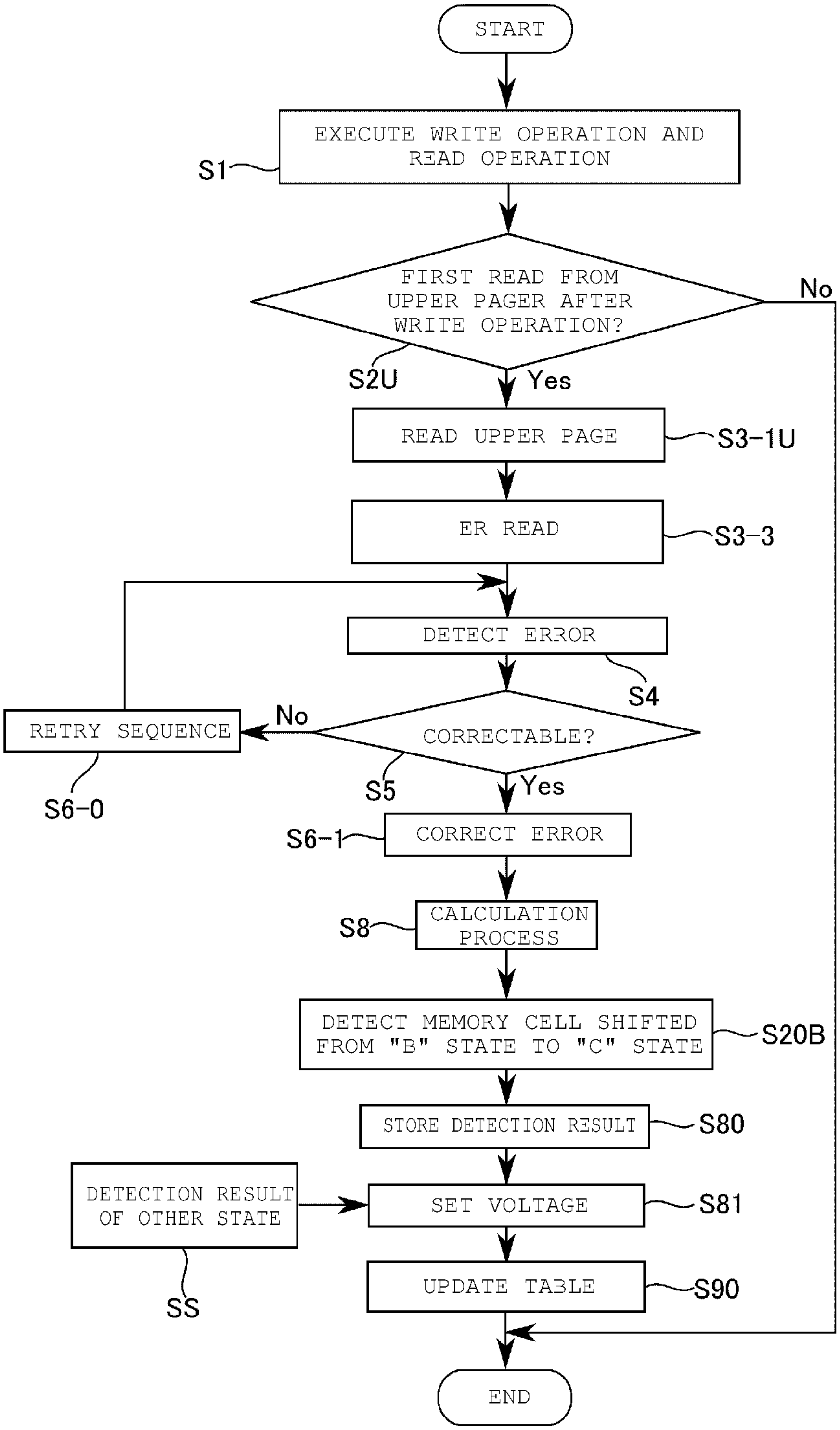
FIG. 37 is a flowchart related to a modification of a memory system according to the present disclosure.

FIG. 37 is a flowchart related to still another modification of the memory system according to the present disclosure.

As illustrated in FIG. 37, a write operation and a read operation for the NAND flash memory 10 are executed (step S1).

<Step S2U>

In step S2U, during the read operation, the memory controller 100 determines whether or not a read operation to be executed in response to a command is a read from a first upper page after the write operation. When the read operation to be executed is not the first read from the upper page after the write operation (when "No" in step S2U), the flow of this example is ended.

<Step S3-1U>

When the read operation to be executed is the first read of the upper page after the write operation (when "Yes" in step S2U), the flash memory 10 executes the read on a selected address of the upper page.

<Step S3-3>

In step S3-3, after reading the upper page, the memory controller 100 causes the flash memory 10 which executes the read on the upper page to execute a single-state read (the ER read) using the voltage VER for the selected address. Thus, it is determined whether or not the selected cell in reading the upper page is turned on at the voltage VER.

After the ER read, the memory controller 100 executes the ECC process (steps S4 to S6-1) and the calculation process (step S8) (and a retry sequence) in the same manner as in the above-described embodiment.

<Step S20B>

In step S20B, the memory controller 100 detects and counts the "BtoC" cells based on a result of the upper page read and the ER read, and a result of the calculation process using a result of the ECC process.

<Step S80>

In step S80, the memory controller 100 stores results of the detection and the count of the "BtoC" cells in a memory or a management table.

<Step S81>

In step S80, based on the detection result of the "BtoC" cell and the state shift cells related to other states, the memory controller 100 executes a setting on at least one of the initial program voltage and the step-up voltage (the optimization process on the voltage value).

Thereafter, the memory controller 100 writes a result of the voltage setting in the voltage information table TBL. Thus, the voltage information table TBL is updated (step S90).

(6c) Detection of "CtoD" Cell

Figure 38:
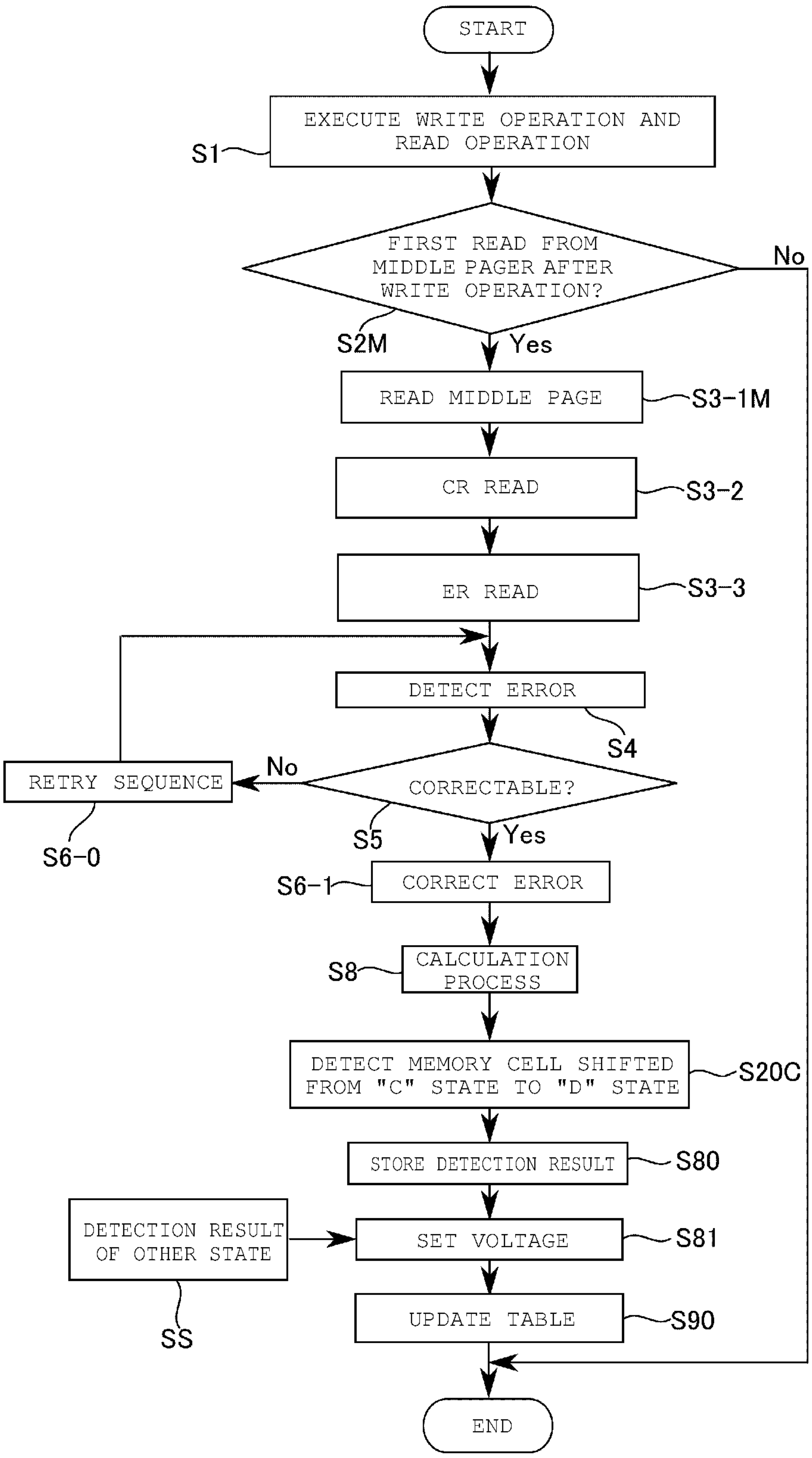
FIG. 38 is a flowchart related to a modification of a memory system according to the present disclosure.

FIG. 38 is a flowchart illustrating still another modification example of the memory system according to the present disclosure.

As illustrated in FIG. 38, detection of the "CtoD" cell is executed at the time of reading the middle page, in the same manner as the detection of the "AtoB" cell (steps S2M and S3-1M).

After reading the middle page, the memory controller 100 causes the flash memory 10 to execute the CR reading (step S3-2).

In step S3-3, the memory controller 100 causes the flash memory 10 to execute the single-state read (the ER read) using the voltage VER, after the CR read.

As described above, the memory controller 100 executes the ECC process and the calculation process on a read result (and a result of the ER read) from the middle page. (Steps S4 to S8)

Thus, the "CtoD" cell is detected and counted (step S20C). For example, a detection result and a count number of the "CtoD" cell are temporarily stored (step S80).

Thereafter, by using the detection result of the "CtoD" cell and a detection result of other state shift cells, the memory controller 100 executes a setting on at least one of the initial program voltage and the step-up voltage (the optimization process on the voltage value) (step S81).

The memory controller 100 writes a result of the voltage setting in the voltage information table TBL. Thus, the voltage information table TBL is updated (step S90).

(6d) Detection of "DtoE" Cell

Figure 39:
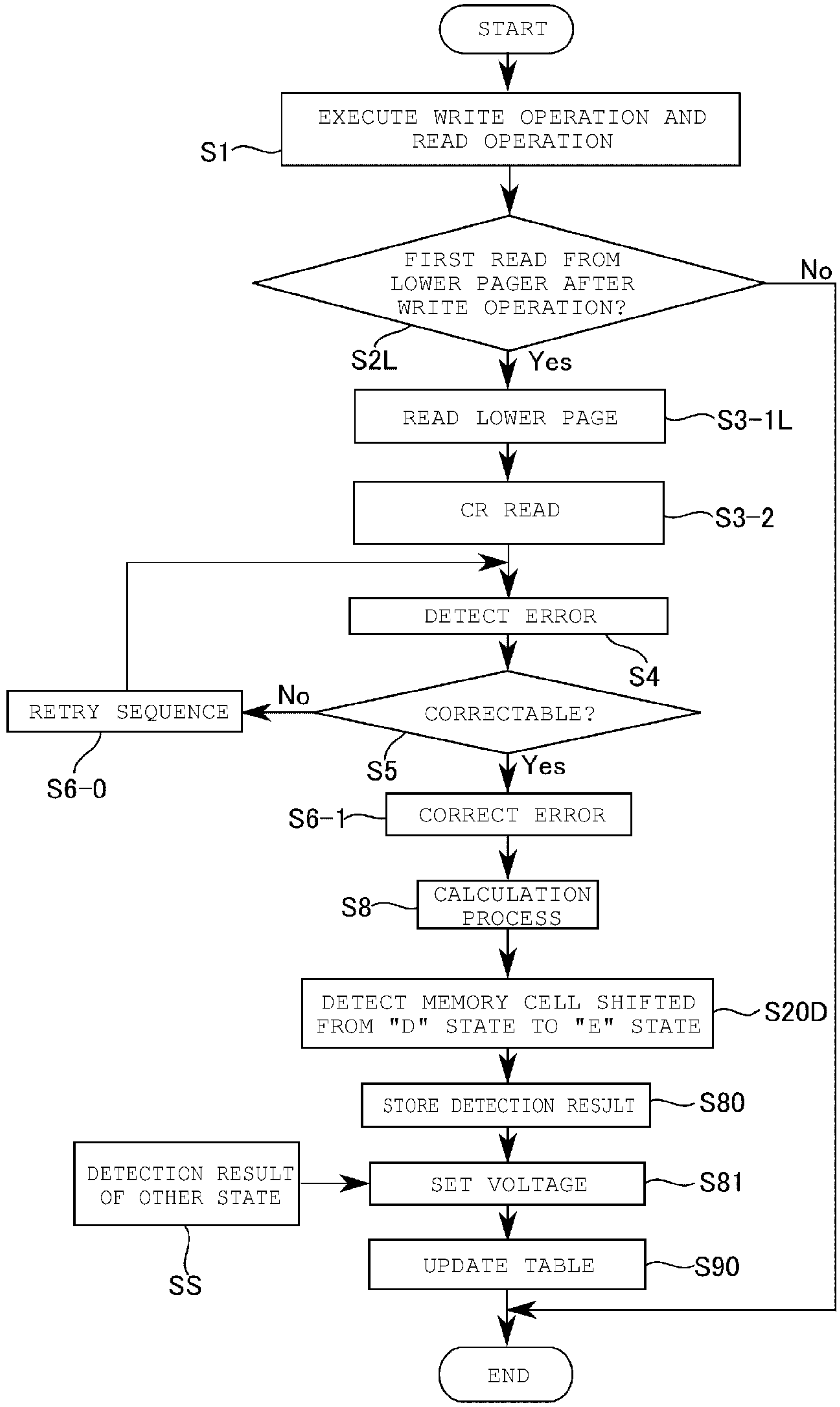
FIG. 39 is a flowchart related to a modification of a memory system according to the present disclosure.

FIG. 39 is a flowchart illustrating still another modification example of the memory system according to the present disclosure.

As illustrated in FIG. 39, detection of the "DtoE" cell is executed at the time of reading the lower page, in the same manner as the detection of the "ErtoA" cell (steps S2L and S3-1L).

After reading the lower page, the memory controller 100 causes the flash memory 10 to execute the CR reading (step S3-2).

As described above, the memory controller 100 executes the ECC process (steps S4 to S6-1) and the calculation process (step S8) on a read result from the lower page (and a result of the CR read).

Thus, the "DtoE" cell is detected and counted (step S20D). For example, a detection result and a count number of the "DtoE" cell are temporarily stored (step S80).

Thereafter, by using the detection result of the "DtoE" cell and a detection result of other state shift cells, the memory controller 100 executes a setting on at least one of the initial program voltage and the step-up voltage (the optimization process on the voltage value) (step S81).

The memory controller 100 writes a result of the voltage setting in the voltage information table TBL. Thus, the voltage information table TBL is updated (step S90).

(6e) Detection of "EtoF" Cell

Figure 40:
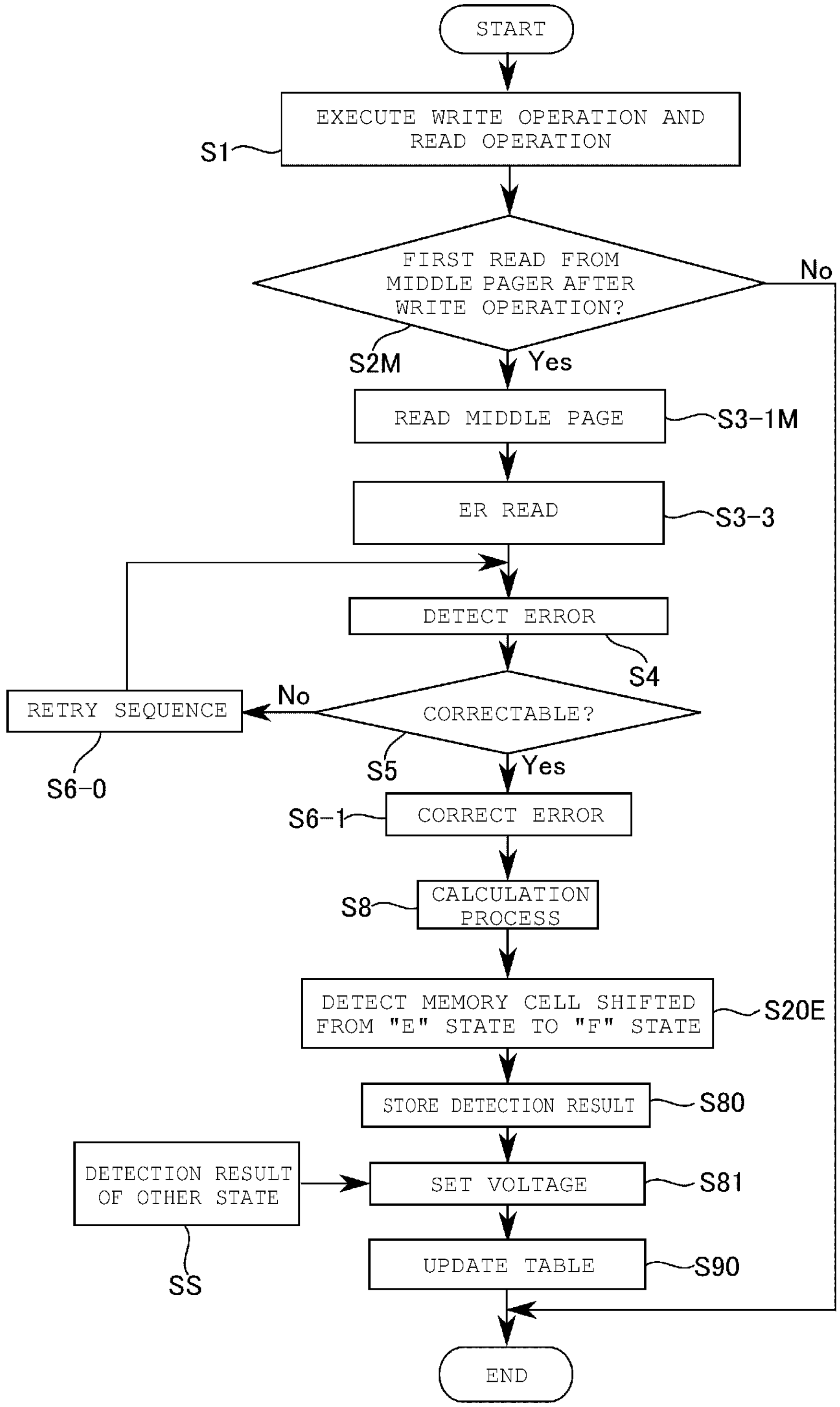
FIG. 40 is a flowchart related to a modification of a memory system according to the present disclosure.

FIG. 40 is a flowchart illustrating still another modification example of the memory system according to the present disclosure.

As illustrated in FIG. 40, detection of the "EtoF" cell is executed at the time of reading the middle page, in the same manner as the detection of the "AtoB" cell (steps S2M and S3-1M).

After reading the middle page, the memory controller 100 causes the flash memory 10 to execute the ER reading (step S3-3).

As described above, the memory controller 100 executes the ECC process (steps S4 to S6-1) and the calculation process (step S8) on a read result from the middle page (and a result of the ER read).

Thus, the "EtoF" cell is detected and counted (step S20E). For example, a detection result and a count number of the "EtoF" cell are temporarily stored (step S80).

Thereafter, by using the detection result of the "EtoF" cell and a detection result of other state shift cells, the memory controller 100 executes a setting on at least one of the initial program voltage and the step-up voltage (the optimization process on the voltage value) (step S81).

The memory controller 100 writes a result of the voltage setting in the voltage information table TBL. Thus, the voltage information table TBL is updated (step S90).

(6f) Detection of "FtoG" Cell

Figure 41:
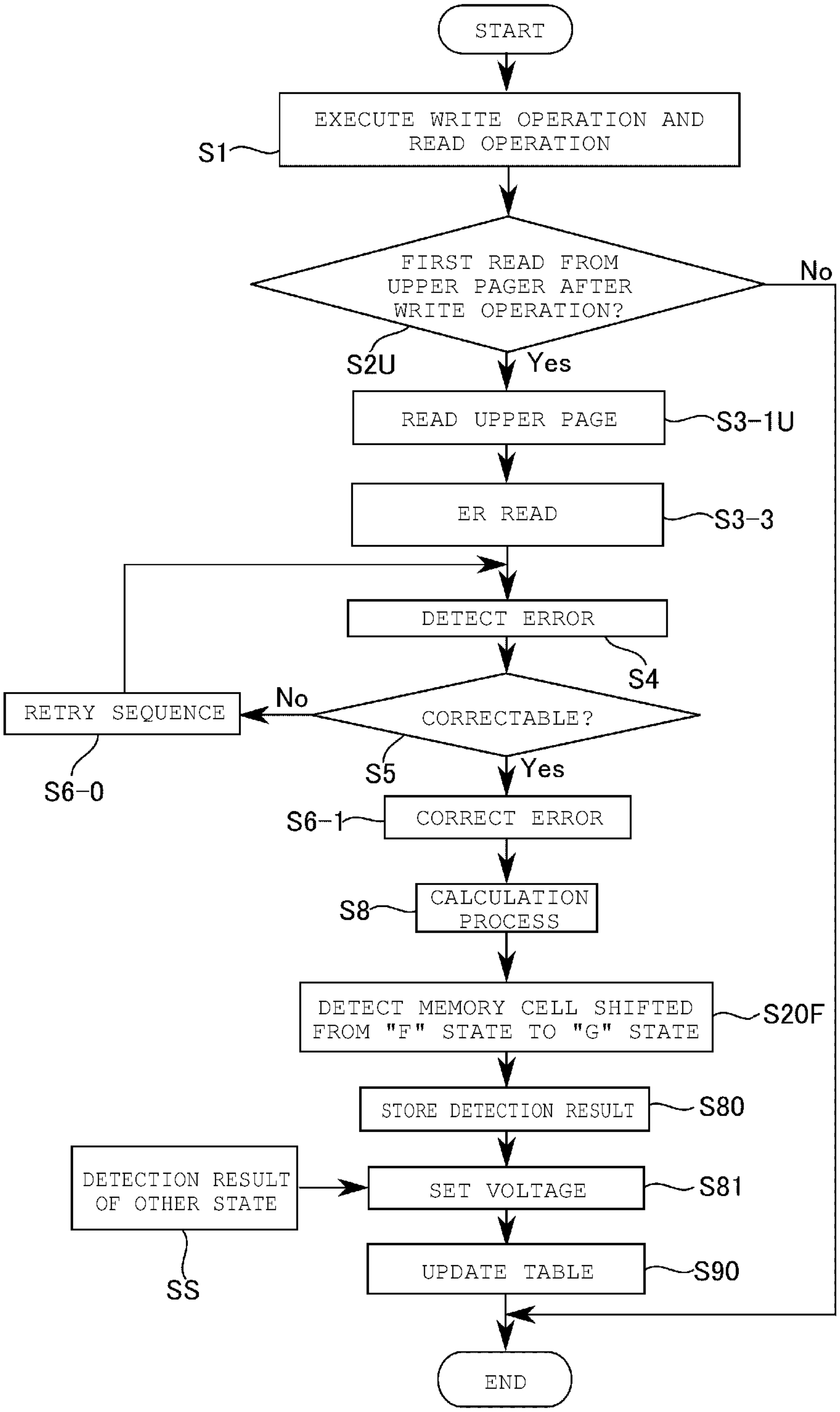
FIG. 41 is a flowchart related to a modification of a memory system according to the present disclosure.

FIG. 41 is a flowchart illustrating still another modification example of the memory system according to the present disclosure.

As illustrated in FIG. 41, detection of the "FtoG" cell is executed at the time of reading the middle page, in the same manner as the detection of the "BtoC" cell (steps S2U and S3-1U).

After reading the upper page, the memory controller 100 causes the flash memory 10 to execute the ER reading (step S3-3).

As described above, the memory controller 100 executes the ECC process (steps S4 to S6-1) and the calculation process (step S8) on a read result from the upper page (and a result of the ER read).

Thus, the "FtoG" cell is detected and counted (step S20F). For example, a detection result and a count number of the "FtoG" cell are temporarily stored (step S80).

Thereafter, by using the detection result of the "FtoG" cell and a detection result of other state shift cells, the memory controller 100 executes a setting on at least one of the initial program voltage and the step-up voltage (the optimization process on the voltage value) (step S81).

The memory controller 100 writes a result of the voltage setting in the voltage information table TBL. Thus, the voltage information table is updated (step S90).

(6g) Summary

As described above, in the modification example of the memory system according to the present disclosure, a plurality of voltages used for the write operation can be set by using the result of the read operation (for example, the host read) other than the patrol operation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system, comprising:

a semiconductor memory device that includes a plurality of memory cells; and a memory controller that controls the semiconductor memory device to perform write and read operations, wherein the memory controller is configured to:

cause the semiconductor memory device to execute a first write loop operation using a first voltage, detect first memory cells among the plurality of memory cells having a threshold voltage higher than a voltage value corresponding to data to be stored in a read operation, and set a second voltage to be used for a second write loop operation after the first write loop operation based on a detection result of the first memory cells, and the first and second write loop operations are for different write operations performed by the semiconductor memory device.

2. The memory system according to claim 1, wherein the detection result of the first memory cells is the number of the first memory cells detected among the plurality of memory cells, the memory controller sets the second voltage to be higher than the first voltage when the number is less than a first reference value, and the memory controller sets the second voltage to be lower than the first voltage when the number is equal to or greater than the first reference value.

3. The memory system according to claim 2, wherein each of the first voltage and the second voltage is an initial program voltage.

4. The memory system according to claim 2, wherein each of the first voltage and the second voltage is a voltage value of a step-up voltage to be added to an initial program voltage.

5. The memory system according to claim 1, wherein the first voltage is an initial program voltage for the first write loop operation that is performed based on a first host instruction and the second voltage is an initial program voltage for the second write loop operation based on a second host instruction different from the first host instruction.

6. The memory system according to claim 1, wherein each of the first voltage and the second voltage is a voltage value of a step-up voltage to be added to an initial program voltage.

7. The memory system according to claim 1, wherein the memory controller is further configured to:

control the semiconductor memory device to perform an erase operation, and set a third voltage to be used for the erase operation based on a result of the read operation.

8. The memory system according to claim 1, wherein the read operation is executed during a patrol operation on the semiconductor memory device.

9. The memory system according to claim 1, wherein the read operation is executed based on an instruction from a host device.

10. The memory system according to claim 1, wherein the second write loop operation is a host write operation executed after the first write loop operation on a memory cell group including a detected first memory cell.

11. The memory system according to claim 1, wherein the semiconductor memory device is a NAND flash memory device.

12. A control method of a memory system including a semiconductor memory device with a plurality of memory cells and a memory controller connected to the semiconductor memory device, the control method comprising:

causing the semiconductor memory device to execute a first write loop operation using a first voltage, detecting first memory cells among the plurality of memory cells having a threshold voltage higher than a voltage value corresponding to data to be stored in a read operation, and setting a second voltage to be used for a second write loop operation after the first write loop operation based on a detection result of the first memory cells, wherein the first and second write loop operations are for different write operations performed by the semiconductor memory device.

13. The control method according to claim 12, wherein the detection result of the first memory cells is the number of the first memory cells detected among the plurality of memory cells, and the control method further comprises:

setting the second voltage to be higher than the first voltage when the number is less than a first reference value, and setting the second voltage to be lower than the first voltage when the number is equal to or greater than the first reference value.

14. The control method according to claim 13, wherein each of the first voltage and the second voltage is an initial program voltage.

15. The control method according to claim 13, wherein each of the first voltage and the second voltage is a voltage value of a step-up voltage to be added to an initial program voltage.

16. The control method according to claim 12, wherein the first voltage is an initial program voltage for the first write loop operation that is performed based on a first host instruction from a host device and the second voltage is an initial program voltage for the second write loop operation based on a second host instruction from the host device, and the second host instruction is different from the first host instruction.

17. The control method according to claim 12, wherein each of the first voltage and the second voltage is a voltage value of a step-up voltage to be added to an initial program voltage.

18. The control method according to claim 12, further comprising:

commanding the semiconductor memory device to perform an erase operation, and setting a third voltage to be used for the erase operation based on a result of the read operation.

19. The control method according to claim 12, wherein the read operation is executed during a patrol operation on the semiconductor memory device.

20. The control method according to claim 12, wherein the read operation is executed based on an instruction from a host device.

* * * * *